(12) United States Patent
Park et al.

(10) Patent No.: US 10,627,064 B2
(45) Date of Patent: Apr. 21, 2020

(54) LIGHTING DEVICE

(71) Applicant: LG INNOTEK CO., LTD., Seoul (KR)

(72) Inventors: Kwang Ho Park, Seoul (KR); Chul Hong Kim, Seoul (KR); Hyun Duck Yang, Seoul (KR); Moo Ryong Park, Seoul (KR); Jun Chul Hyun, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 15/900,358

(22) Filed: Feb. 20, 2018

(65) Prior Publication Data
US 2018/0172230 A1 Jun. 21, 2018

Related U.S. Application Data

(63) Continuation of application No. 15/495,433, filed on Apr. 24, 2017, now Pat. No. 9,933,126, which is a (Continued)

(30) Foreign Application Priority Data

| Jun. 18, 2012 | (KR) | 10-2012-0065259 |
| Jun. 18, 2012 | (KR) | 10-2012-0065260 |
| Jun. 18, 2012 | (KR) | 10-2012-0065264 |

(51) Int. Cl.
*H01L 33/62* (2010.01)
*F21S 41/20* (2018.01)
(Continued)

(52) U.S. Cl.
CPC ............ *F21S 41/20* (2018.01); *B60Q 1/0011* (2013.01); *F21S 41/192* (2018.01); *F21S 41/30* (2018.01);
(Continued)

(58) Field of Classification Search
CPC ......... H01L 33/48; H01L 33/56; H01L 33/58; H01L 33/60; H01L 33/62
(Continued)

(56) References Cited

U.S. PATENT DOCUMENTS

| 7,758,230 B2 | 7/2010 | Terada et al. |
| 8,154,190 B2 | 4/2012 | Ishii et al. |

(Continued)

FOREIGN PATENT DOCUMENTS

| CN | 201661894 U | 12/2010 |
| CN | 102128391 A | 7/2011 |

(Continued)

OTHER PUBLICATIONS

Office Action dated Jan. 23, 2017 in Japanese Application No. 2013-110630.

(Continued)

*Primary Examiner* — Fazli Erdem
(74) *Attorney, Agent, or Firm* — Saliwanchik, Lloyd & Eisenschenk

(57) ABSTRACT

Provided is a lighting device, comprising: a light source module comprising: at least one light source disposed on a printed circuit board; and a resin layer disposed on the printed circuit board so that the light source is embedded; a light reflection member formed on at least any one of one side surface and another side surface of the resin layer; and a diffusion plate having an upper surface formed on the light source module, and a side wall which is integrally formed with the upper surface and formed to extend in a lower side direction and which is adhered onto the light reflection member, wherein a first separated space is formed between the light source module and the upper surface of the diffu- (Continued)

sion plate, whereby flexibility of the product itself can be secured, and durability and reliability of the product can be also improved.

20 Claims, 27 Drawing Sheets

Related U.S. Application Data continuation of application No. 14/742,207, filed on Jun. 17, 2015, now Pat. No. 9,664,844, which is a continuation of application No. 13/920,844, filed on Jun. 18, 2013, now Pat. No. 9,086,209.

(51) Int. Cl.

| | | |
|---|---|---|
| *F21V 13/02* | (2006.01) | |
| *H01L 25/075* | (2006.01) | |
| *H01L 33/48* | (2010.01) | |
| *F21S 43/15* | (2018.01) | |
| *F21S 43/14* | (2018.01) | |
| *F21S 43/19* | (2018.01) | |
| *F21V 3/02* | (2006.01) | |
| *F21V 3/04* | (2018.01) | |
| *F21V 15/01* | (2006.01) | |
| *F21V 8/00* | (2006.01) | |
| *F21V 29/503* | (2015.01) | |
| *F21V 29/70* | (2015.01) | |
| *F21S 41/30* | (2018.01) | |
| *F21S 43/20* | (2018.01) | |
| *F21S 43/30* | (2018.01) | |
| *F21S 41/19* | (2018.01) | |
| *B60Q 1/00* | (2006.01) | |
| *H01L 33/56* | (2010.01) | |
| *H01L 33/58* | (2010.01) | |
| *H01L 33/60* | (2010.01) | |
| *F21S 41/663* | (2018.01) | |
| *F21S 41/32* | (2018.01) | |
| *F21Y 105/10* | (2016.01) | |
| *F21Y 115/10* | (2016.01) | |
| *F21V 31/04* | (2006.01) | |
| *B60Q 1/04* | (2006.01) | |
| *B60Q 1/26* | (2006.01) | |
| *B60Q 1/30* | (2006.01) | |

(52) U.S. Cl.
CPC .......... *F21S 41/32* (2018.01); *F21S 41/663* (2018.01); *F21S 43/14* (2018.01); *F21S 43/15* (2018.01); *F21S 43/195* (2018.01); *F21S 43/20* (2018.01); *F21S 43/30* (2018.01); *F21V 3/02* (2013.01); *F21V 3/04* (2013.01); *F21V 13/02* (2013.01); *F21V 15/012* (2013.01); *F21V 29/503* (2015.01); *F21V 29/70* (2015.01); *G02B 6/0031* (2013.01); *G02B 6/0051* (2013.01); *G02B 6/0055* (2013.01); *G02B 6/0083* (2013.01); *G02B 6/0085* (2013.01); *G02B 6/0088* (2013.01); *G02B 6/0095* (2013.01); *H01L 25/0753* (2013.01); *H01L 33/48* (2013.01); *H01L 33/56* (2013.01); *H01L 33/58* (2013.01); *H01L 33/60* (2013.01); *H01L 33/62* (2013.01); *B60Q 1/04* (2013.01); *B60Q 1/2696* (2013.01); *B60Q 1/30* (2013.01); *F21V 31/04* (2013.01); *F21Y 2105/10* (2016.08); *F21Y 2115/10* (2016.08); *H01L 2224/48091* (2013.01); *H01L 2224/48247* (2013.01)

(58) Field of Classification Search
USPC .......................................................... 257/79
See application file for complete search history.

(56) References Cited

U.S. PATENT DOCUMENTS

| | | |
|---|---|---|
| 8,322,884 B2 | 12/2012 | Ramer et al. |
| 8,960,977 B2 | 2/2015 | Yang et al. |
| 9,086,209 B2 | 7/2015 | Park et al. |
| 9,627,595 B2 | 4/2017 | Park et al. |
| 9,664,844 B2 | 5/2017 | Park et al. |
| 2009/0016067 A1 | 1/2009 | Chang et al. |
| 2009/0213571 A1 | 8/2009 | Jin et al. |
| 2010/0220474 A1 | 9/2010 | Park |
| 2013/0235577 A1 | 9/2013 | Park et al. |
| 2013/0264538 A1* | 10/2013 | Oh ................. H01L 25/0753 257/13 |
| 2013/0264590 A1* | 10/2013 | Oh ................. F21S 43/249 257/88 |
| 2013/0328090 A1* | 12/2013 | Park ................ H01L 33/60 257/98 |
| 2015/0155330 A1 | 6/2015 | Oh et al. |

FOREIGN PATENT DOCUMENTS

| | | |
|---|---|---|
| CN | 103486460 A | 1/2014 |
| DE | 102010061972 A1 | 4/2012 |
| EP | 2363884 A1 | 9/2011 |
| JP | 2001-518692 A | 10/2001 |
| JP | 2003-222714 A | 8/2003 |
| JP | 2006-276186 A | 10/2006 |
| JP | 2007-173133 A | 7/2007 |
| JP | 2009-150940 A | 7/2009 |
| JP | 2011-146715 A | 7/2011 |
| JP | 2012-099462 A | 8/2011 |
| JP | 2011-210595 A | 10/2011 |
| JP | 2012-028779 A | 2/2012 |
| KR | 10-2007-0109771 A | 11/2007 |
| KR | 10-2009-0090848 A | 8/2009 |
| KR | 10-2011-0084788 A | 7/2011 |
| KR | 10-2012-0003271 A | 1/2012 |
| KR | 10-2012-0009209 A | 2/2012 |

OTHER PUBLICATIONS

Office Action dated Feb. 9, 2016 in U.S. Appl. No. 14/742,207.
Office Action dated Dec. 29, 2014 in Chinese Application No. 201310241925.0.
Office Action dated Aug. 23, 2016 in U.S. Appl. No. 14/742,207.
European Search Report dated May 6, 2015 in European Application No. 13172535.0.
European Search Report dated Jan. 16, 2017, in European Application No. 16177657.0.
Office Action dated Aug. 10, 2018 in Korean Application No. 10-2012-0065264.
Office Action dated Feb. 13, 2019 in Korean Application No. 10-2012-0065259.

* cited by examiner

LIGHTING DEVICE

CROSS-REFERENCE TO RELATED APPLICATIONS

This application is a continuation of U.S. application Ser. No. 15/495,433, filed Apr. 24, 2017; which is a continuation of U.S. application Ser. No. 14/742,207, filed Jun. 17, 2015, now U.S. Pat. No. 9,664,844, issued May 30, 2017; which is a continuation of U.S. application Ser. No. 13/920,844, filed Jun. 18, 2013, now U.S. Pat. No. 9,086,209, issued Jul. 21, 2015; which claims the benefit under 35 U.S.C. § 119 of Korean Patent Application Nos. 10-2012-0065259, filed Jun. 18, 2012; 10-2012-0065260, filed Jun. 18, 2012; and 10-2012-0065264, filed Jun. 18, 2012; which are hereby incorporated by reference in their entirety.

BACKGROUND

Field of the Invention

Embodiments of the present invention relate to the technology field of a lighting device.

Description of the Related Arts

An LED (Light Emitted Diode) device is a device which converts an electrical signal to infrared rays or light using a composition semiconductor property. Unlike a florescent lamp, since the LED device does not use harmful substances such as mercury and the like, it has a low possibility to cause environmental pollution and a long life span compared to a conventional light source. Also, it is advantageous that the LED device spends low electricity compared to the conventional light source and has excellent visibility and low brilliantness due to a high color temperature.

Accordingly, a current lighting device has been developed from a structure, in which a traditional light source such as a conventional incandescent lamp or a florescent lamp is used, to a structure, in which the aforesaid LED device is used as a light source. In particular, by using a light guide plate as disclosed in Korean Laid-Open Patent Publication No. 10-2012-0009209, the lighting device which performs a surface light-emitting function has been provided.

The aforesaid lighting device is composed in a structure in which a flat light guide plate is disposed on a substrate, and a plurality of side view type LEDs is disposed on a side of the light guide plate in an array shape. Here, the light guide plate is a kind of plastic molding lens which functions to uniformly supply light emitted from the LEDs. Accordingly, in the conventional lighting device, the light guide plate is used as an essential component. However, due to a thickness of the light guide plate itself, there is a limitation to make the thickness of an entire product thin. Furthermore, as a material of the light guide plate is not flexible, it is disadvantageous that it would be difficult to apply the light guide plate to a part in which a bend is formed, and thus a product plan and design cannot be easily changed.

Also, as the light is partially emitted to the side of the light guide plate, light loss is generated. Thus, it is problematic that light efficiency is reduced. Furthermore, as a temperature of the LEDs increases at the time of light emission, it is also problematic that the LEDs' characteristics (e.g. luminous intensity and wavelength transition) are changed.

PRIOR ART REFERENCE

Patent Reference

Korean Laid-Open Patent Publication No. 10-2012-0009209

BRIEF SUMMARY

Embodiments of the present invention have been made keeping in mind the above problems occurring in the related art. An aspect of the present invention provides a lighting device that can get thinner in thickness, improve a degree of freedom in product design and heat dissipation efficiency, and control a wavelength shift and a reduction in luminous intensity.

Another aspect of embodiments of the present invention provides a lighting device which can improve brightness by minimizing light loss.

Still another aspect of embodiments of the present invention provides a lighting device which can maximize the improvement of brightness without the addition of a light source by forming a reflection unit having a spacing part on a printed circuit board to improve light reflectance.

Still further another aspect of embodiments of the present invention provides a lighting device which can inhibit the generation of a hot spot while improving the uniformity of light by forming an optical pattern layer having an optical pattern in the lighting device.

According to an aspect of embodiments of the present invention, there is provided a lighting device, including: a light source module including at least one light source disposed on a printed circuit board, and a resin layer disposed on the printed circuit board so that the light source is embedded; a light reflection member formed on at least one of one side surface and another side surface of the resin layer; and a diffusion plate having an upper surface formed on the light source module, and a side wall which is integrally formed with the upper surface and formed to extend in a lower side direction and which is adhered to the light reflection member, wherein a first separated space is formed between the light source module and the upper surface of the diffusion plate.

The advantageous effect according to the embodiments of the present invention is that the light reflection module is provided so that the light loss generated from the side surface of the resin layer can be minimized, thereby enabling brightness and roughness of the lighting device to be improved.

Also, still another advantageous effect according to the embodiments of the present invention is that the light guide plate is removed and the resin layer is used to guide light so that the number of light emitting device packages can be reduced, and a total thickness of the lighting device can get thinner.

Also, still further advantageous effect according to the embodiments of the present invention is that the resin layer is formed of high heat resistant resin so that, in spite of the heat generated from the light source package, stable brightness can be implemented and the lighting device having high reliability can be provided.

Moreover, still further advantageous effect according to the embodiments of the present invention is that the lighting device is formed using the flexible printed circuit board and the resin layer so that flexibility can be secured, thereby enabling a degree of freedom in product design to be improved.

Furthermore, still further advantageous effect according to the embodiments of the present invention is that the diffusion plate itself surrounds a side surface of the light source module so that the diffusion plate itself can perform the function of a housing, and thus as a separate structure is not used, manufacturing process efficiency and, durability and reliability of the product itself can be improved. Also, according to the embodiments of the present invention, heat dissipation efficiency can be improved and a wavelength shift and a reduction in illumination intensity can be controlled.

Also, still further advantageous effect according to the embodiments of the present invention is that the light reflection member is provided so that the light loss generated from the side surface of the resin layer can be minimized, thereby enabling brightness and roughness of the lighting device to be improved.

Also, still further advantageous effect according to the embodiments of the present invention is that the reflection unit having the spacing part is provided on the surface of the printed circuit board so that the improvement of light reflectance as well as the improvement of brightness can be maximized. Furthermore, although the thickness of the lighting device and the number of the light source are not increased, the brightness can be improved, and thanks to a pattern design of the separation member (i.e. a spacer) which forms the spacing part, the control of light and reflection efficiency can be maximized.

Also, still further advantageous effect according to the embodiments of the present invention is that the optical pattern layer is formed in the light source module so that the concentration of light and the generation of a hot spot can be inhibited, and the uniformity of light supplied to the diffusion plate can be improved.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION

Figure 1:
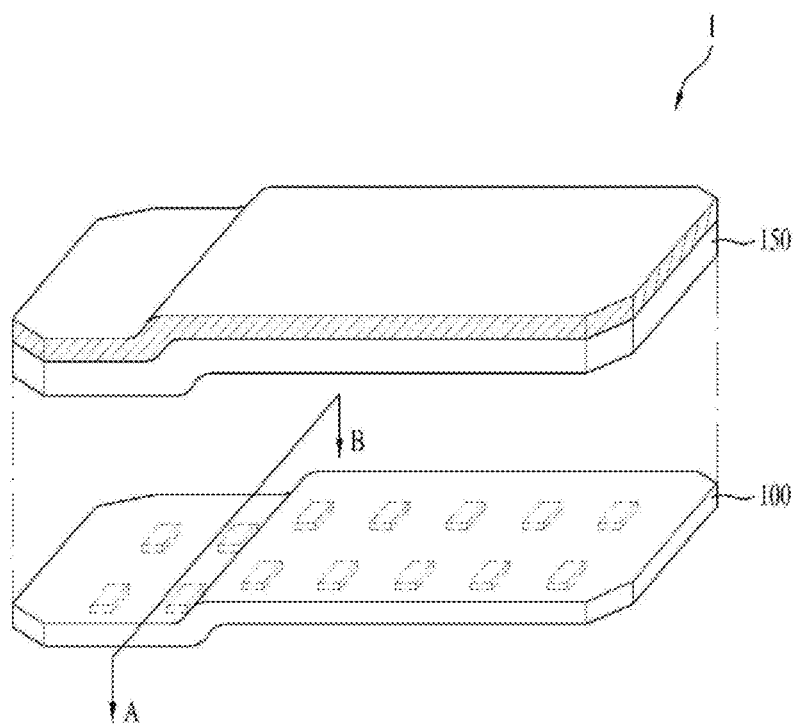
FIG. 1 shows a lighting device according to an exemplary embodiment of the present invention.

Embodiments according to the present invention will now be described more fully hereinafter with reference to the accompanying drawings so that those having ordinary skill in the art can easily embody. This invention may, however, be embodied in different forms and should not be construed as limited to the exemplary embodiments set forth herein. It is to be understood that the form of the present invention shown and described herein is to be taken as a preferred embodiment of the present invention and that various changes and modifications may be made in the invention without departing from the spirit and scope thereof. Also, in the following description, it is to be noted that, when the functions of conventional elements and the detailed description of elements related with the present invention may make the gist of the present invention unclear, a detailed description of those elements will be omitted. Reference will now be made in greater detail to a preferred embodiment of the invention, an example of which is illustrated in the accompanying drawings. Wherever possible, the same reference numerals will be used throughout the drawings and the description to refer to the same or like parts.

Embodiments of the present invention relate to a lighting device. The gist thereof is to provide a structure of the lighting device which is configured such that a light guide plate is removed, a resin layer is replaced with the light guide plate, and a light reflection member is formed on a side surface of the resin layer so that brightness and roughness can be improved, and a total thickness of the lighting device can be innovatively reduced. Furthermore, as the diffusion plate is used as a support of the light reflection member by processing the diffusion plate, an integral property, durability and reliability of the product can be secured, and flexibility of the lighting device itself can be also secured.

Moreover, the lighting device according to the embodiments of the present invention may be applied to various lamp devices such as a lamp for a vehicle, a lighting device for home use and an industrial lighting device for which illumination is required. For example, when the lighting device is applied to the lamp for the vehicle, it can be also applied to a headlight, indoor illumination for the vehicle, a door scarf, a back light and the like. In addition to this, the lighting device of the present invention can be applied to the field of a backlight unit applied to a liquid crystal display device. Except for this, the light device can be applied to all fields relating to illumination, which has been currently developed and commercialized or can be realized depending on future technical development.

Hereinafter, the light source module means that remaining elements except for a diffusion plate and a light reflection member are referred to as one.

FIG. 1 illustrates a lighting device 1 according to an embodiment of the present invention. Referring to FIG. 1, the lighting device 1 includes a light source module 100 which is a surface light source. Also, the lighting device 1 may further include a housing 150 for receiving the light source module 100.

The light source module 100 includes at least one light source for generating light. The light source may be composed of a light emitting device package including a light emitting chip. The light source module 100 may implement a surface light source by diffusing and dispersing the light generated from the light source, which is a point light source, and may have been bent due to its flexibility.

The housing 150 may protect the light source module 100 from an impact and may be composed of a material (for example, acryl) to which the light irradiated from the light source module 100 can be transmitted. Also, since the housing 150 may include a bending part in view of a design and the light source module 100 may have flexibility, the light source module can be easily received in the bending housing 150. Of course, since the housing 150 itself has constant flexibility, a total assembly structure of the lighting device 1 itself can also have constant flexibility.

Figure 2:
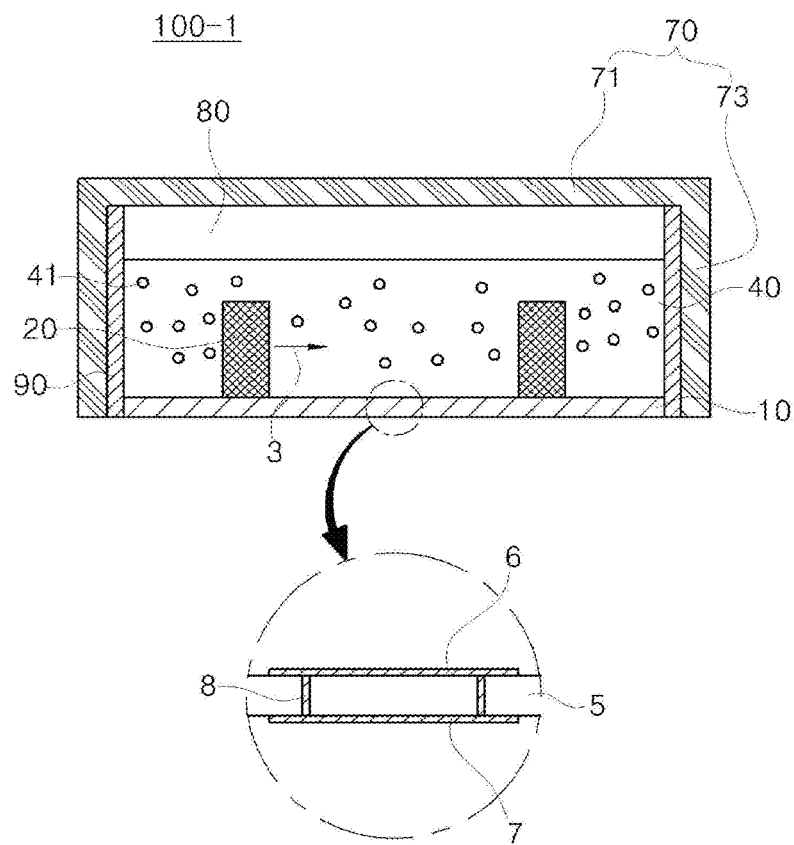
FIG. 2 and FIG. 3 show first and second exemplary embodiments of a light source module illustrated in FIG. 1.

FIG. 2 shows a first exemplary embodiment (100-1) of the light source module illustrated in FIG. 1, and more specifically, a cross-sectional view taken along AB of the light device illustrated in FIG. 1. Referring to FIG. 2, the light source module (100-1) includes: a printed circuit board 10; a light source 20; and a resin layer 40 for performing the function of a light guide plate. A light reflection member 90 is formed on at least one of one side surface and another side surface of the resin layer 40, and a diffusion plate 70 is formed on the aforesaid light source module 100-1.

The printed circuit board 10 may be a flexible printed circuit board using an insulating substrate having flexibility. For example, the flexible printed circuit board 10 may include a base member (for example, reference numeral 5) and a circuit pattern (for example, reference numerals 6 and 7) disposed on at least one surface of the base member (for example, reference numeral 5). A material of the base member (for example, reference numeral 5) may be a film having flexibility and an insulating property, for example, polyimide or epoxy (for example, FR-4).

More specifically, the flexible printed circuit board 10 may include an insulating film 5 (for example, polyimide or FR-4), a first copper foil pattern 6, a second copper foil pattern 7, and a via contact 8. The first copper foil pattern 6 is formed on one surface (for example, an upper surface) of the insulating film 5, and the second copper foil pattern 7 is formed on another surface (for example, a lower surface) of the insulating film 5. The first copper foil pattern 6 and the second copper foil pattern 7 may be connected through the via contact 8 formed to pass through the insulating film 5.

Hereinafter, a case in which the printed circuit board 10 is composed of the aforesaid flexible printed circuit board will be stated as an example. However, this is only an example. In addition to this, various types of boards may be used as the printed circuit board 10 of the present invention.

The light source 20 is disposed in one or more number on the flexible printed circuit board 10, thereby emitting light. For example, the light source 20 may be a side view type light emitting device package which is disposed so that the emitted light moves to a direction 3 being toward a side surface of the resin layer 40. At this time, the light emitting chip mounted to the light emitting device package may be a vertical type light emitting chip. For example, the light emitting chip may be a red light-emitting chip illustrated in FIG. 43. However, the present embodiment is not limited to this.

The resin layer 40 may be disposed in the printed circuit board 10 and an upper part of the light source 20 so that the light source 20 is embedded, and may diffuse and induce the light emitted from the light source 20 to a side direction of the resin layer 40 in a direction being toward one surface (for example, an upper surface) of the resin layer 40.

The resin layer 40 may be composed of a resin material which can diffuse the light. A refractive index thereof may range from 1.4 to 1.8. However, the refractive index is not limited to this.

For example, the resin layer 40 may be composed of an ultraviolet curing resin having a high heat resistant property and including a oligomer. At this time, a content of the oligomer may range from 40 to 50 wt. %. Also, urethane acrylate may be used as the ultraviolet curing resin. However, it is not limited to this. In addition to this, at least one material of epoxy acrylate, polyester acrylate, polyether acrylate, polybutadiene acrylate, and silicon acrylate may be used.

In particular, when the urethane acrylate is used as the oligomer, different physical properties from each other may be simultaneously implemented by using a mixture of two types of urethane acrylate.

For example, when isocyanate is used during synthesizing the urethane acrylate, physical properties (i.e. a yellowing property, a weather resistant property, and a chemically resistant property) of the urethane acrylate are determined by the isocyanate. At this time, when any one kind of urethane acrylate is implemented as urethane acrylate type-isocyanate, it is implemented that NCO % of PDI (isophorone diisocyanate) or IPDI (isophorone diisocyanate) becomes 37% (hereinafter referred to as 'a first oligomer'). Furthermore, when another one kind of urethane acrylate is implemented as the urethane acrylate type-isocyanate, it is implemented that NCO % of PDI (isophorone diisocyanate) or IPDI (isophorone diisocyanate) becomes 30 to 50% or 25 to 35% (hereinafter referred to as 'a second oligomer'). Thus, the oligomer according to the present exemplary embodiment may be formed. According to this, as NCO % is adjusted, the first oligomer and the second oligomer having different physical properties from each other may be obtained, and the oligomer which forms the resin layer 40 may be implemented by the first and second oligomers. A weight ratio of the first oligomer in the oligomer may be implemented in the range of 15 to 20, and a weight ratio of the second oligomer in the oligomer may be implemented in the range of 25 to 35.

Meanwhile, the resin layer 40 may further include any one of a monomer and a photo initiator. At this time, a content of the monomer may be formed in 65 to 90 parts by weight. More specifically, the monomer may be formed of a mixture including 35 to 45 parts by weight of IBOA (isobornyl acrylate), 10 to 15 parts by weight of 2-HEMA (2-hydroxyethyl methacrylate), and 15 to 20 parts by weight of 2-HBA (2-hydroxybutyl acrylate). Moreover, the photoinitiator (for example, I-hydroxycyclohexyl phenyl-ketone, diphenyl) and diphenyl(2,4,6-trimethylbenzoyl phosphine oxide and the like) may be formed in 0.5 to 1 parts by weight.

Also, the resin layer may be composed of a heat curing resin having a high heat resistant property. Specifically, the resin layer 40 may be composed of a heat curing resin including at least one of a polyester polyol resin, an acryl polyol resin, a hydrocarbon-based solvent or/and an ester-based solvent. The heat curing resin may further include a hest curing agent to improve coating strength.

In the case of the polyester polyol resin, a content of the polyester polyol resin may range from 9 to 30% based on a total weight of the heat curing resin. Also, in the case of the acryl polyol resin, a content of the acryl polyol resin may range from 20 to 40% based on the total weight of the heat curing resin.

In the case of the hydrocarbon-based solvent or the ester-based solvent, a content thereof may range from 30 to 70% based on the total weight of the heat curing resin. In the case of the heat curing agent, a content thereof may range from 1 to 10% based on the total weight of the heat curing resin. When the resin layer 40 is formed of the aforesaid materials, the heat resistant property of the resin layer is reinforced. Thus, even though the resin layer is used in the lighting device from which the heat of a high temperature is emitted, a reduction in brightness due to heat can be minimized, thereby enabling the lighting device having high reliability to be provided.

Also, according to the present embodiment of present invention, as the aforesaid materials are used to implement a surface light source, a thickness of the resin layer 40 can be innovatively reduced. Thus, a whole product can be implemented to get thinner in thickness. Furthermore, according to the present invention, since the lighting device is formed using the flexible printed circuit board and the resin layer made of a flexible material, it can be easily applied to a bending surface. Thus, it is advantageous that a degree of freedom in design can be improved, and the lighting device can be applied to other flexible display devices.

The resin layer 40 may include a diffusion material 41 having a hollow (or a pore space) in an inner part thereof. The diffusion material 41 may have a shape which is mixed or diffused with resin which composes the resin layer 40, and may function to improve light reflection and diffusion properties.

For example, as light emitted from the light source 20 to an inner part of the resin layer 40 is reflected and transmitted by the hollow of the diffusion material 41, the light may be diffused and concentrated in the resin layer 40, and the diffused and concentrated light may be emitted to one surface (e.g. an upper part surface) of the resin layer 40. At this time, since reflectance and a diffusion rate of the light are improved due to the diffusion material 41, an amount and uniformity of the emission light supplied to the upper surface of the resin layer 40 can be improved, thereby enabling brightness of the light source module 100-1 to be improved.

A content of the diffusion material 41 may be appropriately adjusted to obtain a desired light diffusion effect. Specifically, the content may be adjusted in the range of 0.01 to 0.3% based on the total weight of the resin layer 40. However, the content is not limited to this. The diffusion material 41 may be composed of any one selected from the group consisting of silicon, silica, glass bubble, PMMA, urethane, Zn, Zr, $Al_2O_3$, and acryl. A particle diameter of the diffusion material 41 may be 1 μm to 20 μm. However, the particle diameter is not limited to this.

The light reflection member 90 is formed on at least one of one side surface and another side surface of the resin layer 40. The light reflection member 90 guides so that the light irradiated from the light emitting device 20 is emitted to the upper part of the resin layer, and performs as a guide function for inhibiting light from being emitted through the side surface of the resin layer 40 to the outside. The reflection member 90 may be composed of a material having excellent light reflectance such as a white resist. In addition to this, the light reflection member 90 may be composed of a synthetic resin in which a white pigment is dispersed, or a synthetic resin in which metal particles having an excellent light reflection property are dispersed. At this time, titanium oxide, aluminum oxide, zinc oxide, lead carbonate, barium sulfate, calcium carbonate and the like may be used as the white pigment. When the metal particles are included, Ag powders having excellent reflectance may be included. Also, a separate fluorescent brightening agent may be additionally included. That is, the light reflection member 90 of the present embodiment of the invention may be formed using all materials having excellent light reflectance, which has developed or can be implemented depending on future technical development. Meanwhile, the light reflection member 90 may be directly molded and connected to the side surface of the resin layer 40 or may be bonded thereto by a separate adhesive material (or an adhesive tape).

Moreover, the light reflection member 90 may be directly molded and connected to an inner side of a side wall 73 of the diffusion plate 70, may be bonded thereto by a separate adhesive material or may be connected to the diffusion plate 70 by being directly printed to the inner side of the side wall 73.

Also, the drawing illustrates that the light reflection member 90 is formed all over the inner side of the side wall 73 of the diffusion plate 70. However, this is only one example. The light reflection member 90 may be formed only on the side surface of the resin layer 40 or may be formed on both the side surface of the resin layer 40 and the side surface of the printed circuit board 10. That is, if the range includes the side surface of the resin layer 40, the formation range of the light reflection member 90 is not limited.

Thus, as the light reflection member 90 is formed on the side surface of the resin layer 40, the leakage of light to the side surface of the resin layer 40 can be inhibited, so light loss can be reduced, light efficiency can be improved, and brightness and roughness of the lighting device can be improved under a same electricity condition.

The diffusion plate 70 may be disposed in an upper part of the light source module 100-1, more specifically, on the resin layer 40, and may function to uniformly diffuse the light emitted through the resin layer 40 throughout a whole surface. A thickness of the diffusion plate 70 may be basically formed in the range of 0.5 to 5 mm. However, the thickness is not limited to this. The thickness may be appropriately designed and changed depending on the lighting device's spec. In particular, as illustrated in FIG. 2, the diffusion plate 70 of the present invention is formed in a structure having an upper surface 71 and the side wall 73 integrally formed with the upper surface 71. At this time, the side wall 73 surrounds a side surface of the light source module 100-1. The diffusion plate 70 may be generally formed of an acryl resin. However, the material is not limited to this. In addition to this, the diffusion plate 70 may be formed of a high penetrating plastic material capable of performing a light diffusion function such as poly styrene (PS), polymethyl methacrylate (PMMA), cyclic olefin copolymer (COC), polyethylene terephthalate (PET), and resin.

A first separated space 80 may be present between an upper surface of the diffusion plate 70 and the resin layer. Thanks to the existence of the first separated space, a difference in refractive index with the resin layer 40 may be generated, thereby enabling the uniformity of light supplied to the diffusion plate 70 to be improved. Consequently, the uniformity of light diffused and emitted through the diffusion plate 70 may be improved. At this time, to minimize a deviation in light which transmits the resin layer 40, a thickness of the first separated space 80 may be formed in the range which is more than 0 but is less than 30 mm. However, the thickness is not limited to this. This can be changed in design as needed.

The side wall 73 of the diffusion plate 70 surrounds the side surface of the light source module 100-1. As described above, the side wall 73 may perform the function of a support for supporting the light reflection member 90 and the function of a housing for protecting the light source module 100-1. That is, the diffusion plate 70 according to the present embodiment of the invention may perform the function of the housing 150 illustrated in FIG. 1 as needed. Accordingly, the diffusion plate itself surrounds the side surface of the light source module 100-1, so the diffusion plate itself may perform the function of the housing. Thus, as a separate structure is not used, it is advantageous that manufacturing process efficiency and durability and reliability of the product itself can be improved.

Figure 3:
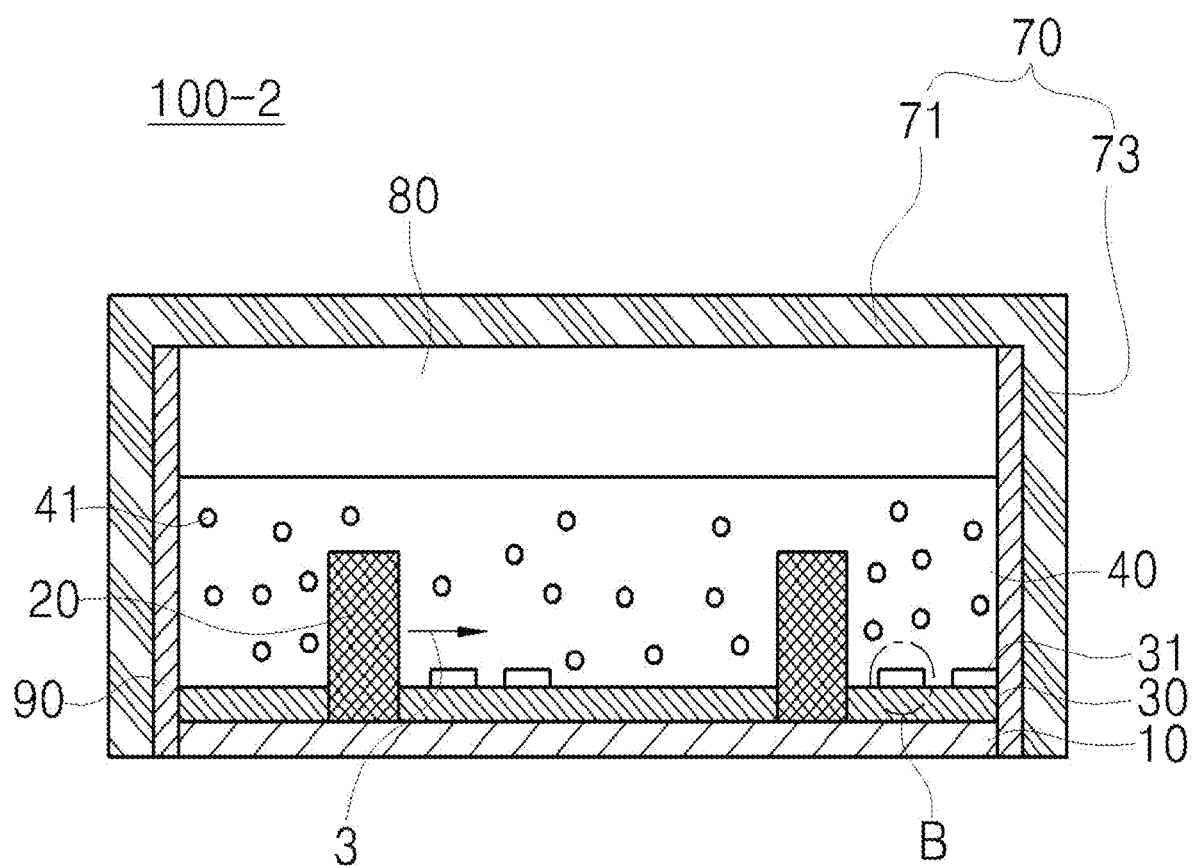

Referring to FIG. 3, a light source module 100-2 may have a structure in which the reflection unit 30 and a reflection pattern 31 are added to the first exemplary embodiment.

The reflection unit 30 may be disposed between the flexible printed circuit board 10 and the resin layer 40, and the reflection pattern 31 may be further formed on the reflection unit 30. The reflection unit 30 and the reflection pattern 31 may function to improve the reflectance of light emitted from the light source 20.

The reflection unit 30 may be composed of a material having high reflection efficiency. The reflection unit 30 reflects the light irradiated from the light source 20 onto one surface (for example, an upper surface) of the resin layer 40 so that the light is not leaked to another surface (for example, a lower surface) of the resin layer 40, thereby enabling light loss to be reduced. The reflection unit 30 may be composed in a single film form. To realize a characteristic for promoting the reflection and diffusion of light, the reflection unit 30 may be formed of the synthetic resin in which the white pigment is dispersedly contained.

For example, titanium oxide, aluminum oxide, zinc oxide, lead carbonate, barium sulfate, calcium carbonate and the like may be used as the white pigment. Polyethylene terephthalate, polyethylene naphthalate, acryl resin, poly carbonate, polystyrene, polyolefin, cellulose acetate, weather resistant vinyl chloride and the like may be used as the synthetic resin. However, the present invention is not limited to this.

Also, the reflection unit 30 may have a spacing part in an inner part thereof. The more detailed contents will be described in the description of FIG. 4 and FIG. 5.

The reflection pattern 31 may be disposed on a surface of the reflection unit 30 and may function to scatter and disperse incident light. The reflection pattern may be formed by printing the surface of the reflection unit with a reflection ink including any one of $TiO_2$, $CaCO_3$, $BaSO_4$, $Al_2O_3$, Silicon, and PS (Polystyrene). However, it is not limited to this.

Also, a structure of the reflection pattern 31 may be a plurality of protruding patterns and may be regular or irregular. To improve the scattering effect of light, the reflection pattern 31 may be formed in a prism shape, a lenticular shape, a lens shape or a combined shape thereof. However, the shape is not limited to this. Also, in FIG. 3, a cross section shape of the reflection pattern 31 may be composed in various shapes such as a polygonal shape of a triangular shape, a quadrangular shape and the like, a semicircular shape, a sinusoidal shape and the like. Also, when looking down the reflection pattern 31 from the above, the shape thereof may be composed in a polygonal shape (e.g. a hexagonal shape), a circular shape, an elliptical shape or a semicircular shape.

Figure 16:
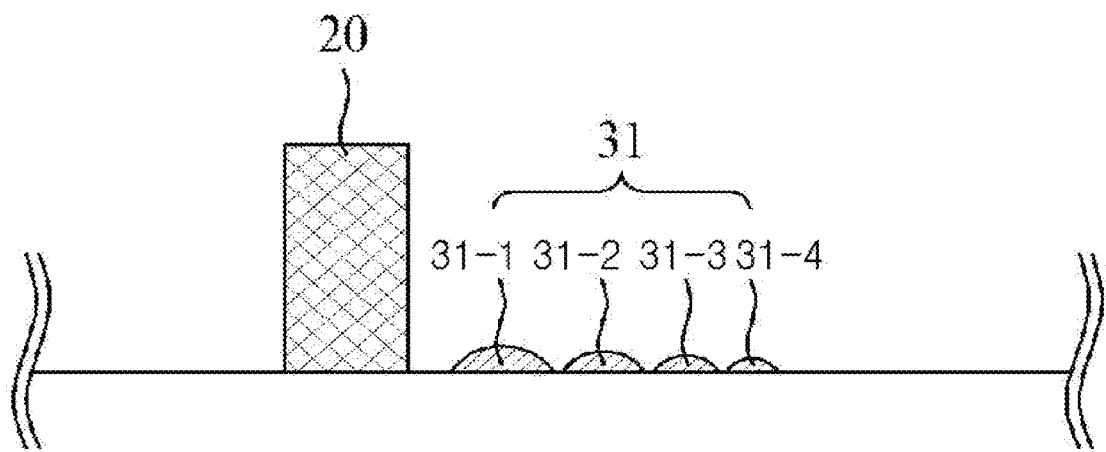
FIG. 16 shows an exemplary embodiment of a reflection pattern illustrated in FIG. 3.

FIG. 16 shows one embodiment of the reflection pattern illustrated in FIG. 3. Referring to FIG. 16, the reflection pattern 31 may have different diameters from each other depending on a separation distance with the light source 20.

For example, as the reflection pattern 31 becomes gradually adjacent to the light source 20, a diameter of the reflection pattern 31 may be larger. Specifically, the diameter may be large in the order of a first reflection pattern 31-1, a second reflection pattern 31-2, a third reflection pattern 31-3 and a fourth reflection pattern 31-4. However, the present embodiment is not limited to this. In addition to this, the reflection pattern 31 of the present embodiment of the invention may be formed in various configurations such a configuration in which a density is changed depending on a distance with the light source, and a configuration in which a size and a density are all changed depending on a distance with the light source.

Figure 4:
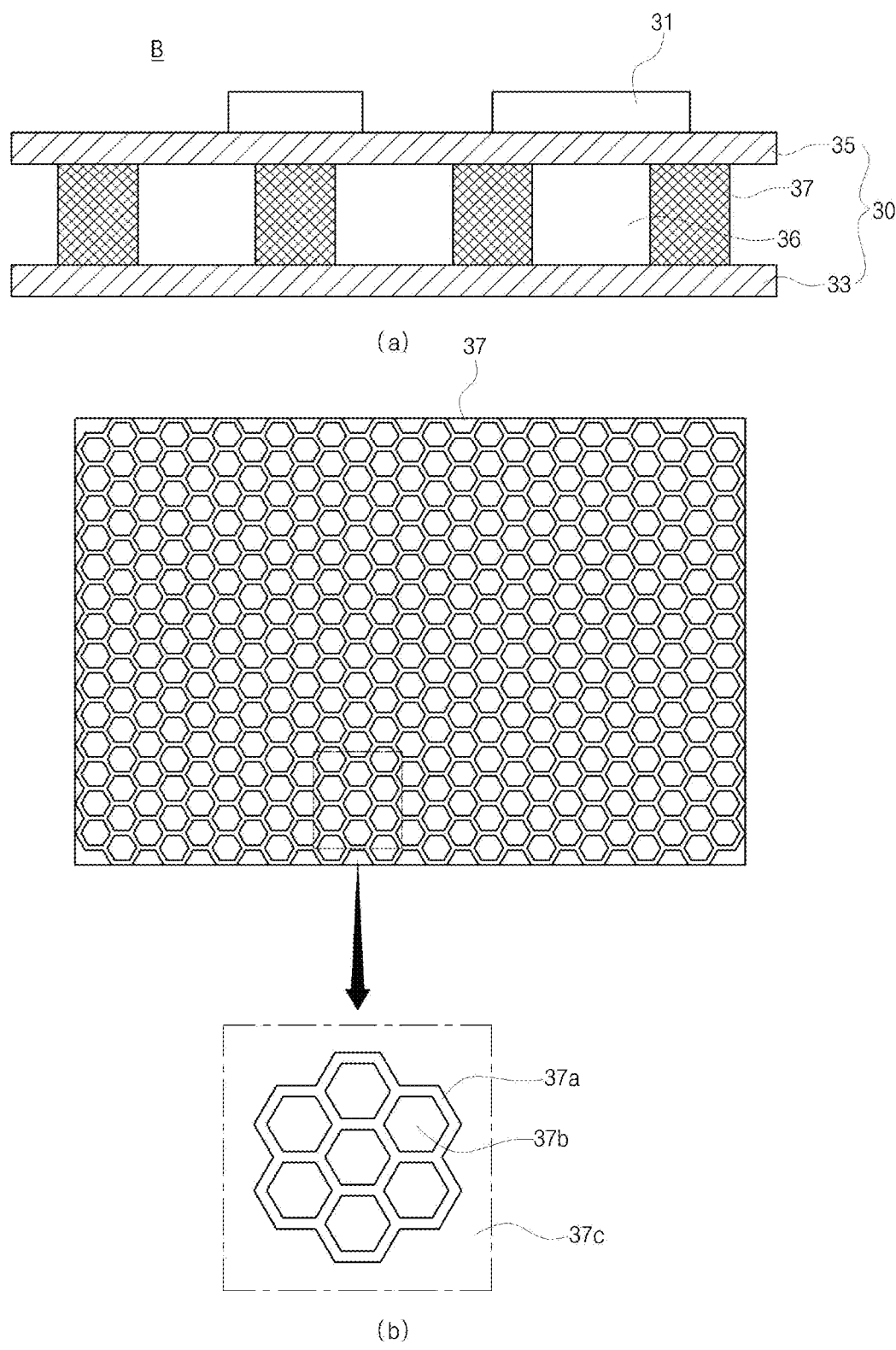
FIG. 4 and FIG. 5 illustrate exemplary embodiments of a separation member which composes a reflection unit stated in FIG. 3.

In the lighting device of the embodiment of the present invention stated in the description of the FIG. 3, FIG. 4 illustrates some embodiments of the reflection unit 30 and a separation member 37 which composes the reflection unit 30.

Referring to FIG. 3 to (a) of FIG. 4, the reflection unit 30 formed on the flexible printed circuit board has a first spacing part 36 in an inner part thereof. The first spacing part 36 functions to maximize brightness by increasing reflection efficiency of the light emitted from the light source.

In particular, the reflection unit 30 may include a first reflection sheet 33 which is closely bonded onto the surface of the flexible printed circuit board (reference numeral 10 of FIG. 3), and a second reflection sheet 35 made of a transparent material and spaced apart from the first reflection film 33 to form the first spacing part 36. The first and second reflection sheets 33, 35 are laminated on the flexible printed circuit board (reference numeral 10 of FIG. 3) and pass through a hole formed on the reflection unit 30 so that the light source (reference numeral 20 of FIG. 2) protrudes to the outside.

The first spacing part 36 may be formed by integrally compressing the first and second reflection sheets 33, 35 without using a separate member such as an adhesive agent. Furthermore, as illustrated in the drawing, the first spacing part 36, in which air is received through the separation member 37 such as an adhesive member, may be implemented between the first reflection film 33 and the second reflection film 35.

The first reflection sheet 33 may be formed using a reflection material which reflects light, for example, a film in which a metal layer such as Ag is formed on a base member. Alternately, the first reflection sheet 33 may be implemented using the synthetic resin, in which a white pigment is dispersedly contained, such as white PET (polyethylene terephthalate) in order to implement a characteristic for promoting the reflection and dispersion of the light. At this time, titanium oxide, aluminum oxide, zinc oxide, lead carbonate, barium sulfate, calcium carbonate and the like may be used as the white pigment. Polyethylene terephthalate, polyethylene naphthalate, acryl resin, poly carbonate, polystyrene, polyolefin, cellulose acetate, weather resistant vinyl chloride and the like may be used as the synthetic resin. However, the present embodiment is not limited to this.

The second reflection sheet 35 may be implemented by a film made of a transparent material such as PET so that light emitted from the light source (reference numeral 20 of FIG. 3) is transmitted to the surface of the first reflection film 33 and the transmitted light is again reflected.

Meanwhile, the reflection pattern 31 may be further formed on the second reflection sheet 33 so that brightness can be improved by more promoting the dispersion of light. The reflection pattern 31 is an element which functions to scatter and disperse the incident light. The reflection pattern 31 may be formed by printing a surface of the second reflection sheet 35 with a reflective ink including any one of $TiO_2$, $CaCO_3$, $BaSO_4$, $Al_2O_3$, Silicon, and PS (Polystyrene). However, the present embodiment is not limited to this.

(b) of FIG. 4 illustrates an exemplary embodiment of the separation member which composes the aforesaid reflection unit 30 stated in (a) of FIG. 4. The separation member 37 according to the present invention may implement the first spacing part 36 by performing only a general separation function such as a spacer member for simply separating the first reflection sheet 33 from the second reflection sheet 35 or a spacer member having an adhesive property. More preferably, in order to improve adhesive efficiency at the same time as improving disposition efficiency of the spacing part, when the separation member is implemented, a patterning structure illustrated in (b) of FIG. 4 may be uniformly and randomly formed.

The separation member 37 illustrated in (b) of FIG. 4 may be implemented in a two-dimensional or three-dimensional structure in which a plurality of unit separation members 37a having a pore space part in an inner part is disposed, and a first spacing part 36 is implemented in a structure in which an inner side of the unit separation member 37a is empty. At this time, a cross-section of the unit separation member 37a may be implemented in various shapes such as a polygonal shape, a circular shape and the like. In particular, as illustrated, in addition to a structure in which the plurality of unit separation members 37a is disposed to be closely adhered to each other, the plurality of unit separation members 37a is irregularly disposed, so except for the first spacing part 36 of the inner part of the unit separation members 37a, a second separation part 37c, which is composed of a vacant space among the unit separation members 37a, may be further formed. Thus, in the lighting device of the present embodiment of the invention including the aforesaid reflection unit 30, as the reflection unit 30 having the separation area is provided, the improvement of brightness as well as the improvement of light reflectance may be maximized. Also, although a thickness of the lighting device or the number of light sources is not increased, the brightness can be increased, and thanks to a pattern design of the separation member (the spacer) which forms the spacing part, the control of light and reflection efficiency can be maximized.

Figure 5:
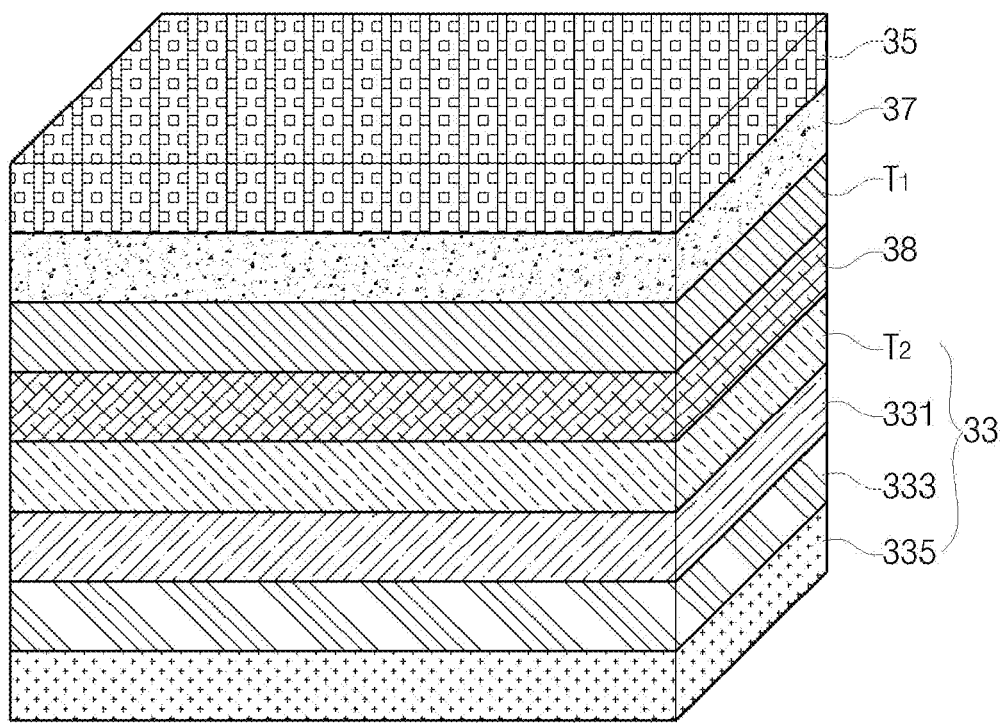

FIG. 5 illustrates detailed one exemplary embodiment of the reflection unit stated in FIG. 4.

As aforesaid, the reflection unit 30 according to the present embodiment of the invention includes the first reflection sheet 33 which is closely bonded onto the surface of the flexible printed circuit board, and the second reflection sheet 35 which is disposed to be opposite to the first reflection film 33.

In particular, the film of the transparent material such as PET and the like may be applied to the second reflection sheet 35. The separation member 37 for separating the first reflection sheet 33 from the second reflection sheet 35 is provided by patterning an adhesive material, thereby enabling the spacing part to be formed.

In particular, to maximize reflection efficiency, the first reflection sheet 33 has a film 331 onto which a metal reflection layer 38 is bonded by an adhesive agent (i.e. a primer). The film 331 may be also implemented in a structure which is laminated on a release film 335 by the adhesive material 333 (i.e. PSA). However, this is only one example. In addition to this, the first reflection sheet 33 of the present embodiment of the invention may be also implemented using white PET, which is the same as previously described in the description of FIG. 4.

Figure 6:
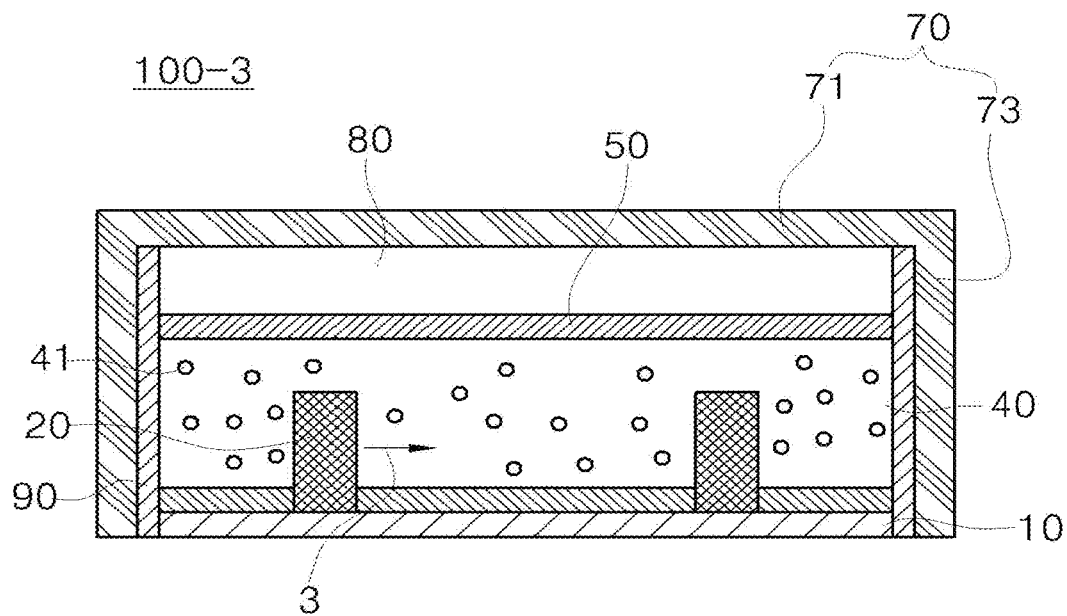
FIG. 6 through FIG. 9 show third to sixth exemplary embodiments of the light source module illustrated in FIG. 1.

FIG. 6 shows a third exemplary embodiment 100-3 of the light source module illustrated in FIG. 1. The same reference numerals as those of FIG. 2 represent the same elements, and the contents overlapping with those stated earlier are omitted or are briefly stated.

Referring to FIG. 6, the light source module 100-3 may have a structure in which an optical pattern layer 50 is added to the first exemplary embodiment.

The optical pattern layer 50 is disposed on the resin layer 40 and transmits the light emitted from one surface (for example, the upper surface) of the resin layer 40. The optical pattern layer 50 may be composed of a single optical sheet. In this case, the optical pattern layer 50 may be formed using a material having excellent light transmittance, for example, PET (Polyethylene Telephthalate).

Meanwhile, when the optical pattern layer 50 is formed of the single optical sheet, the first separated space 80 as stated in the description of FIG. 2 may be formed between the upper surface 71 of the diffusion plate 70, and the optical sheet. Thanks to the existence of the first separated space 80, the uniformity of light supplied to the diffusion plate 70 can be improved. Consequently, the uniformity of light diffused and emitted through the diffusion plate 70 can be improved, which is the same as previously described in the description of FIG. 2.

Figure 8:
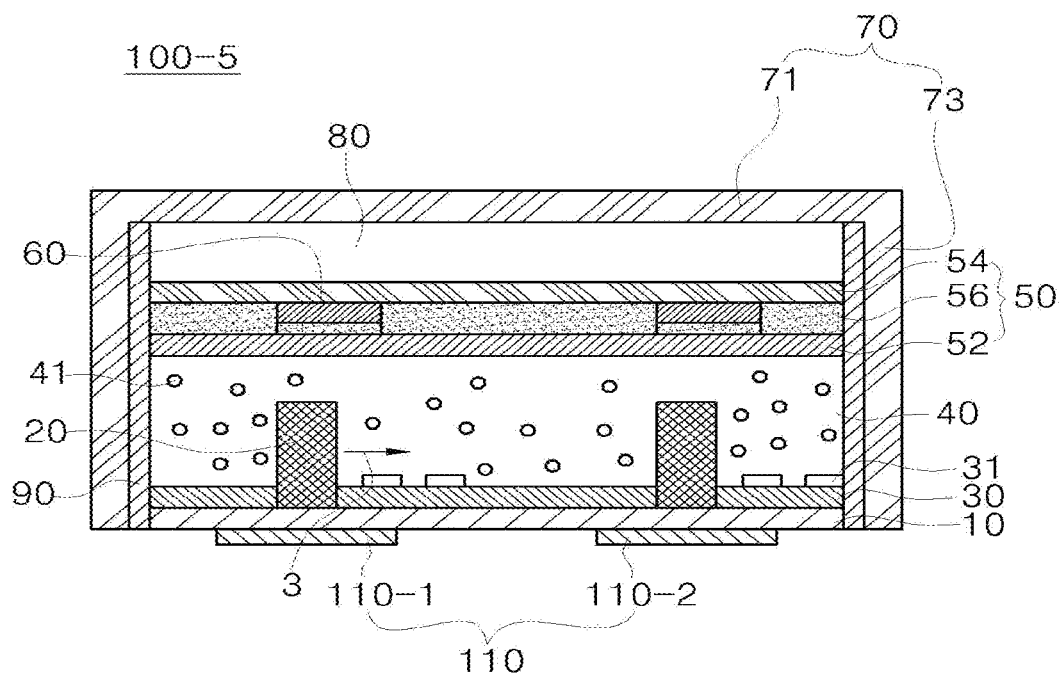
Figure 9:
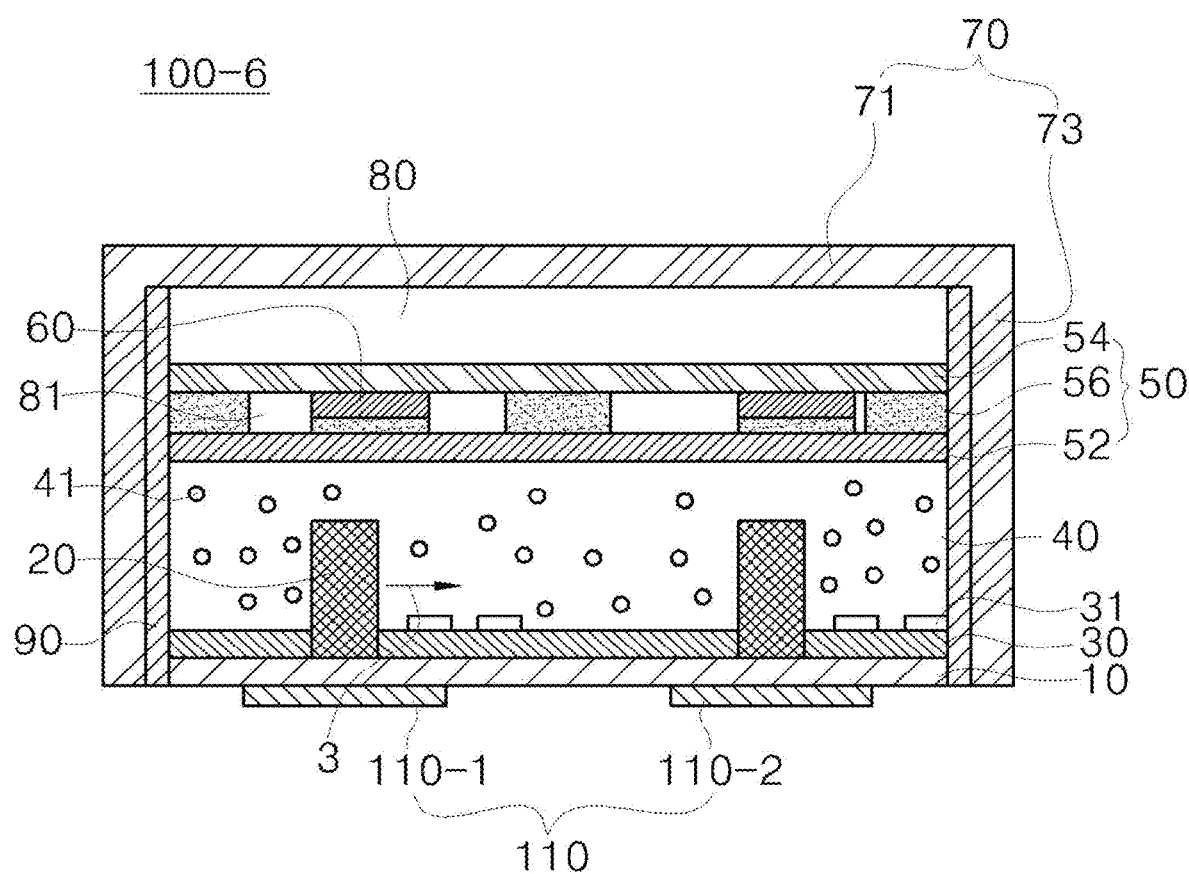
Figure 10:
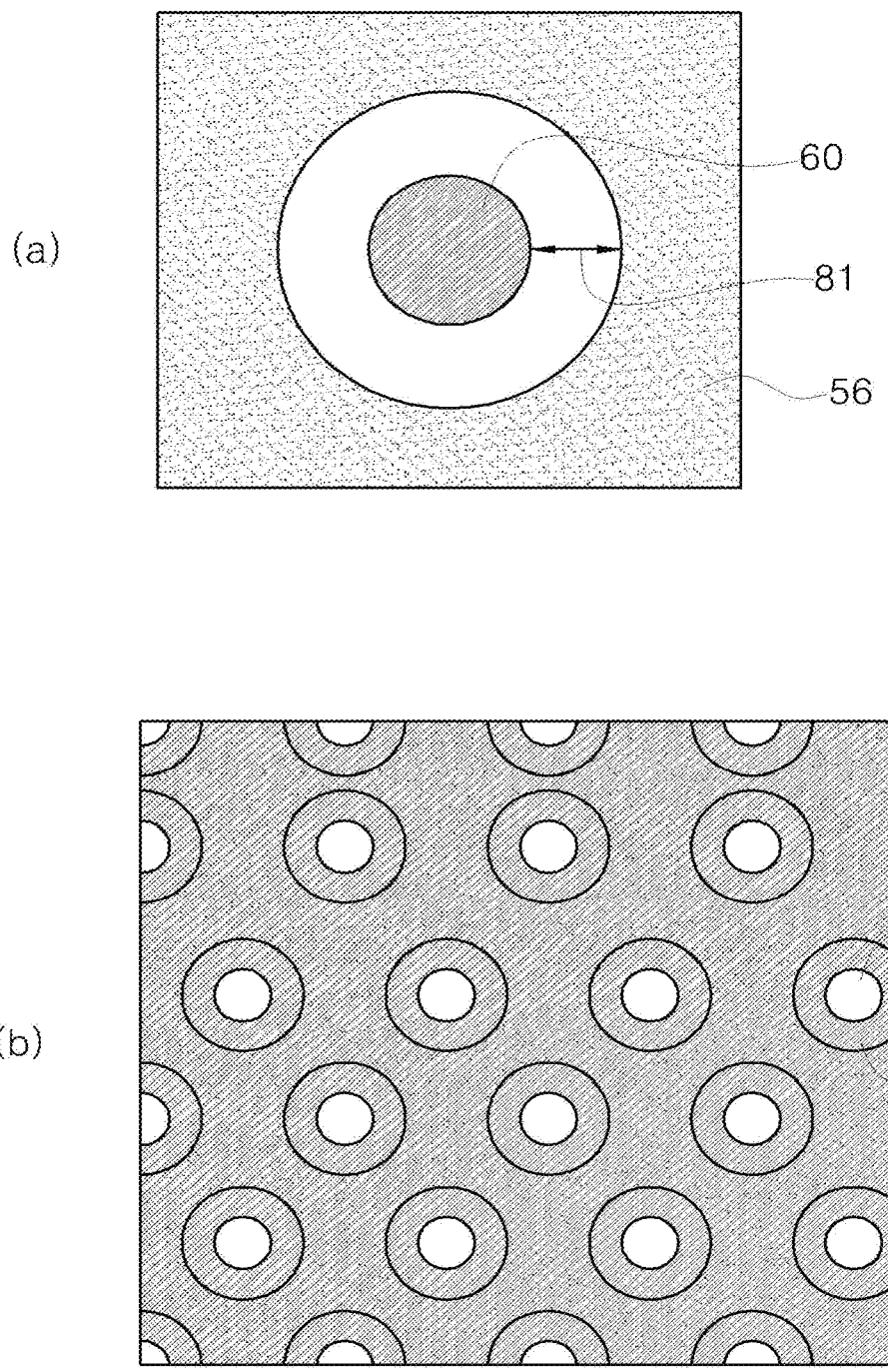
FIG. 10 illustrates an exemplary embodiment of an optical pattern layer according to the present invention.

FIG. 6 and the optical pattern layer having other structures will be stated in the description of FIG. 8 to FIG. 10.

Figure 7:
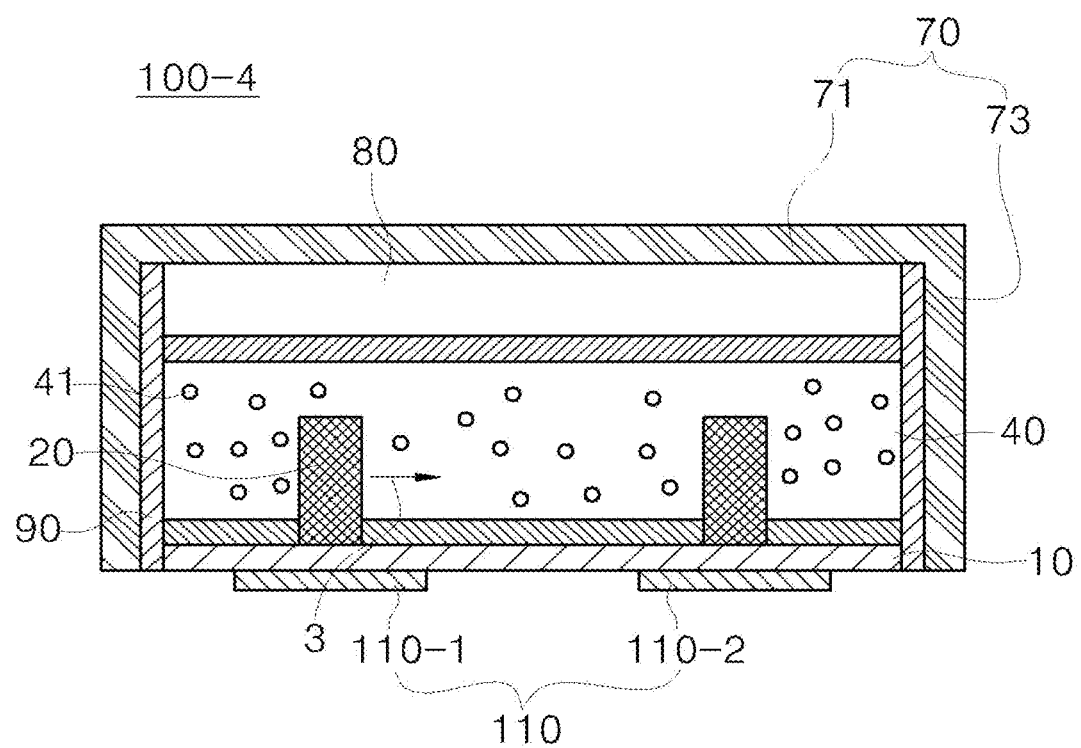

FIG. 7 shows a fourth exemplary embodiment 100-4 of the light source module illustrated in FIG. 1. The same reference numerals as those of FIG. 2 represent the same elements, and the contents overlapping with those stated earlier are omitted or are briefly stated.

Referring to FIG. 7, to improve heat dissipation efficiency, the fourth exemplary embodiment may have a structure in which a heat dissipation member 110 is further included in the first exemplary embodiment.

The heat dissipation member 110 is disposed on a lower surface of the flexible printed circuit board 10 and functions to emit the heat generated from the light source 20 to the outside. That is, the heat dissipation member 110 can improve efficiency for emitting the light generated from the light source 20, which is a heat source, to the outside.

For example, the heat dissipation member 110 may be disposed on one portion of the lower surface of the flexible printed circuit board 10. The heat dissipation member 110 may include a plurality of heat dissipation layers (e.g. 110-1, 110-2) which is spaced apart from each other. In order to improve a heat dissipation effect, at least a part of the heat dissipation layers 110-1,110-2 may overlap with the light source 20 in a vertical direction. Here, the vertical direction may be a direction which is toward the resin layer 40 from the flexible printed circuit board 10.

The heat dissipation member 110 may be a material having high heat conductivity such as Al, an Al alloy, Cu, or a Cu alloy. Alternately, the heat dissipation member 110 may be an MCPCB (Metal Core Printed Circuit Board). The heat dissipation member 110 may be bonded onto the lower surface of the flexible printed circuit board 10 by an acryl-based adhesive agent (not drawn).

In general, when the temperature of a light emitting device increases due to heat generated from the light emitting device, luminous intensity of the light emitting device may be reduced, and the wavelength shift of generated light may be generated. In particular, when the light emitting device is a red light emitting diode, the wavelength shift and the reduction in luminous intensity may be severely generated.

However, the light source module 100-4 may control an increase in temperature of the light source by providing the heat dissipation member 110 on the lower surface of the flexible printed circuit board 10 to efficiently emit the heat generated from the light source 20. Thus, the reduction in luminous intensity of the light source module 100-4 or the generation of the wavelength shift of the light source module 100-4 may be controlled.

FIG. 7 illustrates a structure in which the heat dissipation member 110 is added to the light source module 100-1 of FIG. 2. However, it would also be obvious to those having ordinary skill in the art that the heat dissipation member can be also added to the light source modules 100-2, 100-3 of FIG. 3 and FIG. 6 which are the second exemplary embodiment and the third exemplary embodiment.

FIG. 8 shows a fifth exemplary embodiment 100-5 of the light source module illustrated in FIG. 1.

Referring to FIG. 8, the light source module 100-5, which is the optical pattern layer 50 added to the fourth exemplary embodiment 100-4, may be composed in a structure in which the optical pattern layer 50 includes a first optical sheet 52, an adhesive layer 56, an optical pattern 60 and a second optical sheet 54.

The first optical sheet 52 is disposed on the resin layer 40, and the second optical sheet is disposed on the first optical sheet 52. The first optical sheet 52 and the second optical sheet 54 may be formed using a material having excellent light transmittance. For example, PET may be used as the material. At this time, a thickness of the first optical sheet 52 or the second optical sheet may be formed in the range of 12 to 300 μm. However, the thickness is not limited to this. The thickness may be appropriately changed depending on the lighting device's spec.

The adhesive layer 56 is disposed between the first optical sheet 52 and the second optical sheet 54 to bond the first optical sheet 52 to the second optical sheet 54.

The optical pattern 60 may be disposed on at least one of an upper surface of the first optical sheet 52 or a lower surface of the second optical sheet 54. The optical pattern 60 may be bonded onto at least one of the upper surface of the first optical sheet 52 and the lower surface of the second optical sheet 54 by the adhesive layer 56. Meanwhile, one or more optical sheets (not drawn) may be further included in the second optical sheet 54. The optical pattern 60 may be a light shielding pattern for inhibiting the concentration of light emitted from the light source 20. The optical pattern 60 may be aligned in the light source 20 and may be formed in a type which is bonded to the first optical sheet and the second optical sheet by the adhesive layer 56 or may be formed by being directly printed on at least any one surface of the first optical sheet 52 and the second optical sheet 54.

The first optical sheet 52 and the second optical sheet 54 may be formed using a material having excellent light transmittance. For example, PET may be used as the material. The optical pattern 60 basically functions to inhibit the concentration of the light emitted from the light source 20. That is, the optical pattern 60 as well as the aforesaid reflection pattern 31 may function to implement uniform surface light emission.

The optical pattern 60 may be a light shielding pattern for partially shielding the light emitted from the light source 20 and may inhibit a reduction in optical characteristic or a yellowish phenomenon which is generated due to the excessively strong strength of light. For example, the optical pattern 60 may inhibit the concentration of light to an area which is adjacent to the light source 20 and may function to disperse the light.

The optical pattern 60 may be formed by performing a printing process for the upper surface of the first optical sheet 52 or the lower surface of the second optical sheet 54 using the light shielding ink. The optical pattern 60 may adjust a light shielding degree or a light diffusion degree by adjusting at least one of a density and a size of the optical pattern so that the optical pattern 60 does not function to completely shield the light, but functions to partially shield and diffuse the light. As one example, to improve light efficiency, as a distance between the optical pattern 60 and the light source 20 increases, a density of the optical pattern may be adjusted to get lower. However, the present embodiment is not limited to this.

Specifically, the optical pattern 60 may be implemented in an overlapping print structure of a composite pattern. The overlapping print structure means a structure in which one pattern is formed, and another pattern is printed on an upper part thereof.

As one example, the optical pattern 60 may include a diffusion pattern and a light shielding pattern, and may be have a structure in which the diffusion pattern and the light shielding pattern overlap with each other. For example, the diffusion pattern may be formed on a lower surface of a polymer film (e.g. the second optical sheet 54) in a light emitting direction using a light shielding ink including one or more materials selected from the group consisting of $TiO_2$, $CaCO_3$, $BaSO_4$, $Al_2O_3$, Silicon, and PS (polystyrene). Furthermore, the light shielding pattern may be formed on the surface of the polymer film using a light shielding ink including Al or a mixture of Al and $TiO_2$.

That is, after the diffusion pattern is formed by white-printing it on the surface of the polymer film, the light shielding pattern is formed thereon. In the reverse order of the above one, the diffusion pattern may be formed in a double structure. Of course, it would be obvious that a formation design of this pattern may be variously modified in consideration of the efficiency and strength of light, and a light shielding rate.

Alternately, in another exemplary embodiment, the optical pattern 60 may have a triple structure including the first diffusion pattern, the second diffusion pattern, and the light shielding pattern disposed therebetween. In this triple structure, the optical pattern 60 may be implemented using the aforesaid materials. As one example, the first diffusion pattern may include $TiO_2$ having excellent refractive index, the second diffusion pattern may include $CaCO_3$ and $TiO_2$ having excellent light stability and color sense, and the light shielding pattern may include Al having an excellent concealing property. Thanks to the optical pattern having the triple structure, the present exemplary embodiment can secure the efficiency and uniformity of light. In particular, $CaCO_3$ may function to reduce a yellowish phenomenon. Through this function, $CaCO_3$ may function to finally implement white light, thereby enabling light having more stable efficiency to be implemented. In addition of $CaCO_3$, inorganic materials having a large particle size such as and a similar structure to $BaSO_4$, $Al_2O_3$, silicon may be utilized as a diffusion material used in the diffusion pattern.

The adhesive layer 56 may surround a periphery part of the optical pattern 60 and may fix the optical pattern 60 to at least any one of the first optical sheet 52 and the second optical sheet 54. At this time, a heat curing PSA, a heat curing adhesive agent or a UV curing PSA type material may be used in the adhesive layer 56. However, the present invention is not limited to this.

FIG. 9 shows a sixth exemplary embodiment 100-6 of the light source module illustrated in FIG. 1.

Referring to FIG. 9, the light source module 100-6 may have a structure in which a second spacing space 81 is added to the fifth exemplary embodiment. That is, the optical pattern layer 50 in the sixth exemplary embodiment 100-6 may include the first optical sheet 52, the adhesive layer 56, the second optical sheet 54, the optical pattern, and the second spacing space 81 formed between the first optical sheet 52 and the second optical sheet 54.

For example, the second spacing space 81 may be formed in the adhesive layer 56. The adhesive layer 56 may form a separated space (i.e. the second spacing space 81) around the optical pattern 60. Furthermore, by applying an adhesive material to remaining parts, the adhesive layer 56 may be implemented in a structure in which the first optical sheet 52 and the second optical sheet 54 are bonded to each other.

The adhesive layer 56 may be composed in a structure in which the second spacing space 81 is located in the periphery part of the optical pattern 60. Alternately, the adhesive layer 56 may be composed in a structure in which the adhesive layer 56 surrounds the periphery part of the optical pattern 60, and the second spacing space 81 is located in a remaining part except for the periphery part. The adhesive structure of the first optical sheet 52 and the second optical sheet 54 may also implement a function for fixing the printed optical pattern 60. Since the second spacing space 81 and the adhesive layer 56 have different refractive indexes from each other, the second spacing space 81 may improve the diffusion and dispersion of light, which moves to a direction of the second optical sheet 56 from the first optical sheet 52. Due to this, a more uniform surface light source can be implemented.

FIG. 10 conceptually illustrates the configuration of the optical pattern layer (reference numeral 50 of FIG. 9) illustrated in FIG. 9. The adhesive layer 56 is formed in a structure which surrounds around the optical pattern 60 which is printed as a specific pattern on the first optical sheet stated in the description of FIG. 9, and the second optical sheet is bonded thereto, so a regular separated space is formed. This separated space forms the second spacing space 81 having a closed structure in which an air layer is formed. At this time, the shape of a plane of the second spacing space 81 formed by the adhesive layer 56 may be composed in a circular shape as illustrated in the drawing. In addition to this, the shape may be implemented in various shapes such as an elliptical shape, a rectangular shape, a quadrate shape, a polygonal shape and the like.

Figure 11:
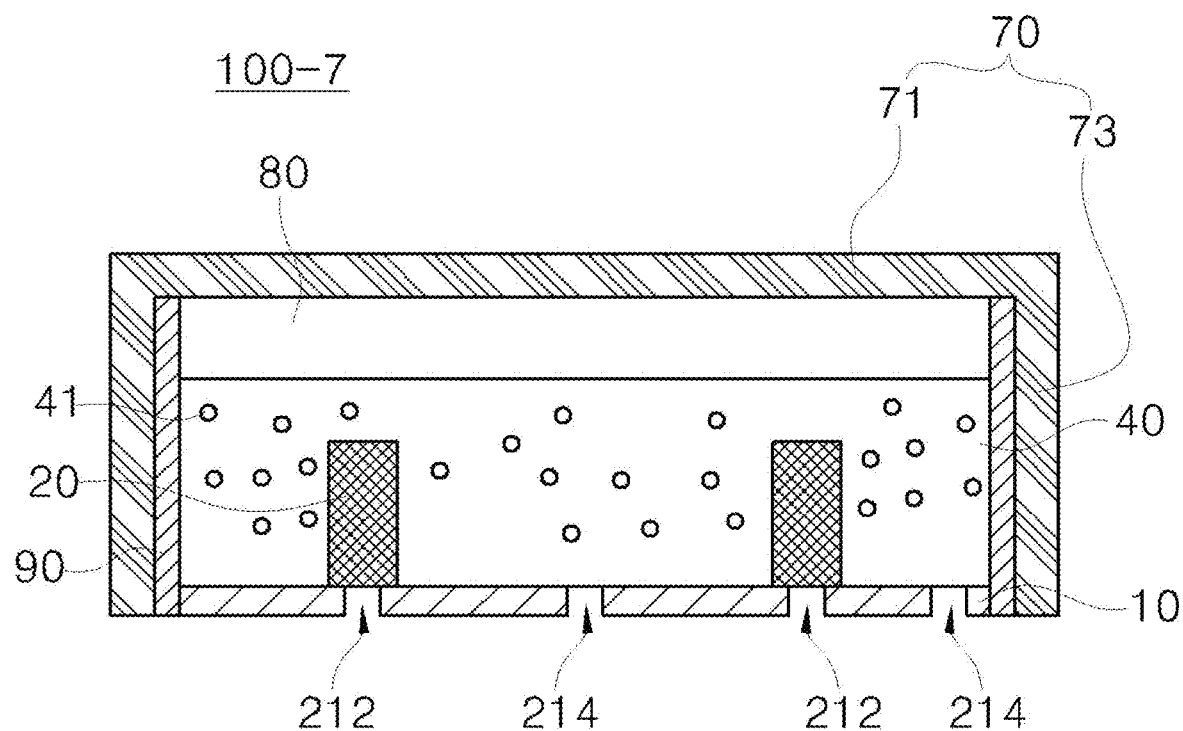
FIG. 11 through FIG. 15 show seventh to eleventh exemplary embodiments of the light source module illustrated in FIG. 1.

FIG. 11 shows a seventh exemplary embodiment 100-7 of the light source module illustrated in FIG. 1. Referring to FIG. 11, the light source module 100-7 may have a structure in which via holes 212, 214 for improving heat dissipation are provided in the flexible printed circuit board 10 of the first exemplary embodiment.

The via holes 212,214 may pass through the flexible printed circuit board 110 and may expose a part of the light source 20 or a part of the resin layer 40. For example, the via holes 212,214 may include a first via hole 212 to which the part of the light source 20 is exposed, and a second via hole 214 to which a part of the lower surface of the resin layer 40 is exposed.

The heat generated from the light source which is a heat source may be directly emitted through the first via hole 212 to the outside. The heat transmitted from the light source 20 to the resin layer 40 may be directly emitted through the second via hole 214 to the outside. The sixth exemplary embodiment may improve the heat dissipation efficiency because the heat generated from the light source 20 is emitted through the via holes 212, 214 to the outside. The first via hole 212 and the second via hole 214 may have various shapes such as a polygonal shape, a circular shape, an elliptical shape and the like.

Also, it would be obvious to those having ordinary skill in the art that the via holes 212, 214 can be also included in the second and third exemplary embodiments, even though this is not illustrated in the drawing.

Figure 12:
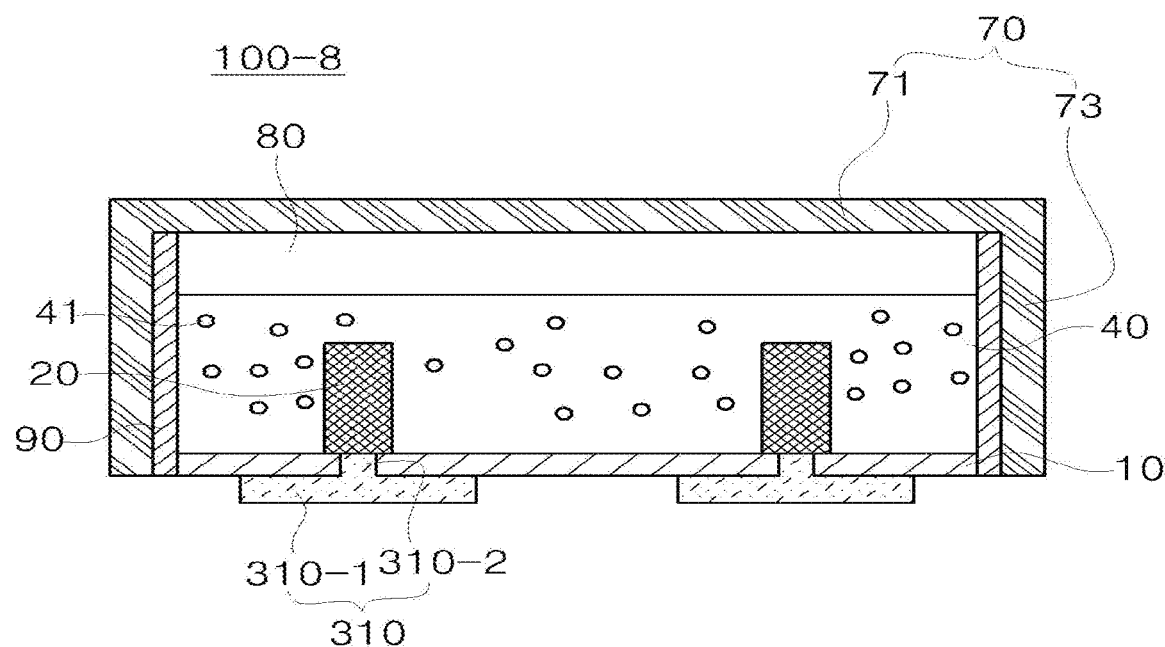

FIG. 12 shows an eighth exemplary embodiment 100-8 of the light source module illustrated in FIG. 1. The same reference numerals as those of FIG. 1 represent the same elements, and the contents overlapping with those stated earlier are omitted or are briefly stated.

Referring to FIG. 12, unlike the heat dissipation member 110 of the fourth exemplary embodiment 100-4, a heat dissipation member 310 of the light source module 100-8 may have a lower heat dissipation layer 310-1 which is disposed on the lower surface of the flexible printed circuit board 10, and a through part 310-1 in which a part of the lower heat dissipation layer 310-1 is in contact with the light source 20 by passing through the flexible printed circuit board 10.

For example, the through part 310-1 may be in contact with a first side surface part 714 of first lead frames 620, 620' of light emitting device packages 200-1, 200-2 which will be described later.

According to the eighth exemplary embodiment, thanks to the through part 310-1, since the heat generated from the light source 20 is directly transmitted to the heat dissipation member 310 and the transmitted light is emitted to the outside, the heat dissipation efficiency can be improved.

Also, it would be obvious to those having ordinary skill in the art that the heat dissipation member 310 can be also included in the aforesaid second and third exemplary embodiments even through this is not illustrated in the drawing.

Figure 13:
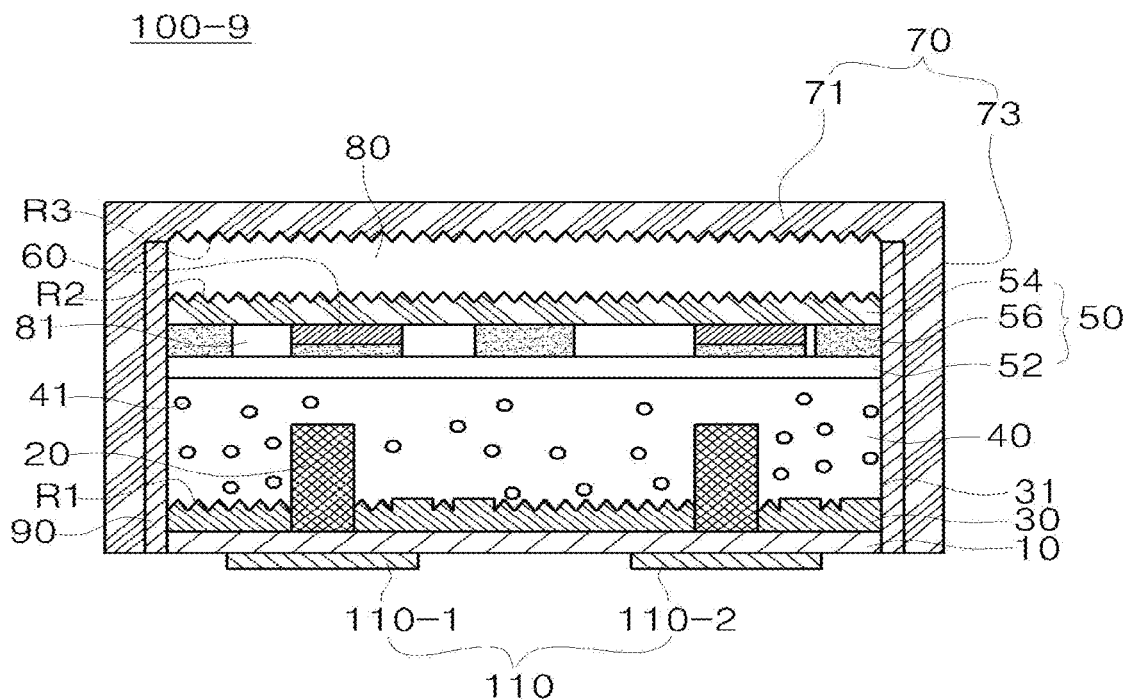
Figure 14:
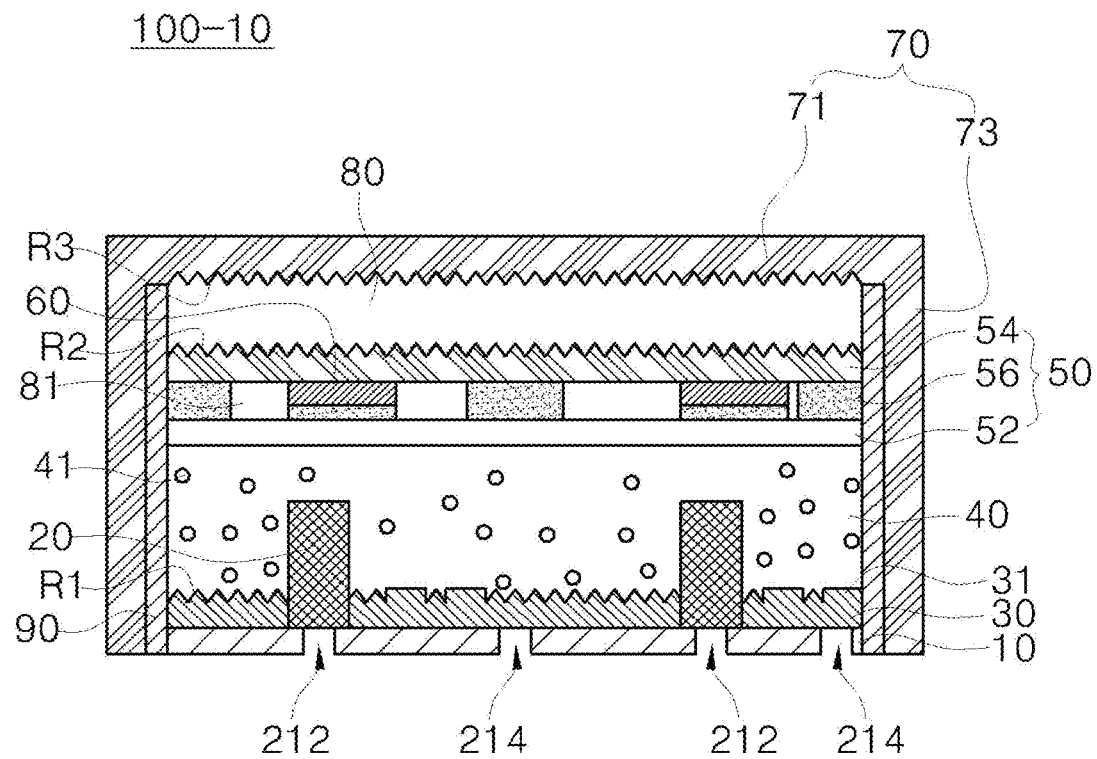
Figure 15:
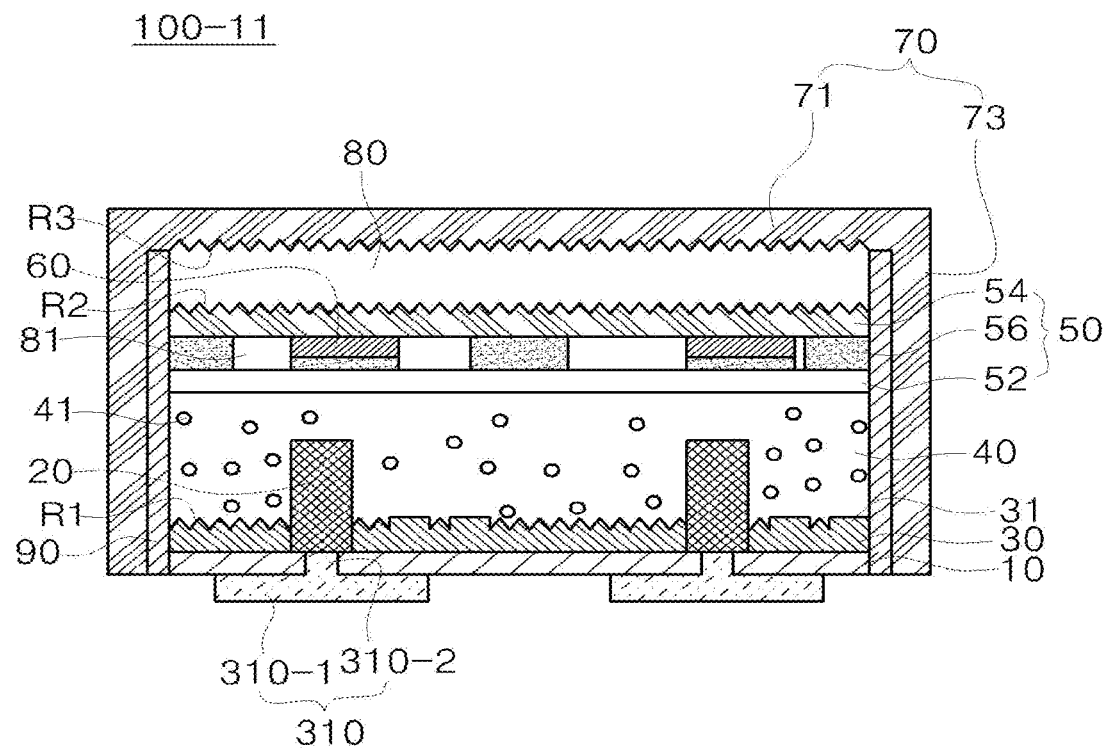

FIG. 13 shows a ninth exemplary embodiment 100-9 of the light source module illustrated in FIG. 1, FIG. 14 shows a tenth exemplary embodiment 100-9 of the light source module illustrated in FIG. 1, and FIG. 15 shows an eleventh exemplary embodiment 100-9 of the light source module illustrated in FIG. 1.

The light source module illustrated in FIG. 13 to FIG. 15 may have a structure in which an additional element is further added to the reflection sheet 30, the second optical sheet 54 and the diffusion plate 70.

More specifically, embossments R1, R2, R3 may be formed on at least one surface or both surfaces of the reflection sheet 30, the second optical sheet 54 and the diffusion plate 70. The embossments R1, R2, R3 reflect and diffuse the incident light, thereby enabling the light emitted to the outside to form a geometrical pattern.

For example, the first embossment R1 may be formed on one surface (e.g. the upper surface) of the reflection sheet 30, the second embossment R2 may be formed on one surface (e.g. the upper surface) of the second optical sheet 54, and the third embossment R3 may be formed on one surface (e.g. the lower surface) of the diffusion plate 70. These embossments R1, R2, 1R3 may be formed in a structure in which a plurality of patterns is regularly or irregularly provided. To improve a light reflection and diffusion effect, the embossments may be composed in a prism shape, a lenticular shape, a concave lens shape, a convex lens shape or a combined shape thereof. However, their shape is not limited to this.

Also, each cross-sectional shape of the embossments R1, R2, R3 may be composed in various structures having various shapes such as a triangular shape, a quadrangular shape, a semi-circular shape, a sinusoidal shape and the like. Furthermore, each pattern size and density may be changed depending on a distance with the light source 20.

The embossments R1, R2, R3 may be formed by directly processing the reflection sheet 30, the second optical sheet 54 and the diffusion plate 70. This is not limited. The embossments R1, R2, R3 may be formed by a method of attaching a film in which regular patterns are formed, a method of directly attaching a lens (e.g. a prism lens and a lenticular lens) and all other methods which have been developed and commercialized or can be implemented depending on future technical development.

In the present exemplary embodiment, a geometrical optical pattern may be easily implemented through a combination of the patterns of the first to third embossments R1, R2, R3. In another exemplary embodiment, the embossments may be formed on one surface or both surfaces of the second optical sheet 54.

However, the exemplary embodiments in which the embossment R1, R2 or R3 is formed are not limited to FIG. 13 to FIG. 15. To improve the light reflection and diffusion effect, the embossment R1, R2 or R3 may be also formed on at least one surface or both surfaces of the reflection sheet 30, the first optical sheet 52, the second optical sheet 54 and the diffusion plate 70 included in the other exemplary embodiments.

Figure 17:
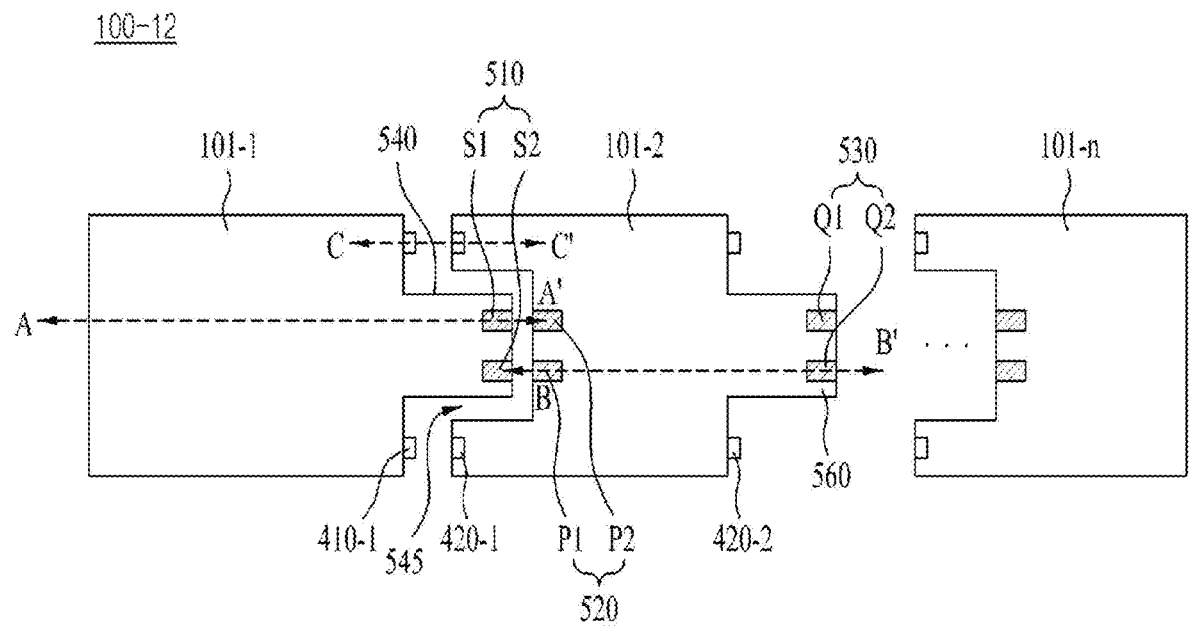
FIG. 17 shows a plane view of a twelfth exemplary embodiment of the light source module illustrated in FIG. 1.
Figure 18:
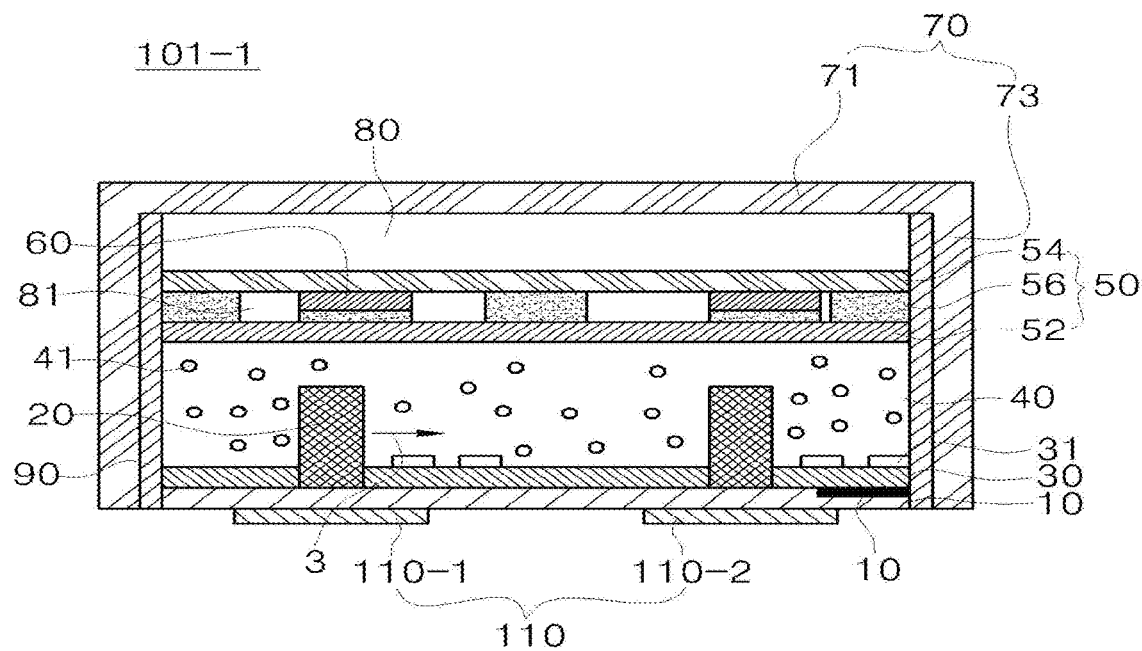
FIG. 18 shows a cross-sectional view taken along AA' of the light source module illustrated in FIG. 17.
Figure 19:
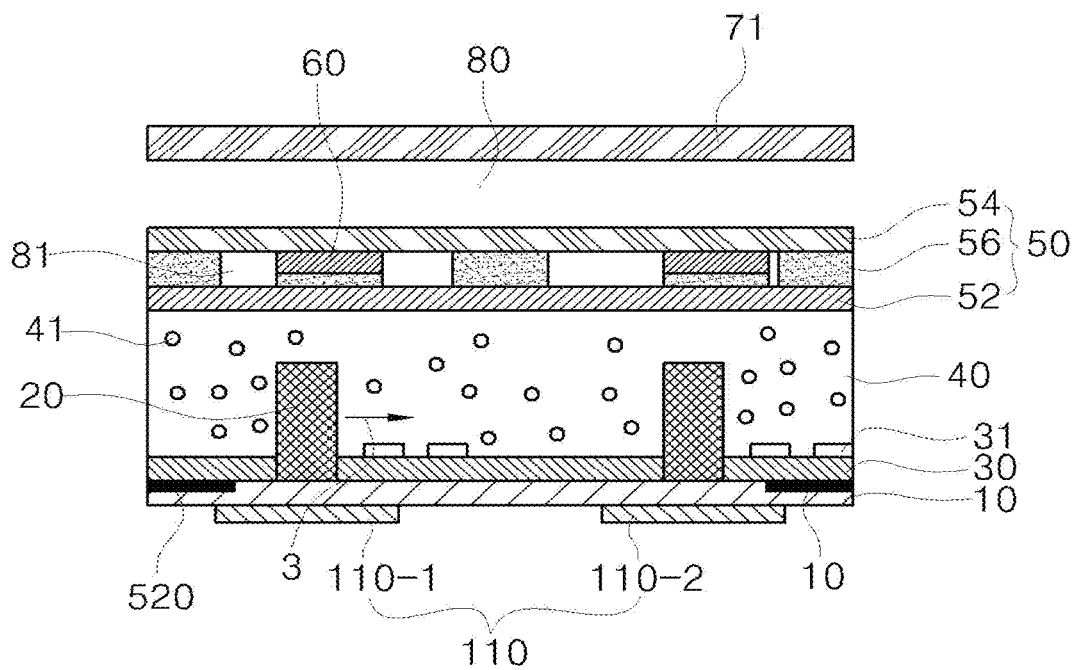
FIG. 19 shows a cross-sectional view taken along BB' of the light source module illustrated in FIG. 17.
Figure 20:
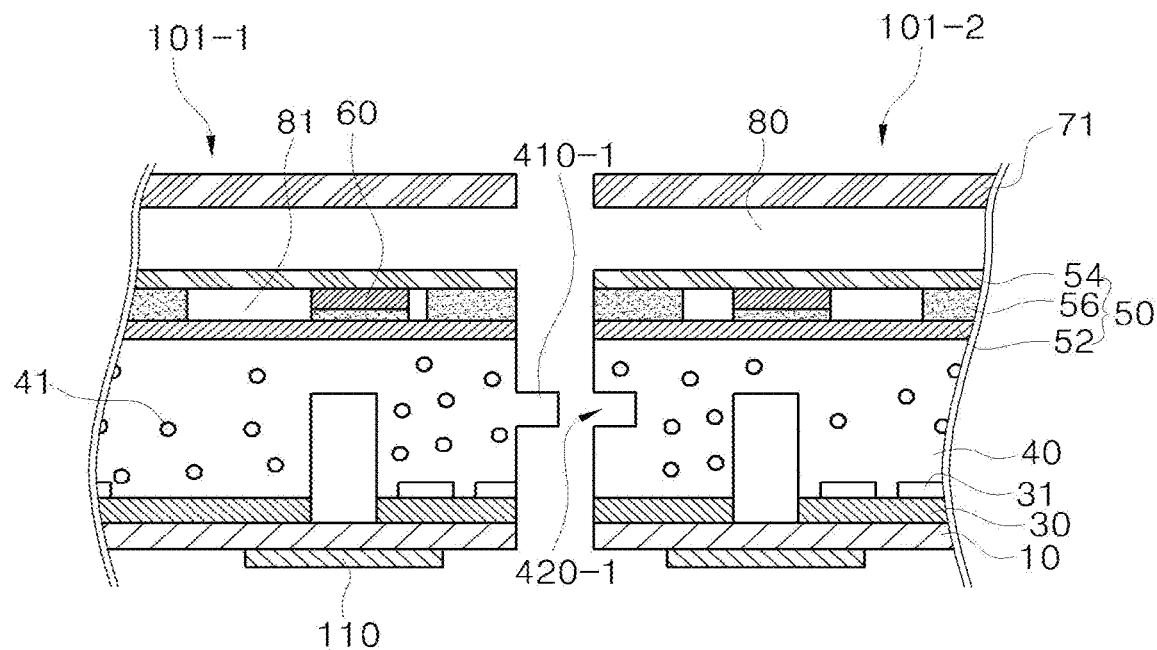
FIG. 20 shows a cross-sectional view taken along CC' of the light source module illustrated in FIG. 17.

FIG. 17 shows a plane view of a twelfth exemplary embodiment 100-12 of the light source module illustrated in FIG. 1, FIG. 18 shows a cross-sectional view taken along AA' of the light source module 100-12 illustrated in FIG. 17, FIG. 19 shows a cross-sectional view taken along BB' of the light source module 100-12 illustrated in FIG. 17, and FIG. 20 shows a cross-sectional view taken along CC' of the light source module 100-12 illustrated in FIG. 17.

Referring to FIG. 17 to FIG. 20, the light source module 100-12 may include a plurality of sub-light source modules 101-1 to 101-$n$ (n represents natural numbers greater than 1, n>1). The plurality of sub-light source modules 101-1 to 101-$n$ may be separated from or connected to each other. Also, the plurality of sub-light source modules 101-1 to 101-$n$ may be electrically connected to each other. At this time, the formation of the diffusion plate 70 and the light reflection member 90 may be performed by combining each sub-light source module 101-1 to 101-$n$ with each other, and thereafter connecting the diffusion plate 70 formed in an inner side of the side wall 73 to the entire combination structure using the light reflection member 90.

Each sub-light source module 101-1 to 101-$n$ includes at least one connector (e.g. 510, 520, 530) which may be connected to the outside. For example the first sub-light source module 101-1 may include the first connector 510 including at least one terminal (e.g. S1, S2). The second sub-light source 101-2 may include the first connector 520 and the second connector 530 which are connected to the outside, respectively. The first connector 520 may include at least one terminal (e.g. P1, P2), and the second connector 530 may include at least one terminal (e.g. Q1, Q2). At this time, the first terminal (S1, P1, Q1) may be a positive (+) terminal, and the second terminal (S2, P2, Q2) may be a negative (−) terminal. FIG. 19 illustrates that each connector (e.g. 510, 520, 530) includes two terminals. However, the number of terminals is not limited to this.

FIG. 18 through FIG. 20 illustrate a structure in which the connector 510, 520 or 530 is added to the sixth exemplary embodiment 100-6. However, the structure is not limited to this. The respective sub-light source modules 101-1 to 101-$n$ may have a structure in which the connector 510, 520 or 530 and a connection fixing unit (e.g. 410-1, 420-1, 420-2) are added to the light source module according to any one of the aforesaid exemplary embodiments.

Referring to FIG. 18 and FIG. 19, the respective sub-light source modules 101-1 to 101-$n$ include: the flexible printed circuit board 10; the light source 20; the reflection sheet 30; the reflection pattern 31; the resin layer 40; the first optical sheet 52; the second optical sheet 54; the adhesive layer 56; the optical pattern 60; the heat dissipation member 110; at least one connector 510, 520 or 530; and at least one connection fixing unit 410, 420. The same reference numerals as those of FIG. 1 represent the same elements, and the contents overlapping with those stated earlier are omitted or are briefly stated. Comparing the present exemplary embodiment with other exemplary embodiments, the respective sub-light source modules 101-1 to 101-n of the twelfth exemplary embodiment may have a difference with respect to each size or each number of light sources, but except for the connector and the connection fixing unit, the structure thereof may be identical to each structure of other exemplary embodiments.

The first sub-light source module 101-1 may be electrically connected to the light source 20 and may include a first connector 510 provided to the flexible printed circuit board 10 so as to be electrically connected to the outside. For example, the first connector 510 may be implemented in a type which is patterned on the flexible printed circuit board 10.

Also, the second sub-light source module 101-2 may include the first connector 520 and the second connector 530 which are electrically connected to the light source 20. The first connector 520 may be provided at one side of the flexible printed circuit board 10 to be electrically connected to the first connector 510 of the outside (e.g. the first sub-light source module 101-1). The second connector 530 may be provided at another side of the flexible printed circuit board 10 to be electrically connected to the connector (not drawn) of another outside (e.g. the third sub-light source module 101-3).

Connection fixing units (e.g. 410-1, 420-1, 420-2) are connected to other sub-light source modules of the outside and function to fix two connected sub-light source modules to each other. The connection fixing units 410-1, 420-1, 420-2 may be a protrusion part (p) having a type in which a part of the side surface of the resin layer 40 protrudes, or a groove part having a type in which a part of the side surface of the resin layer 40 is recessed.

Referring to FIG. 20, the first sub-light source module 101-1 may include a first connection fixing unit 410-1 having a structure in which a part of the side surface of the resin layer 40 protrudes. Also, the second sub-light source module 101-2 may include the first connection fixing unit 420-1 having a structure in which a part of the side surface of the resin layer 40 is recessed.

The first connection fixing unit 410-1 of the first sub-light source module 101-1 and the first connection fixing unit 420-1 of the second sub-light source module 101-2 may be connected and fixed to each other.

The present exemplary embodiment illustrates that the connection fixing unit (e.g. 410-1, 420-1) is implemented in a part of the resin layer 40. However, the exemplary embodiment is not limited to this. A separate connection fixing unit may be provided, and the connection fixing unit may be changed in connectable other types.

The sub-light source modules 101-1 to 101-n (n represents natural numbers greater than 1, n>1) may have a shape in which a fixed part protrudes. However, the shape is not limited to this. The sub-light source modules may be implemented in various shapes. For example, when looking down the sub-light source modules 101-1 to 101-n (n represents natural numbers greater than l>1) from the above, the shape thereof may be a circular shape, an elliptical shape a polygonal shape, and a shape in which a part protrudes in a side direction.

For example, one end of the first sub-light source module 101-1 may include a protrusion part 540 in a center thereof. The first connector 510 may be provided to the flexible printed circuit board 10 corresponding to the protrusion part 540. The first connection fixing unit 410-1 may be provided to the resin layer 40 of a remaining part of the one end of the first sub-light source module 101-1 except for the protrusion part 540.

Also, one end of the second sub-light source module 101-2 may have a groove part 545 in a center thereof, the second connector 520 may be provided in the flexible printed circuit board 10 corresponding to the groove part 545, and the first connection fixing unit 420-1 may be provided to the resin layer 40 of the remaining part of one end of the second sub-light source 101-2 except for the groove part 545. Furthermore, another end of the second sub-light source module 101-2 may include a protrusion part 560 in its center, the third connector 530 may be provided in the flexible printed circuit board 10 corresponding to the protrusion part 560, and the second connection fixing unit 420-2 may be provided to the resin layer 40 of the remaining part of one end of the second sub-light source 101-2 except for the protrusion part 560.

Each of the sub-light source modules 101-1 to 101-n may be an independent light source, and a shape thereof may be variously changed. Since two or more sub-light source modules may be assembled to each other by the connection fixing unit, and thus may be used as the independent light source, the present exemplary embodiment can improve a degree of freedom in product design. Also, in the present exemplary embodiment, in a case where some parts of the assembled sub-light source modules are damaged or broken, only the damaged sub-light source module may be exchanged and used.

The aforesaid light source module may be used in a display device, an indicating device and a lighting system which require a surface light source. In particular, it is advantageous that the light source module according to some exemplary embodiment may be easily mounted in a place (e.g. a ceiling or a bottom having a bend) in which illumination is required, but installation of the illumination cannot be easily performed because a part for mounting the illumination has a bend. For example, the lighting system may include a lamp or a streetlamp. The lamp may be a head lamp for a vehicle. However, the lamp is not limited to this.

Figure 21:
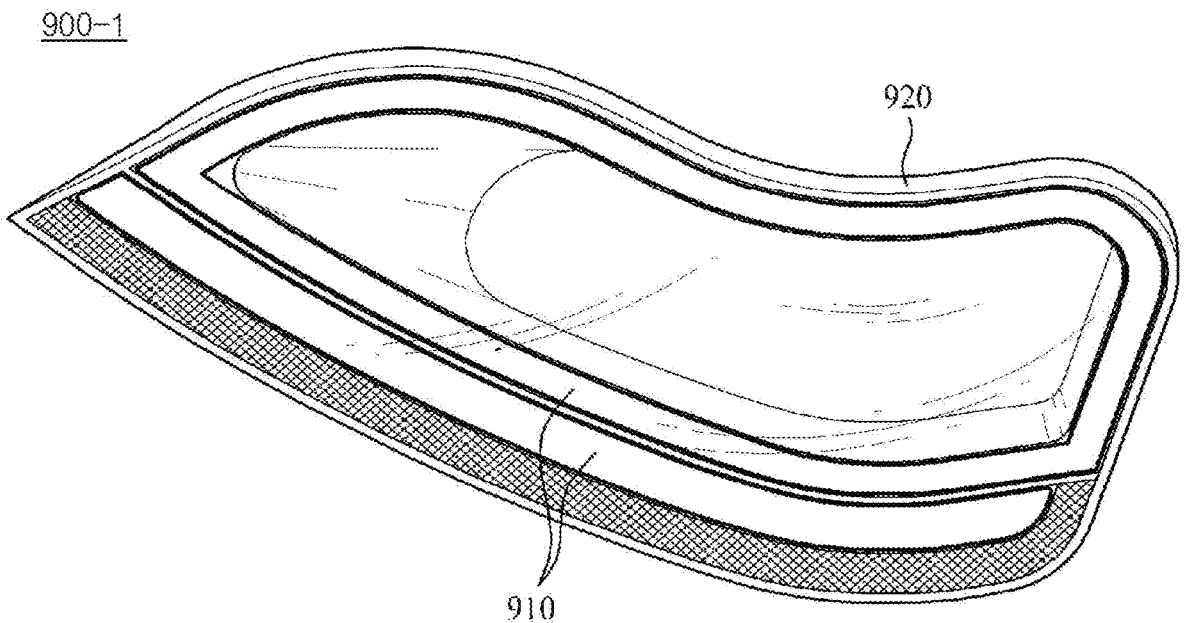
FIG. 21 shows a head lamp for a vehicle according to an exemplary embodiment of the present invention.
Figure 43:
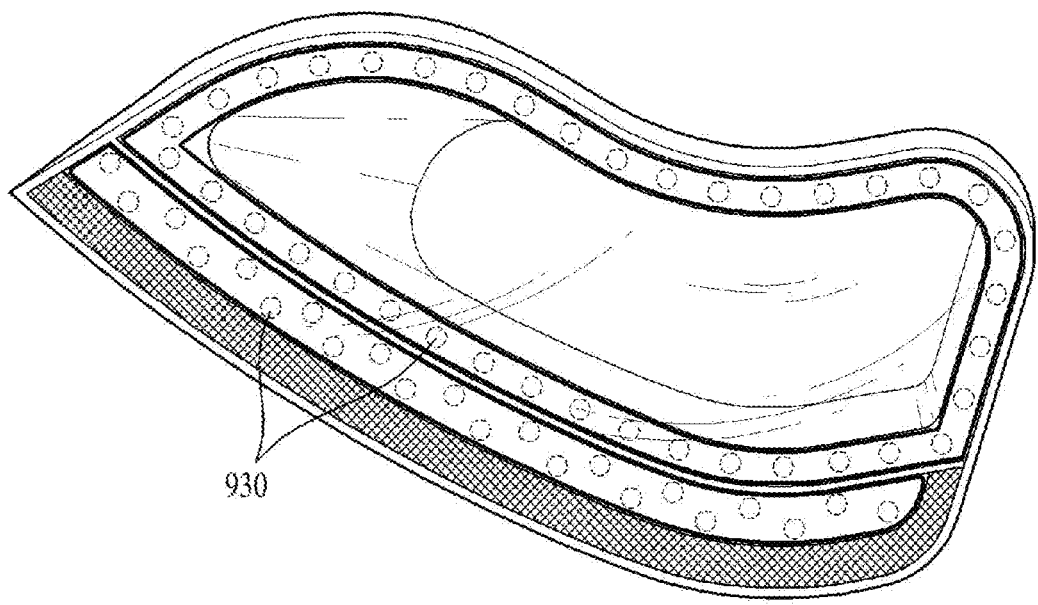
FIG. 43 shows a general head lamp for a vehicle, which is a point light source.

FIG. 21 shows a head lamp for a vehicle 900-1 according to an exemplary embodiment, and FIG. 43 shows a general head lamp for a vehicle, which a point light source. Referring to FIG. 21, the head lamp for the vehicle 900-1 includes a light source module 910 and a light housing 920.

The light source module 910 may be shown in the aforesaid exemplary embodiments 100-1 to 100-12. The light housing 920 may receive the light source module 910 and may be composed of a transparent material. The light housing 920 for a vehicle may include a bend depending on a portion and design of the vehicle which is mounted. Meanwhile, as described above, the diffusion plate itself may perform a function of the light housing 920 for the vehicle. In addition to the diffusion plate, the separate light housing 920 for the vehicle may be provided, which is the same as previously described. The light source module 910 itself has flexibility because it uses the flexible printed circuit board 10 and the resin layer 40, so the light source module 910 may be easily mounted to the light housing for the vehicle 920 having the bend. Also, since the light source modules 100-1 to 100-12 has a structure in which heat dissipation efficiency is improved, the head lamp for the vehicle 900-1 according to the present exemplary embodiment may inhibit the generation of wavelength shift and the reduction of luminous intensity. Also, as described above, the separate light reflection member is formed on the side surface of the resin layer, so light loss can be reduced and the improvement of brightness compared to same electric power can be implemented.

Since the general head lamp for the vehicle as illustrated in FIG. 43 is a point light source, when it emits light, a spot 930 may be partially generated from a light emitting surface. However, since the head lamp for the vehicle 900-1 according the present exemplary embodiment is a surface light source, the spot cannot be generated and uniform brightness and roughness can be implemented all over the light emitting surface.

Figure 22:
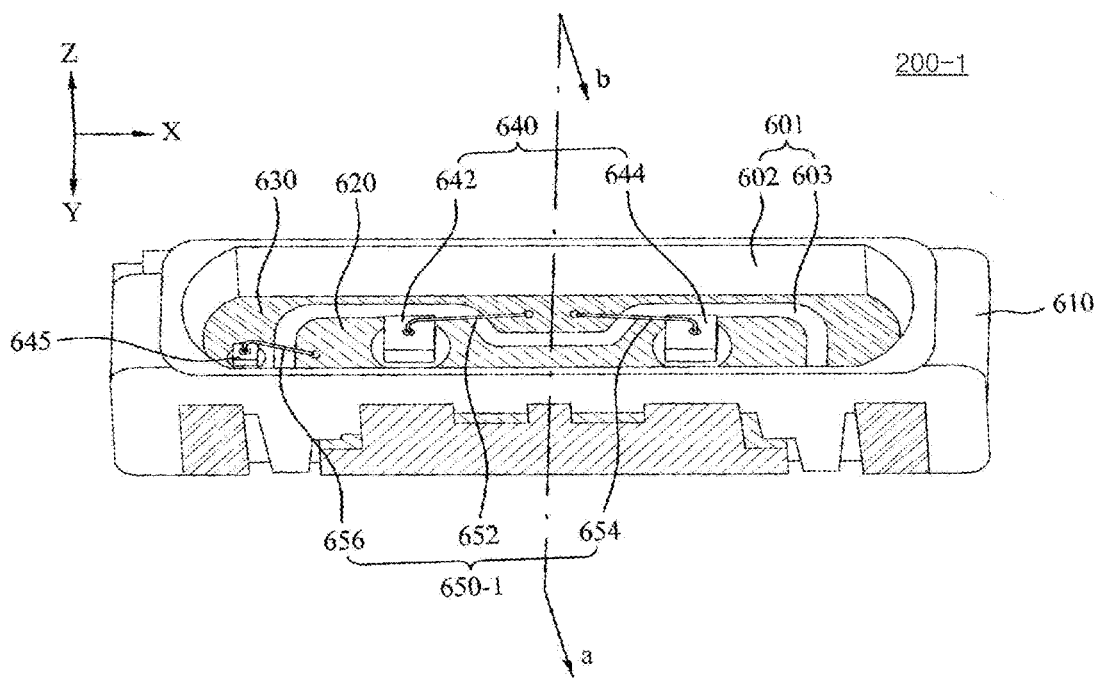
FIG. 22 shows a perspective view of a light emitting device package according to one exemplary embodiment of the present invention.
Figure 23:
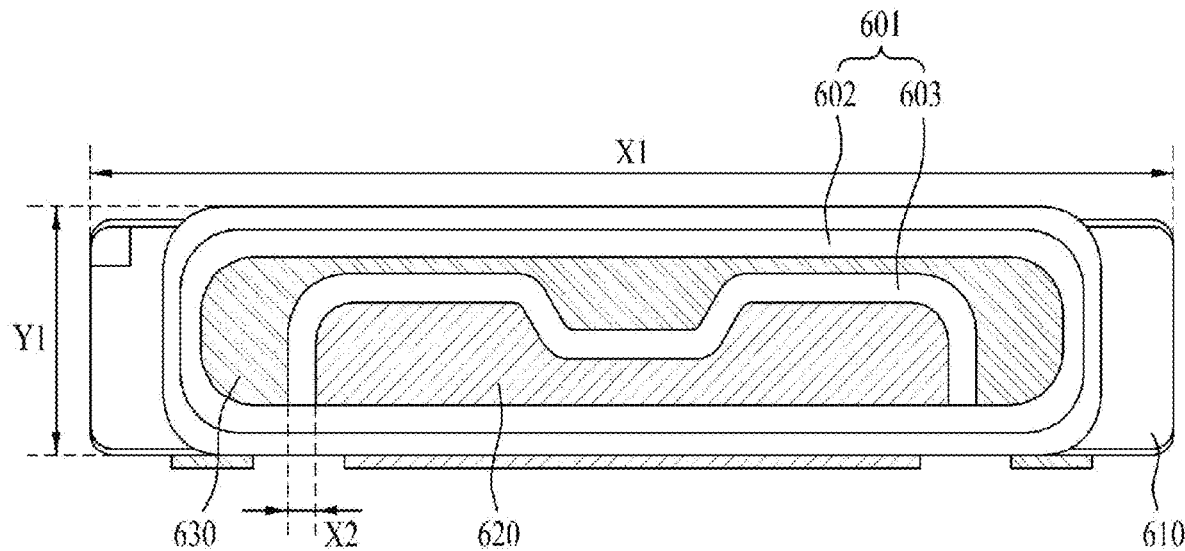
FIG. 23 shows an upper view of the light emitting device package according to the one exemplary embodiment of the present invention.
Figure 24:
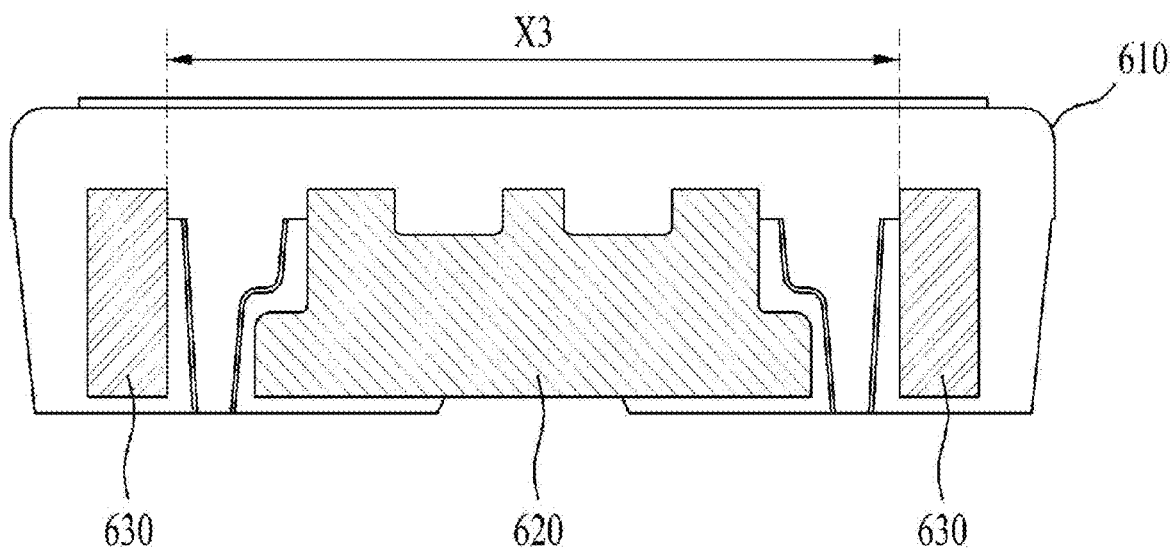
FIG. 24 shows a front view of the light emitting device package according to the one exemplary embodiment of the present invention.
Figure 25:
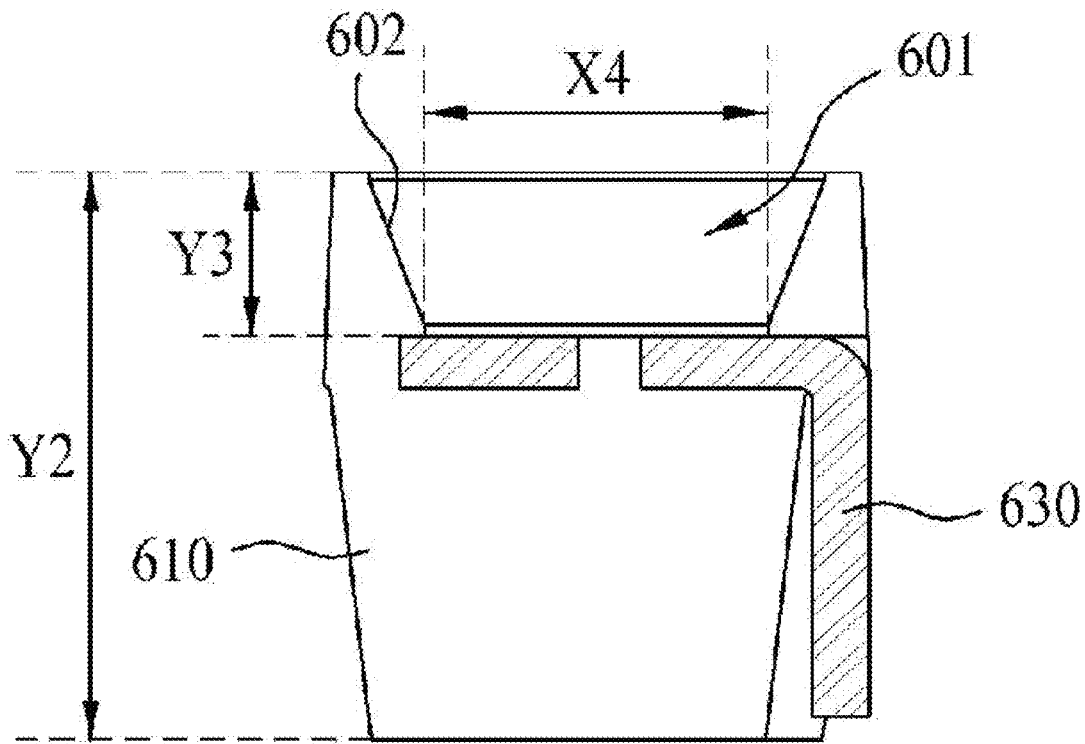
FIG. 25 shows a side view of the light emitting device package according to the one exemplary embodiment of the present invention.

FIG. 22 shows a perspective view of the light emitting device package 200-1 according to the first exemplary embodiment, FIG. 23 shows an upper view of the light emitting device package 200-1 according to the first exemplary embodiment, FIG. 24 shows a front view of the light emitting device package 200-1 according to the first exemplary embodiment, and FIG. 25 shows a side view of the light emitting device package 200-1 according to the first exemplary embodiment.

The light emitting device package 200-1 illustrated in FIG. 22 may be a light emitting device package included in the light source module according to the aforesaid exemplary embodiments. However, the light emitting device package is not limited to this.

Referring to FIG. 22 to FIG. 25, the light emitting device package 200-1 includes a package body 610, a first lead frame 620, a second lead frame 630, a light emitting chip 640, a zener diode 645 and a wire 650-1.

The package body 610 may be formed of a substrate having a good insulating property or heat conductivity such as a wafer level package based on silicon, a silicon substrate, a silicon carbide (SiC), aluminum nitride (AlN) and the like and may have a structure in which a plurality of substrates is laminated. However, the present exemplary embodiment is not limited to the aforesaid material, structure and shape of the body.

For example, a length (X1) of a first direction (e.g. an X-axis direction) of the package body 610 may be 5.95 mm to 6.05 mm, and a length (Y1) of a second direction (e.g. a Y-axis direction) may be 1.35 mm to 1.45 mm. A length (Y2) of a third direction (e.g. a Z-axis direction) of the package body 610 may be 1.6 mm to 1.7 mm. For example, the first direction may be a parallel direction to a long side of the package body 610.

The package body 610 may have a cavity 601, an upper part of which is open, and which is composed of a side wall 602 and a bottom 603. The cavity 601 may be formed in a cup shape, a concave container shape and the like. The side wall 602 of the cavity 601 may be vertical or slanted to the bottom 603. When looking down the cavity 601 from the above, a shape thereof may be a circular shape, an elliptical shape, a semi-circular shape and a polygonal shape (e.g. a quadrilateral shape). A corner part of the cavity 601 which is a polygonal shape may be a curved line. For example, a length (X3) of the first direction (e.g. the X-axis direction) of the cavity 601 may be 4.15 mm to 4.25 mm, a length (X4) of the second direction (e.g. the Y-axis direction) may be 0.64 mm to 0.9 mm, and a depth (Y3, the length of the Z-axis direction) of the cavity 601 may be 0.33 mm to 0.53 mm.

In consideration of heat dissipation or mounting of the light emitting chip 640, the first lead frame 620 and the second lead frame 630 may be disposed on a surface of the package body 610 to be electrically separated from each other. The light emitting chip 640 may be electrically connected to the first lead frame 620 and the second lead frame 630. The number of the light emitting chip 640 may be one or more.

The reflection member (not drawn) for reflecting light emitted from the light emitting chip 640 to be toward a predetermined direction may be provided to a side wall of the cavity of the package body 610.

The first lead frame 620 and the second lead frame 630 may be disposed in an upper surface of the package body 610 to be spaced apart from each other. A part (e.g. the bottom 603 of the cavity 601) of the package body 610 may be located between the first lead frame 620 and the second lead frame 630 so that the first lead frame and the second lead frame may be electrically separated from each other.

The first lead frame 620 may include on one end (e.g. 712) exposed to the cavity 601, and another end (e.g. 714) exposed to one surface of the package body 610 by passing through the package body 610. Also, the second lead frame 630 may include on one end (e.g. 744-1) exposed to one side of the one surface of the package body 610, another end (e.g. 744-2) exposed to another side of the one surface of the package body 610, and a middle part (e.g. 742-2) exposed to the cavity 601.

A separation distance (X2) between the first lead frame 620 and the second lead frame 630 may be 0.1 mm to 0.2 mm. The upper surface of the first lead frame 620 and the upper surface of the second lead frame 630 may be located on the same plane as the bottom 603 of the cavity 601.

Figure 26:
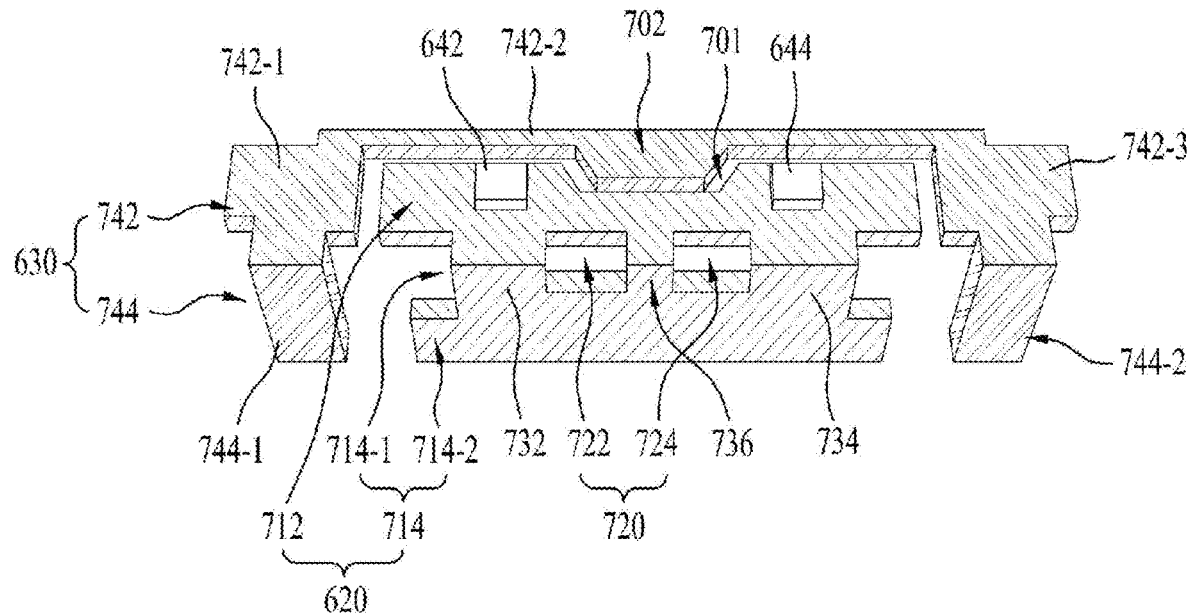
FIG. 26 shows a perspective view of a first lead frame and a second lead frame illustrated in FIG. 22.
Figure 27:
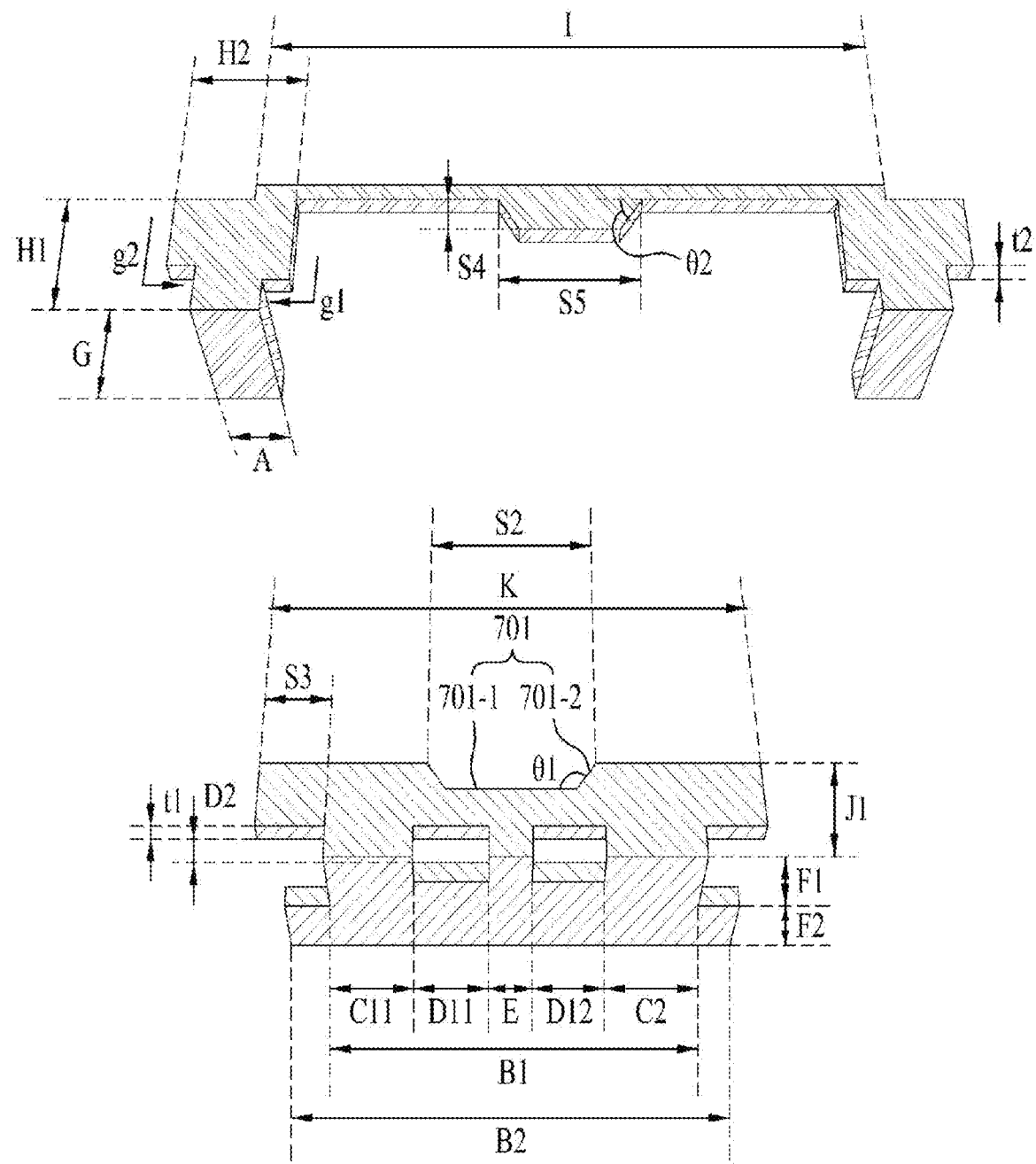
FIG. 27 is a view for explaining a dimension of each part of the first lead frame and the second lead frame illustrated in FIG. 26.
Figure 28:
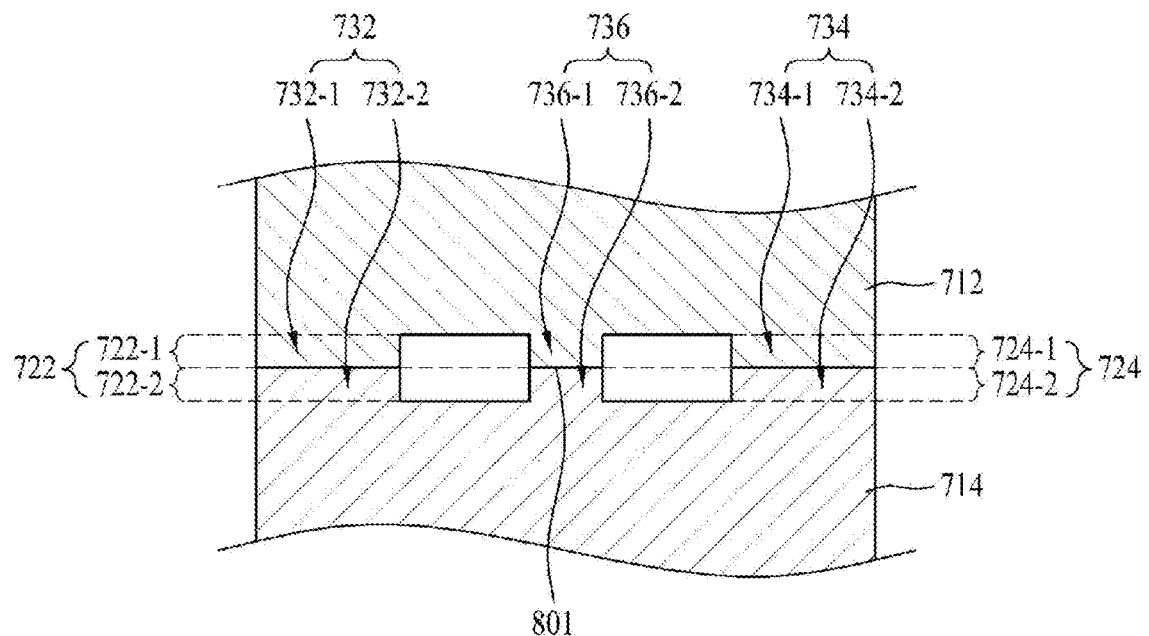
FIG. 28 shows an enlarged view of connection parts illustrated in FIG. 27.

FIG. 26 shows a perspective view of the first lead frame 620 and the second lead frame 630 illustrated in FIG. 22, FIG. 27 is a view for explaining a size of each part of the first lead frame 620 and the second lead frame illustrated in FIG. 26, and FIG. 28 is an enlarged view of connection parts 732, 734, 736 of the first lead frame 620 which is adjacent to a boundary part 801 between a first side surface part 714, and a first upper surface part 712 illustrated in FIG. 27.

Referring to FIG. 26 to FIG. 28, the first lead frame 620 includes the first upper surface part 712, and the first side surface part 714 which is bent from the first side surface part of the first upper surface part 712.

The first upper surface part 712 may be located on a same plane as the bottom of the cavity 601, may be exposed by the cavity, and may dispose light emitting chips 642, 644.

As illustrated in FIG. 27, both ends of the first upper surface part 712 may have a part (S3) which protrudes in the first direction (the X-axis direction) based on the first side surface part 714. The protruding part (S3) of the first upper surface part 712 may be a part which supports the first lead frame in a lead frame array. A length of a first direction of the protruding part (S3) of the first upper surface part 712 may be 0.4 mm to 0.5 mm. A length (K) of a first direction of the first upper surface part 712 may be 3.45 mm to 3.55 mm, and a length (J1) of a second direction may be 0.6 mm to 0.7 mm. In an xyz coordinate system, the first direction may be the X-axis direction, and the second direction may be the Y-axis direction.

A second side portion of the first upper surface part 712 may have at least one groove part 701. At this time, the second side portion of the first upper surface part 712 may be opposite to a first side portion of the first upper surface part 712. For example, the second side portion of the first upper surface part 712 may have one groove part 701 in its middle. However, the present invention is not limited to this. The number of the groove part formed in the second side portion may be two or more. The groove part 701 may have a shape corresponding to a protrusion part 702 provided to the second lead frame 630 which will be described later.

The groove part 701 illustrated in FIG. 27 may have a trapezoidal shape. However, the shape is not limited to this. The groove part 701 may be implemented in various shapes such as a circular shape, a polygonal shape, an elliptical shape and the like. A length (S2) of a first direction of the groove part 701 may be 1.15 mm to 1.25 mm, and a length (S1) of a second direction of the groove part 701 may be 0.4 mm to 0.5 mm.

Also, an angle (01) between a bottom 701-1 and a side surface 701-2 of the groove part 701 may be larger than or equal to 90° and may be smaller than 180°. The light emitting chips 642, 644 may be disposed on the first upper surface part 712 of both sides of the groove part 701.

The first side surface part 714 may be bent in a predetermined angle from the first side portion of the first upper surface part 712 to a lower direction. The first side surface part 714 may be exposed from one side surface of the package body 610. For example, the angle between the first upper surface part 712 and the first side surface part 714 may be larger than or equal to 90° and may be smaller than 180°.

The first lead frame 620 may have at least one or more through holes 720 in at least one of the first upper surface part 712 and the first side surface part 714. For example, the first lead frame 620 may have one or more through holes 720 to be adjacent to a boundary part between the first upper surface part 712 and the first side surface part 714. FIG. 24 illustrates two through holes 722, 724 which are spaced apart from each other to be adjacent to the boundary part between the first upper surface part 712 and the first side surface part 714. However, the present exemplary embodiment is not limited to this.

One or more through holes 720 may be formed in each one region of the first upper surface part 712 and the first side surface part 714 which are adjacent to the boundary portion between the first upper surface part 712 and the first side surface part 714. At this time, a through hole (e.g. 722-1) formed in the one region of the first upper surface part 712 and a through hole (e.g. 722-2) formed in the one region of the first side surface part 714 may be connected to each other.

A part of the package body 610 is filled in the through hole 720, thereby enabling the degree of coupling of the first lead frame 620 and the package body to be improved. Also, the through hole 720 may function to easily form the bending between the first upper surface part 712 and the first side surface part 714. However, when a size of the through hole 720 is too large, or the number of through holes is too much, the first upper surface part 712 and the first side surface part 714 may be disconnected at the time of bending the first lead frame 620. Thus, the size and the number of the through hole 720 should be appropriately adjusted. Also, since the size of the through hole 720 has relevance to each size of the connection parts 732, 734, 736 which will be stated later, it also has relevance to heat dissipation of heat of the light emitting device package.

The exemplary embodiments according to each size of the first lead frame 620 and the second lead frame 630 having through holes, which will be hereinafter stated, may have optimal heat dissipation efficiency in consideration of the degree of coupling and the easiness of bending.

In order to improve the degree of coupling with the package body 610, and to inhibit damage from being generated upon the bending while easily performing the bending of the first lead frame 620, the present exemplary embodiment may have a first through hole 722 and a second through hole 724. A length (D11) of a first direction of the first through hole 722, and a length (D12) of a first direction of the second through hole 724 (D12) may be 0.58 mm to 0.68 mm, and a length (D2) of a second direction may be 0.19 mm to 0.29 mm. An area of the first through hole 722 may be identical to that of the second through hole 724. However, the area is not limited to this. Their areas may be different from each other.

Referring to FIG. 28, the first lead frame 620 may be located to be adjacent to the boundary portion 801 between the first upper surface part 712 and the first side surface part 714, and may have the connection parts 732, 734, 736 which are spaced apart from each other by the through hole 720 and which connect the first upper surface part 712 and the first side surface part 714 to each other. For example, the respective connection parts 732, 734, 736 may be composed of a first portion 732-1, 734-1 or 736-1 corresponding to a part of the first upper surface part 712, and a second portion 732-2, 734-2 or 736-2 corresponding to a part of the first side surface part 714. The through hole 720 may be located among the respective connection parts 732, 734, 736.

The first lead frame 620 may have at least one connection part which is located to correspond to or to be aligned in the light emitting chip 642 or 644.

Specifically, the first lead frame 620 may include the first to third connection parts 732, 734, 736. The first connection part 732 may be located to correspond to or to be aligned in the first light emitting chip 642, and the second connection part 734 may be located to correspond to or to be aligned in the second light emitting chip 644. Furthermore, the third connection part 736 may be located between the first connection part 732 and the second connection part 734 and may be a part which is not aligned in the first light emitting chip 642 or the second light emitting chip 644. For example, the third connection part 736 may be located to correspond to or to be aligned in the groove part 701 of the first lead frame 620. However, the present invention is not limited to this.

A length (C11) of a first direction of the first connection part 731 and a length (C2) of a first direction of the second connection part 734 may be larger than a length (E) of a first direction of the third connection part 736. For example, the length (C11) of the first direction of the first connection part 731 and the length (C2) of the first direction of the second connection part 734 may be 0.45 mm to 0.55 mm, and the length (E) of the first direction of the third connection part 736 may be 0.3 mm to 0.4 mm. The reason why the third connection part 736 is located between the first through hole 722 and the second through hole 724 is to inhibit disconnection between the first upper surface part 712 and the first side surface part 714 at the time of bending.

A ratio of the length (E) of the first direction of the third connection part 736 to the length (C11) of the first direction of the first connection part 731 may be 1 to 1.2~1.8. The ratio of a length (D11 or D12) of a first direction of the through hole 722 to a length (B11) of a first direction of an upper end portion 714-1 of the first side surface part 714 may be 1 to 3.8~6.3.

Since the first connection part 732 is aligned in a first light emitting chip 642, and the second connection part 734 is aligned in a second light emitting chip 644, heat generated from the first light emitting chip 642 may be mainly emitted through the first connection part 732 to the outside, and heat generated from the second light emitting chip 644 may be mainly emitted through the second connection part 734 to the outside.

In the present exemplary embodiment, since each length (C11, C2) of the first directions of the first connection part 732 and the second connection part 734 is larger than the length (E) of the first direction of the third connection part 736, each area of the first connection part 732 and the second connection part 734 is larger than an area of the third connection part 736. Accordingly, in the present exemplary embodiment, efficiency for emitting the heat generated from the first light emitting chip 642 and the second light emitting chip 644 to the outside can be improved by increasing each area of the connection parts 732, 734 disposed to be adjacent to the light source 20.

The first side surface part 714 may be divided into the upper end portion 714-1 connected to the first upper surface part 712, and a lower end portion 714-2 connected to the upper end portion 714-1. That is, the upper end portion 714-1 may include each one part of the first to third connection parts 732, 734, 736, and the lower end portion 714-2 may be located below the upper end portion 714-1.

A length (F1) of a third direction of the upper end part (714-1) may be 0.6 mm to 0.7 mm, and a length (F2) of a third direction of the lower end part (714-2) may be 0.4 mm to 0.5 mm. The third direction may be the Z-axis direction in the xyz coordinate system.

To improve the degree of coupling with the package body 620 and airtightness for inhibiting the penetration of water, a side of the upper end portion 714-1 and a side of the lower end portion 714-2 may have a step pulley. For example, both side ends of the lower end portion 714-2 may have a shape which protrudes to a side direction based on the side surface of the upper end portion 714-1. A length (B1) of a first direction of the upper end portion 714-1 may be 2.56 mm to 2.66 mm, and a length (B2) of a first direction of the lower end portion 714-2 may be 2.7 mm to 3.7 mm. A thickness (t1) of the first lead frame 620 may be 0.1 mm to 0.2 mm.

The second lead frame 630 may be disposed to surround around any one side portion of the first lead frame 620. For example, the second lead frame 630 may be disposed around remaining side portions except for the first side surface part 714 of the first lead frame 630.

The second lead frame 630 may include a second upper surface part 742 and a second side surface part 744. The second upper surface part 742 may be disposed to surround around the remaining side portions except for the first side portion of the first upper surface part 712. As illustrated in FIG. 24 and FIG. 28, the second upper surface part 742 may be located on the same plane as the bottom of the cavity 601 and the first upper surface part 712, and may be exposed by the cavity 601. A thickness (t2) of the second lead frame 630 may be 0.1 mm to 0.2 mm.

The second upper surface part 742 may be divided into a first part 742-1, a second part 742-2 and a third part 742-3 depending on a location which surrounds around the first upper surface part 712. The second part 742-2 of the second upper surface part 742 may be a part corresponding to or facing the second side portion of the first upper surface part 712. The first part 742-1 of the second upper surface part 742 may be connected to one end of the second part 742-2 and may correspond to or face any one of the remaining side portions of the first upper surface part 712. The third part 742-3 of the second upper surface part 742 may be connected to another end of the second part 742-2 and may correspond to or face any another one of the remaining side portions of the first upper surface part 712.

A length (H1) of a second direction of the first part 742-1 and the third part 742-3 may be 0.65 mm to 0.75 mm, and a length (H2) of a first direction may be 0.78 mm to 0.88 mm. A length (I) of a first direction of the second part 742-2 may be 4.8 mm to 4.9 mm.

The second part 742-2 of the second upper surface part 742 may have the protrusion part 702 corresponding to the groove part 701 of the upper surface part 742-2. For example, a shape of the protrusion part 702 may be consistent with that of the groove part 701. The protrusion part 702 may be located to be aligned in the groove part 701. Also, the protrusion part 702 may be located in the groove part 701. The number of the protrusion part 702 may be identical to that of the groove part 701. The protrusion part 702 and the groove part 701 may be spaced apart from each other. A part of the package body 610 may be located therebetween. The protrusion part 702 is an area for wire-bonding of the first light emitting chip 642 and the second light emitting chip 644 and is located to be aligned between the first light emitting chip 642 and the second light emitting chip 644, thereby enabling the wire-bonding to be easily performed.

A length (S5) of a first direction of the protrusion part 702 may range from 0.85 mm to 0.95 mm, and a length (S4) of a second direction may range from 0.3 mm to 0.4 mm. An angle (θ2) between the protrusion part 702 and the second part (742-2) may be more than or equal to 90°, and may be smaller than 180°.

The second side surface part 744 may be bent from at least one side portion of the second upper surface part 742. The second side surface part 744 may be bent in a predetermined angle (e.g. 90°) from the second upper surface part 742 to a lower direction.

For example, the second side surface part 744 may include the first portion 744-1 which is bent from one side portion of the first portion 742-1 of the second upper surface part 742, and a second portion 744-2 which is bent from one side portion of the third portion 742-3 of the second upper surface part 742.

The first portion 744-1 and the second portion 744-2 of the second side surface part 744 may be bent to be located in the same side surface in the second lead frame 630. The first portion 744-1 of the second side surface part 744 may be spaced apart from the first side surface part 714 and may be located at one side (e.g. a left side) of the first side surface part 714. The second portion 744-2 of the second side surface part 744 may be spaced apart from the first side surface part 714 and may be located at another side (e.g. a right side) of the first side surface part 714. The first side surface part 714 and the second side surface part 744 may be located in one plane. After all, as illustrated in FIG. 24, the first side surface part 714 and the second side surface part 744 may be exposed to the same side surface of the package body 610. A length (A) of a first direction of the second side surface part 744 may range from 0.4 mm to 0.5 mm, and a length (G) of a third direction thereof may range from 1.05 mm to 1.15 mm.

One side surface of the first portion 742-1 and the third portion 742-3 of the second upper surface part 742 may have a bending step pulley (g1). For example, the bending step pulley (g1) may be located to be adjacent to a portion in which one side surface of the first portion 742-1 of the second upper surface part 742 meets one side surface of the first portion 744-1 of the second side surface part 744. As much as the bending step pulley (g1), each area of the first upper surface part 712 and the first side surface part 714 located to correspond thereto may be widely designed, so the present exemplary embodiment can improve heat dissipation efficiency due to an increase in heat dissipation area. This is because the area of the first lead frame 620 has relevance to heat dissipation of the light emitting chips 642, 644.

Another side surface of third portion 742-3 and the first portion 742-1 of the second upper surface part 742 may have a bending step pulley (g2). The reason why the bending step pulley (g2) is formed is to easily observe a bonding material (e.g. a solder) with the naked eye.

The first side surface part 714 of the first lead frame 620 and the second side surface part 744 of the second lead frame 630 may be mounted to be in contact with the flexible printed circuit board 10 of the light source modules 100-1 to 100-21 according to the exemplary embodiment. Due to this, the light emitting chip 640 may irradiate light in a direction 3 which is toward the side surface of the resin layer 40. That is, the light emitting device package 200-1 may have a side view type structure.

To improve a withstand voltage of the light emitting device package 200-1, the zener diode 645 may be disposed on the second lead frame 630. For example, the zener diode 645 may be disposed on the second upper surface part 742 of the second lead frame 630.

The first light emitting chip 642 may be electrically connected to the second lead frame 630 by a first wire 652. The second light emitting chip 644 may be electrically connected to the second lead frame 630 by a second wire 654. The zener diode 645 may be electrically connected to the first lead frame 620 by a third wire 656.

For example, one end of the first wire 652 may be connected to the first light emitting chip 642 and another end may be connected to the protrusion part 702. Also, one end of the second wire 654 may be connected to the second light emitting chip 644 and another end may be connected to the protrusion part 702.

The light emitting device package 200-1 may further include the resin layer (not drawn) which is filled in the cavity 601 so as to surround the light emitting chip. The resin layer may be composed of a colorless transparent polymer resin material such as epoxy or silicon.

The light emitting device package 200-1 may implement red light using only a red light emitting chip without using a fluorescent substance. However, the present exemplary embodiment is not limited to this. The resin layer may include the fluorescent substance so that the wavelength of light emitted from the light emitting chip 640 can be changed. For example, although a light emitting chip having other colors rather than the red color is used, the light emitting device package which emits light having a desired color may be implemented by changing the wavelength of light using the florescent substance.

Figure 29:
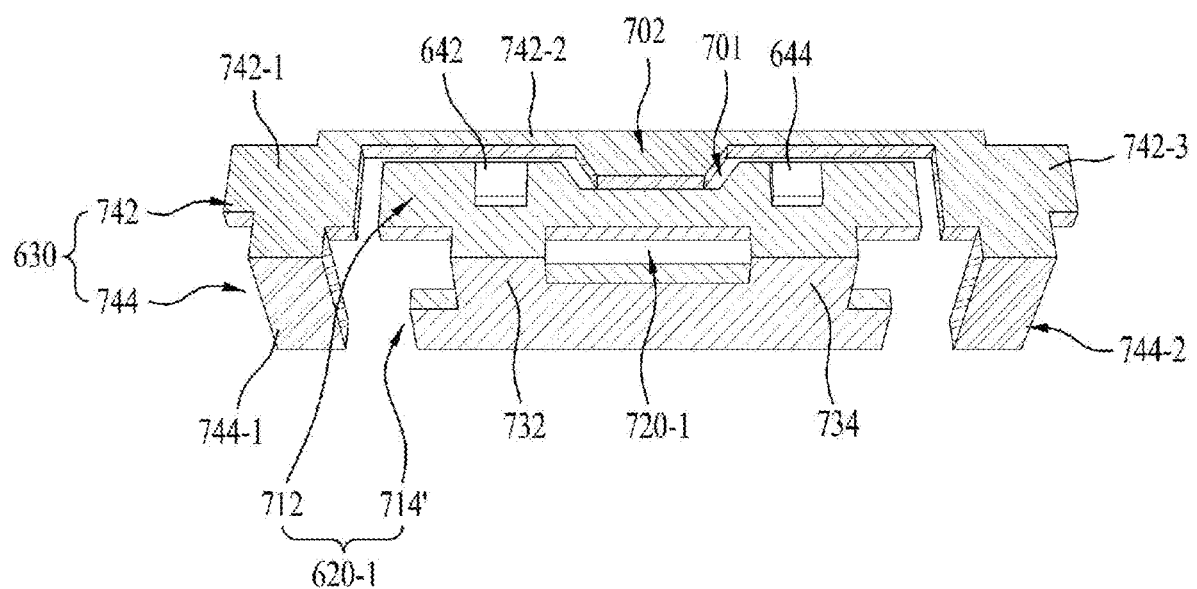
FIG. 29 through FIG. 34 show modified exemplary embodiments of the first lead frame and the second lead frame.

FIG. 29 shows the first lead frame 620-1 and the second lead frame 630 according to still another exemplary embodiment. The same reference numerals as those of FIG. 26 represent the same elements, and the contents overlapping with those stated earlier are omitted or are briefly stated.

Referring to FIG. 29, the first lead frame 620-1 may have a structure in which the third connection part 736 is removed from the first lead frame 620 illustrated in FIG. 26. That is, the first lead frame 620-1 may have one through hole 720-1 to be adjacent to a boundary part between the first upper surface part 712 and a first side surface part 714'. Furthermore, the first connection part 732 may be located at one side of the through hole 720-1, and the second connection part 734 may be located at another side of the through hole 720-1.

Figure 30:
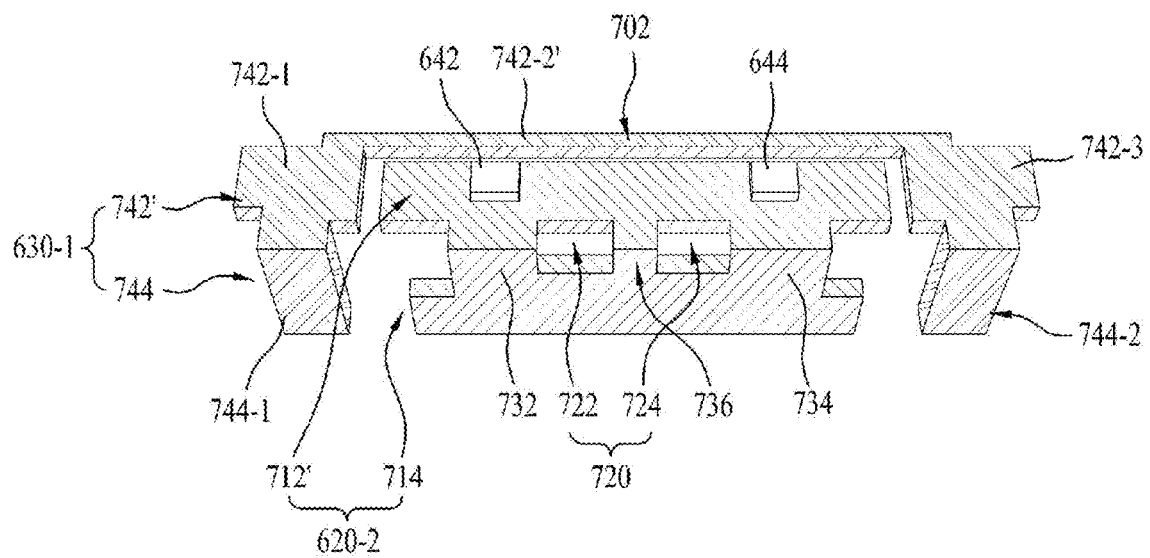

FIG. 30 shows a first lead frame 620-2 and a second lead frame 630-1 according to still another exemplary embodiment. The same reference numerals as those of FIG. 26 represent the same elements, and the contents overlapping with those stated earlier are omitted or are briefly stated.

Referring to FIG. 30, a first upper surface part 712' of the first lead frame 620-2 may have a structure in which the groove part 701 is omitted from the first upper surface part 712 of the first lead frame 620 illustrated in FIG. 30. Furthermore, the second portion 742-2 of the second upper surface part 742' of the second lead frame 630-1 may have a structure in which the protrusion part 702 is omitted from the second portion 742-2 of the second upper surface part 742 of the second lead frame illustrated in FIG. 30. The remaining elements except for this may be identical to those as explained in FIG. 26.

Figure 31:
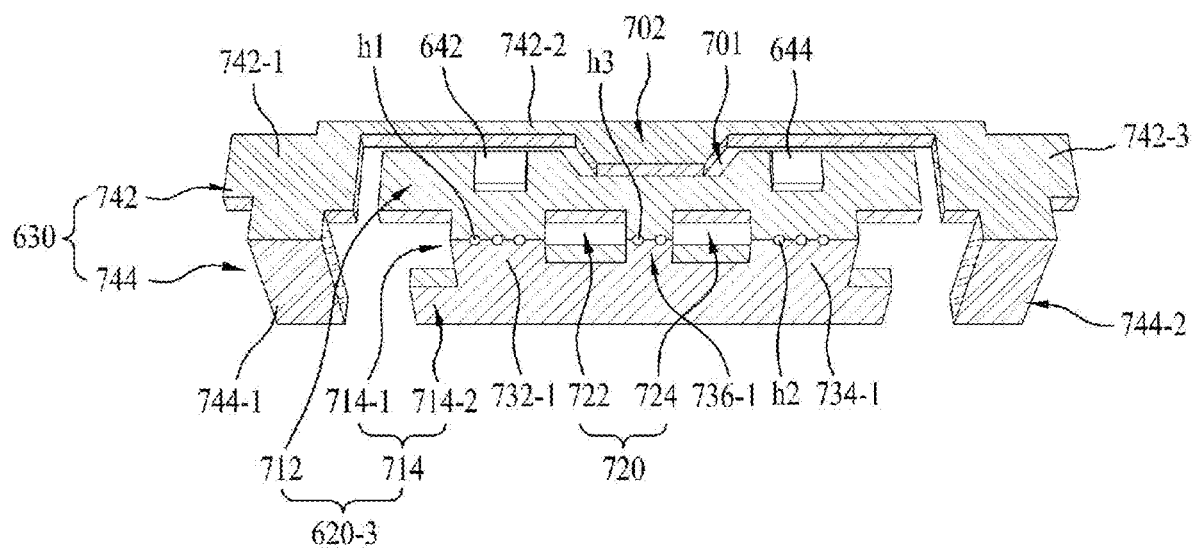

FIG. 31 shows a first lead frame 620-3 and the second lead frame 630 according to still another exemplary embodiment. The same reference numerals as those of FIG. 26 represent the same elements, and the contents overlapping with those stated earlier are omitted or are briefly stated.

Referring to FIG. 31, the first lead frame 620-3 may have a structure in which minute through holes h1, h2, h3 passing through the first lead frame 620 are formed in at least one of the connection parts 732, 734, 736 of the first lead frame illustrated in FIG. 26.

At least one of the connection parts 732-1, 734-1, 736-1 of the first lead frame 620-3 may have the minute through holes h1, h2, h3 which are formed in the boundary portion between the first upper surface part 712 and the first side surface part 714. At this time, each diameter of the minute through holes h1, h2, h3 may be smaller than the lengths (D11, D12) of the first direction of the through holes 722, 724 or the length of the second direction. Also, the number of the minute through holes h1, h2 formed in the first connection part 732-1 and the second connection part 734-1 may be larger than that of the minute through hole h3 formed in the third connection part 736-1. However, the present invention is not limited to this. Also, each shape of the minute through holes h1, h2, h3 may be a circular shape, an elliptical shape or a polygonal shape. The minute through holes h1, h2, h3 may enable the bending of the first lead frame 620-3 to be easily performed and may improve a binding force between the first lead frame 620-3 and the package body 610.

Figure 32:
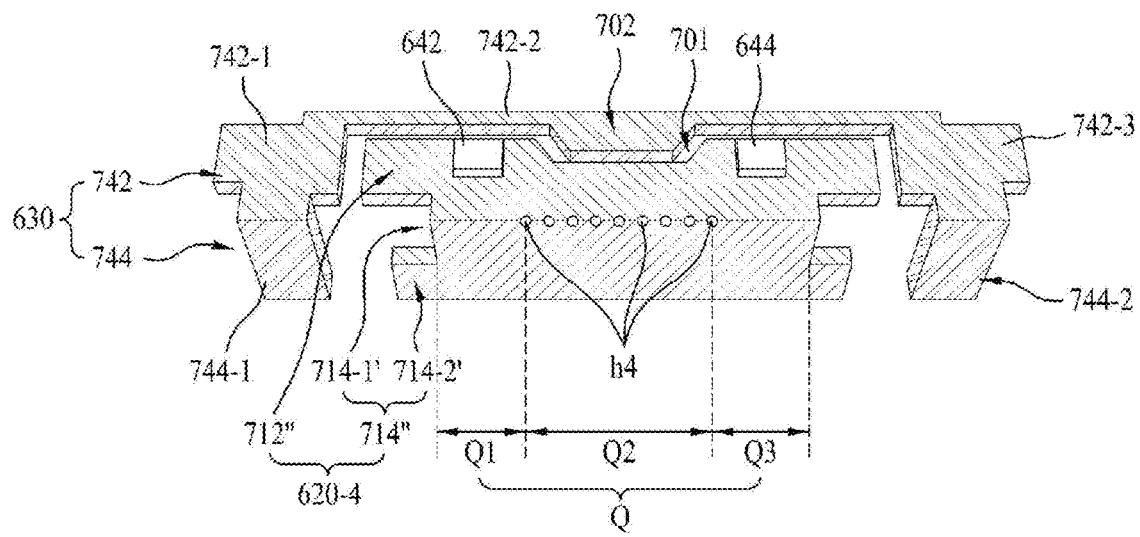

FIG. 32 shows a first lead frame 620-4 and the second lead frame 630 according to still another exemplary embodiment. The same reference numerals as those of FIG. 26 represent the same elements, and the contents overlapping with those stated earlier are omitted or are briefly stated.

Referring to FIG. 32, the first lead frame 620-4 may include a first upper surface part 712" and a first side surface part 714". The first upper surface part 712" and the first side surface part 714" are modified examples of the first upper surface part 712 and the first side surface part 714 illustrated in FIG. 30. That is, the first lead frame 620-4 The first lead frame 620-4 may have a structure in which the through holes 722, 724 are omitted from the first upper surface part 712 and the first side surface part 714 of the first lead frame 620 illustrated in FIG. 24, and the plurality of minute through holes (h4) spaced apart from each is provided in one region (Q2) of a boundary portion (Q) between the first upper surface part 712" and the first side surface part 714" in which the through holes 722, 724 are omitted.

The boundary portion (Q) between the first upper surface part 712" and the first side surface part 714" may be divided into a first boundary region (Q1), a second boundary region (Q2), and a third boundary region (Q3). The first boundary region (Q1) may be a region which corresponds to or is aligned in the first light emitting chip 642. The second boundary region (Q2) may be a region which corresponds to or is aligned in the first light emitting chip 642. The third boundary region (Q3) may be a region between the first boundary region (Q1) and the second boundary region (Q2). For example, the first boundary region (Q1) may be a region corresponding to the first connection part 732. The second boundary region (Q2) may be a region corresponding to the second connection part 734 illustrated in FIG. 26.

The first boundary region (Q1) and the second boundary region (Q2) may function as a path for transmitting heat from the first light emitting chip 642 and the second light emitting chip 644, and the plurality of minute through holes (h4) may enable the bending between the first upper surface part 712'' and the first side surface part 714'' to be easily performed. In FIG. 30, the plurality of minute through holes (h4) is identical to each other with respect to a diameter and a separation distance. However, the present exemplary embodiment is not limited to this. In still another exemplary embodiment, at least one of the plurality of minute through holes (h4) may have a different diameter or a different separation distance.

Figure 33:
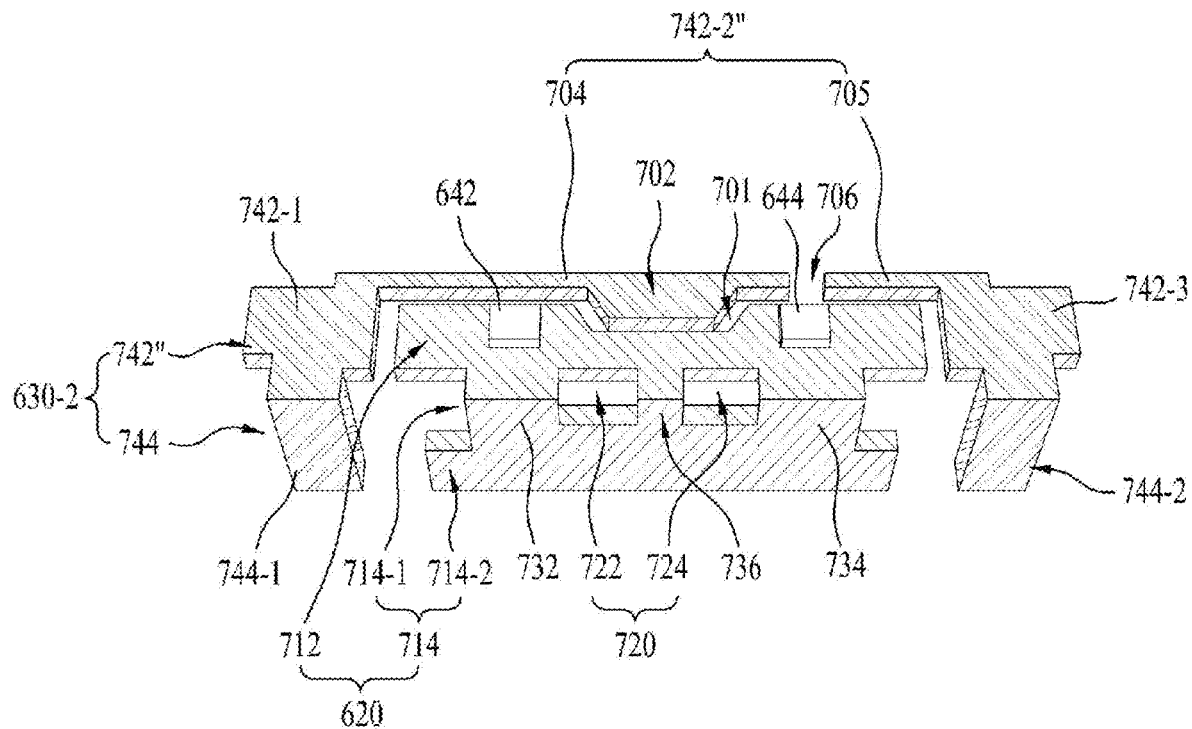

FIG. 33 shows the first lead frame 620 and a second lead frame 630-2 according to still another exemplary embodiment. The second lead frame 630-2 of FIG. 33 may be a modified example of the second lead frame 630 illustrated in FIG. 24. The same reference numerals as those of FIG. 26 represent the same elements, and the contents overlapping with those stated earlier are omitted or are briefly stated.

Referring to FIG. 33, unlike the second portion 742-2 of the second upper surface part 742 illustrated in FIG. 26, the second portion 742-2'' of the second upper surface part 742'' illustrated in FIG. 33 has a disconnection structure, and does not connect the first portion 742-1 and the third portion 742-3.

The second upper surface part 742'' of the second lead frame 630-2 may include the first portion 742-1, the second portion 742-2'', and the third portion 742-3. Each of the first to third portions 742-1, 742-2'', 742-3 may be located around corresponding one of the side portions of the first upper surface part 712 of the first lead frame 620.

The second portion 742-2'' of the second upper surface part 742'' may be composed of a first region 704 connected to the first part 742-1, a second region 705 connected to a third part 742-3 and spaced apart from the first region 704. Since the package body 610 is filled in a separation space 706 between the first region 704 and the second region 705, a binding force between the package body 610 and the second lead frame 630-2 can be improved. The second lead frame 630-2 illustrated in FIG. 34 may be divided into the first sub-frames 744-1, 742-1, 704 and the second sub-frames 744-2, 742-3, 705 which may be electrically separated from each other.

Figure 34:
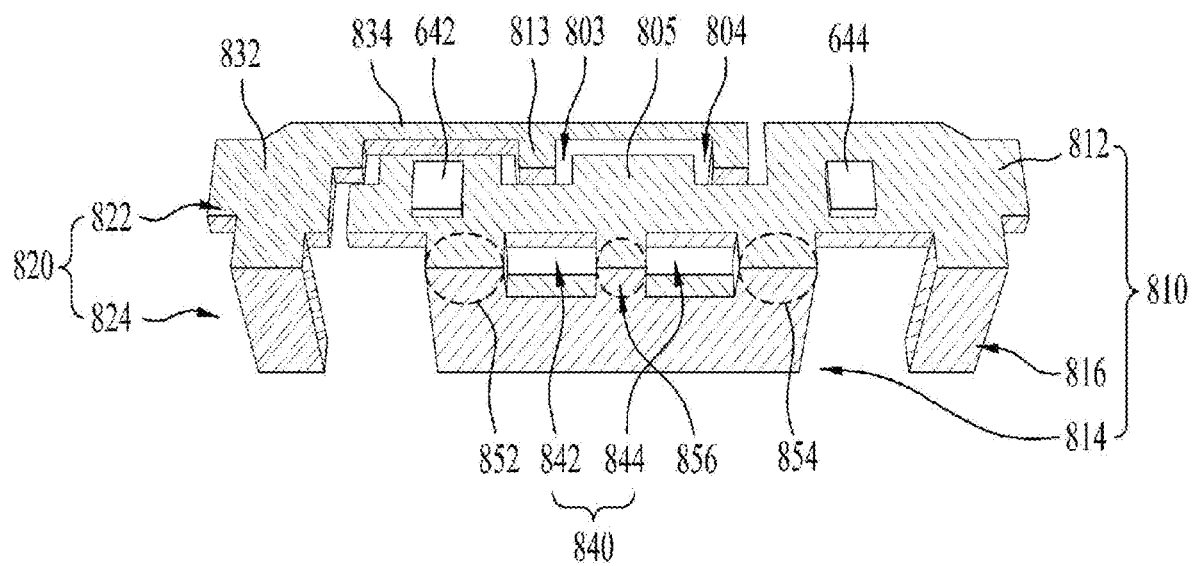

FIG. 34 shows a first lead frame 810 and a second lead frame 820 according to still another exemplary embodiment.

Referring to FIG. 34, the first lead frame 810 may include a first upper surface part 812, a first side surface part 814 and a second side surface part 816 which are bent from the first upper surface part 812. The light emitting chips 642, 644 may be disposed in the first upper surface part 812.

The second side portion of the first upper surface part 812 may have one or more first groove parts 803, 804 and a first protrusion part 805. At this time, the second side portion of the first upper surface part 812 may be a side portion which is opposite to the first side portion of the first upper surface part 812. For example, the second side portion of the first upper surface part 812 may have two first groove parts and one first protrusion part 805 which is located between the first groove parts 803, 804. However, the present invention is not limited to this. The first groove parts 803, 804 may have a shape corresponding to the second protrusion parts 813, 814 provided in the second lead frame which will be described later, and the first protrusion part 805 may have a shape corresponding to the second groove part 815 provided in the second lead frame. The first groove parts 803, 804 and the first protrusion part 805 illustrated in FIG. 32 may have a quadrilateral shape. However, the shape is not limited to this. They may be implemented in various shapes such as a circular shape, a polygonal shape, an elliptical shape and the like. The light emitting chips 642, 644 may be disposed on the first upper surface part of both sides of the first groove parts 803, 804.

The first side surface part 814 may be connected to one region of the first side portion of the first upper surface part 712, the second side surface part 816 may be connected to another region of the first side portion of the first upper surface part 712, and the first side surface part 814 and the second side surface part 816 may be spaced apart from each other. The first side surface part 814 and the second side surface part 816 may be exposed from any same one side surface of the package body 610.

The first lead frame 610 may have one or more through holes 820 in at least one of the first upper surface part 812 and the first side surface part 814. For example, the first lead frame 810 may have one or more through holes to be adjacent to a boundary portion between the first upper surface part 812 and the first side surface part 814. The through hole 820 may have the same structure as that stated in FIG. 26 and FIG. 28, and the function thereof may also be identical to that stated in FIG. 26 and FIG. 28.

The first lead frame 810 may be located to be adjacent to the boundary portion 801 between the first upper surface part 812 and the first side surface part 814 and may have connection parts 852, 854, 856 which are spaced apart from each other by the through hole 720, and which connect the first upper surface part 712 and the first side surface part 714 to each other. The structure and function of the connection parts 852, 854, 856 may be identical to those stated in FIG. 26 and FIG. 28. The first lead frame 810 may have at least one connection part which corresponds to or is located to be adjacent to the light emitting chip 642 or 644.

A length of a first direction of the connection part (e.g. 852, 854) which corresponds to or is located to be adjacent to the light emitting chip 642, 644 may be larger than a length of a first direction of the connection part (e.g. 856) which does not correspond to or is not adjacent to the light emitting chip 642, 644.

To improve a binding force with the package body 620 and airtightness for inhibiting the penetration of water, a lower end portion of a side surface of the second side surface part 814 may protrude in a side direction.

The second lead frame 820 may be disposed around at least one side portion of the first lead frame 810. The second lead frame 820 may include a second upper surface part 822 and a third side surface part 824. The second upper surface part 822 may be divided into a first portion 832 and a second portion 834 depending on a location disposed around the first upper part 812.

The second portion 834 of the second upper surface part 822 may be a part which corresponds to or is opposite to the second side portion of the first upper surface part 812. The first portion 832 of the second upper surface part 822 may be connected to one end of the second portion 834 and may correspond to or be opposite to the third side portion of the first upper surface part 712. The third side portion may be a side portion which is vertical to the first side portion or the second side portion.

The second portion 834 of the second upper surface part 822 may have the second protrusion parts 813, 814 corresponding to the first groove parts 803, 804 of the first upper surface part 812. The second protrusion parts 813, 814, which are a region for the wire-bonding of the first light emitting chip 642 and the seconding light emitting chip 644, may be located between the first light emitting chip 642 and the second light emitting chip 644, thereby enabling the wire-bonding to be easily performed.

The third side surface part 824 may be bent in a predetermined angle (e.g. 90°) from the second upper surface part 822 to the lower direction. For example, the third side surface part 824 may be bent from one side portion of the first portion of the second upper side part. Based on the first side surface part 814, the second side surface part 816 and the third side surface part may have a bilateral symmetrical shape. To improve a binding force with the package body 620 and airtightness for inhibiting the penetration of water, a lower end portion of the third side surface part 824 may protrude in the side direction. The first side surface part 814, the second side surface part 861 and the third side surface part 824 may be exposed to the same side surface as the package body 610.

Figure 35:
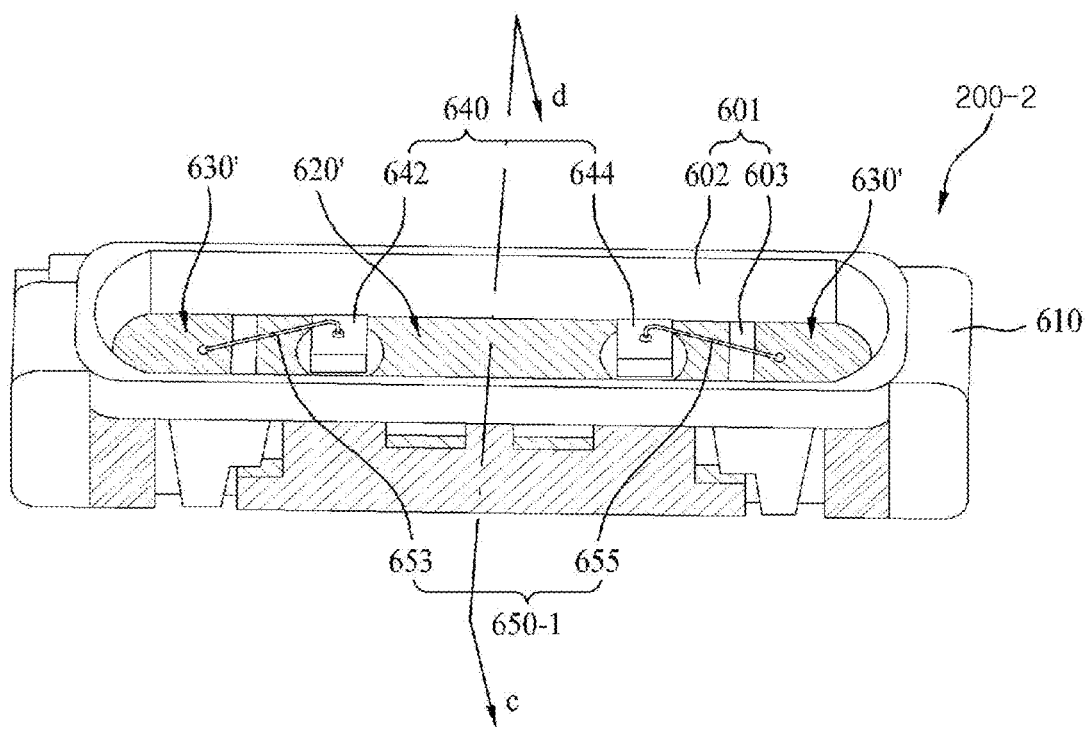
FIG. 35 shows a perspective view of a light emitting device package according to another exemplary embodiment of the present invention.
Figure 36:
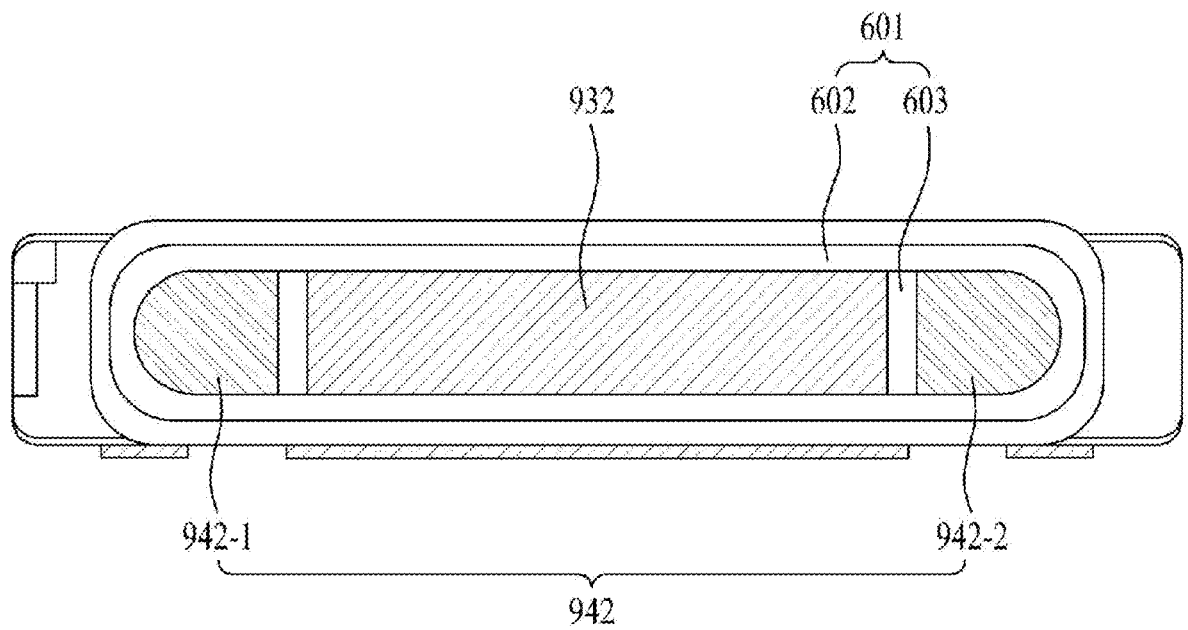
FIG. 36 shows an upper view of the light emitting device package illustrated in FIG. 35.
Figure 37:
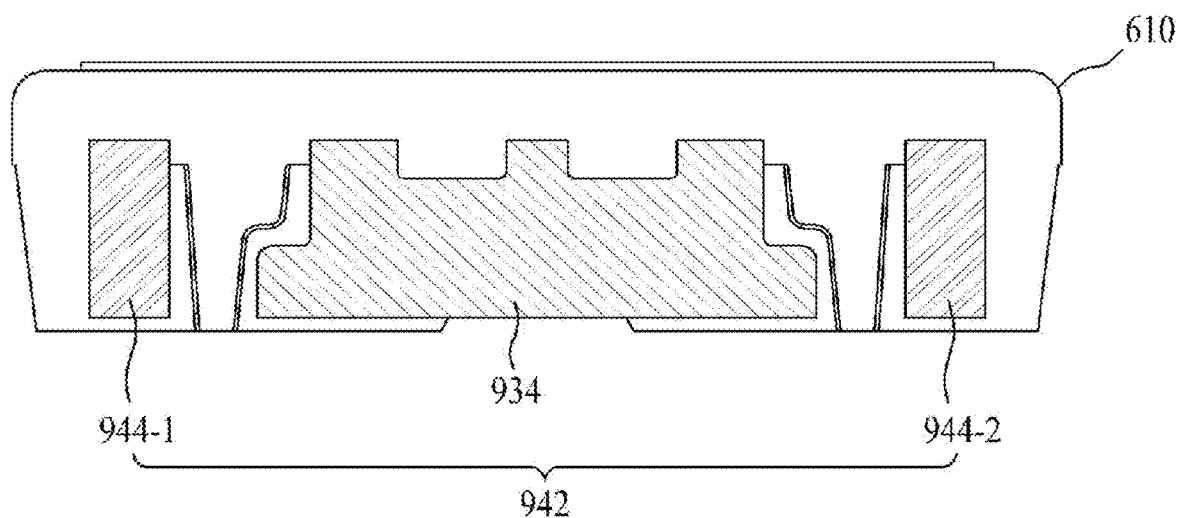
FIG. 37 shows a front view of the light emitting device package illustrated in FIG. 35.
Figure 38:
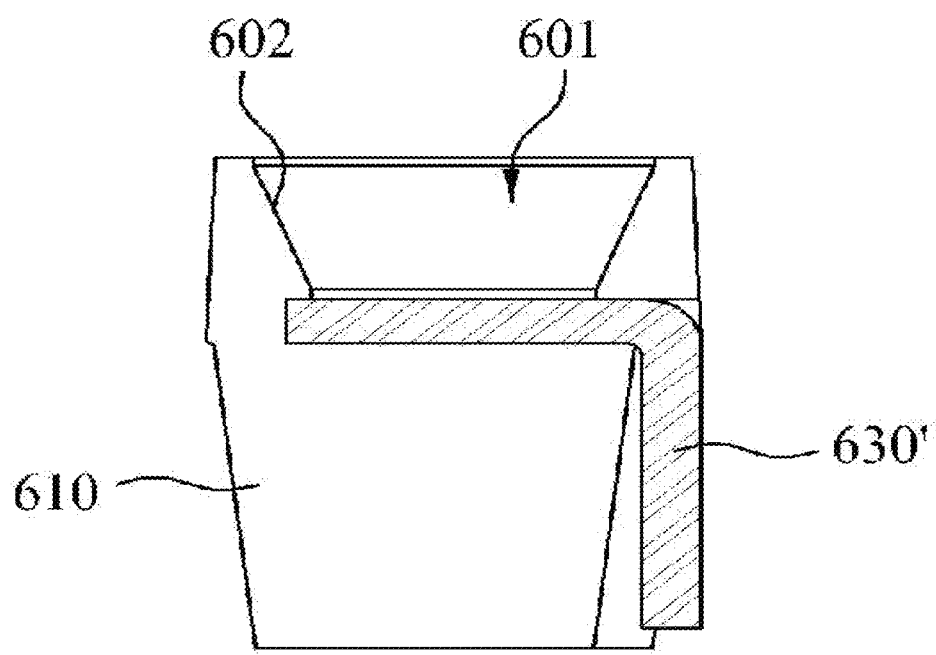
FIG. 38 shows a cross-sectional view taken along cd of the light emitting device package illustrated in FIG. 35.
Figure 39:
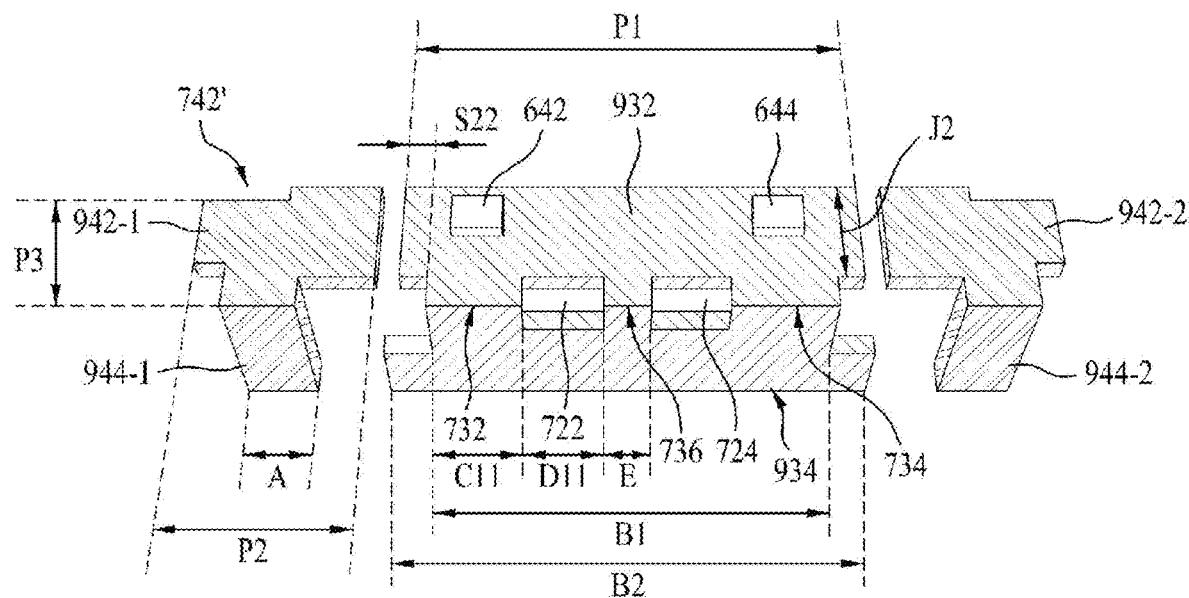
FIG. 39 shows the first lead frame and the second lead frame illustrated in FIG. 35.

FIG. 35 shows a perspective view of a light emitting device package 200-2 according to another exemplary embodiment of the present invention, FIG. 36 shows an upper view of the light emitting device package illustrated in FIG. 35, FIG. 37 shows a front view of the light emitting device package illustrated in FIG. 35, FIG. 38 shows a cross-sectional view taken along cd of the light emitting device package illustrated in FIG. 35, and FIG. 39 shows the first lead frame 620' and the second lead frame 630' illustrated in FIG. 35. The same reference numerals as those of FIG. 22 to FIG. 26 represent the same elements, and the contents overlapping with those stated earlier are omitted or are briefly stated.

Referring to FIG. 35 to FIG. 39, the first lead frame 620' of the light emitting device package 200-2 may include a first upper surface part 932 and a first side surface part 934. Unlike the first upper surface part 712 illustrated in FIG. 26, the first upper surface part 932 illustrated in FIG. 39 has no groove part. The second upper surface part 942 of the second lead frame 630' may be similar to the structure in which the second portion 742-2 of the second upper surface part 742 illustrated in FIG. 30 is omitted.

The first side surface part 934 may have the same structure as that of the first side surface part 714 illustrated in FIG. 32. A length (P1) of a first direction of the first upper surface part 932 may be smaller than that of the first upper surface part 712 illustrated in FIG. 28. A length (J2) of a second direction of the first upper surface part 932 may be larger than that (J1) of the second direction of the first upper surface part 712. For example, the length (P) of the first direction of the first upper surface part 932 may range from 4.8 mm to 4.9 mm. The length (J2) of the second direction may range from 0.67 mm to 0.77 mm. Accordingly, since an area of the first upper surface part 932 illustrated in FIG. 35 is larger than the area of the first upper surface part 712 illustrated in FIG. 30, the exemplary embodiment of FIG. 35 may mount a light emitting chip having a larger size. Each size of the first side surface part 944, the through holes 722, 724, and the connection parts may be identical to those explained in FIG. 27.

The second lead frame 630' may include the second upper surface part 942 and the second side surface part 944. The second upper surface part 942 may include a first portion 942-1 disposed around a third side portion of the first upper surface part 932, and a second portion 942-2 disposed around a fourth side portion. The third side portion of the first upper surface part 932 may be a side portion which is vertical to the first side portion of the first upper surface part 932, and the fourth side portion of the first upper surface part 932 may be a side portion which is opposite to the third side portion of the first upper surface part 932.

The first portion 942-1 and the second portion 942-2 of the second upper surface part 942 may be located to be spaced apart from each other and may be electrically separated from each other.

The second side surface part 944 may include a first portion 944-1 connected to the first portion 942-1 of the second upper surface part 942, and a second portion 944-2 connected to the second portion 942-2 of the second upper surface part 942. However, a length (P2) of a first direction of the first portion 942-1 and the second portion 942-2 of the second upper surface part 942 may be larger than the length (H2) of the first direction of the first portion 742-1 and the third portion 742-3 of the second upper surface part 742 illustrated in FIG. 32.

For example, a length (P2) of a first direction of the first portion 942-1 and the second portion 942-2 of the second upper surface part 942 may range from 1.04 mm to 1.14 mm, and a length (P3) of a second direction may be range from 0.45 mm to 0.55 mm.

In the lead frame array, a length of a first direction of a protrusion part (S22) of the first upper surface part 932 which protrudes to support the first lead frame 620' may range from 0.14 mm to 0.24 mm.

The first light emitting chip 642 may be electrically connected to the first portion 942-1 of the second upper surface part 942 by the first wire 653. The second light emitting chip 644 may be electrically connected to the first portion 942-2 of the second upper surface part 942 by the second wire 655.

The first light emitting chip 642 and the second light emitting chip 644 may generate light having the same wavelength. For example, the first light emitting chip 642 and the second light emitting chip 644 may be a red light emitting chip which generates red light.

Also, the first light emitting chip 642 may generate light having different wavelengths from each other. For example, the first light emitting chip 642 may be a red light emitting chip, the second light emitting chip 644 may be a yellow light emitting chip. The first light emitting chip 642 and the second light emitting chip 644 mounted to the light source package according to the second exemplary embodiment may be individually operated.

A first power source (e.g. a negative (−) power source) may be supplied to the first lead frame 620', and a second power source (e.g. a positive (+) power source) may be supplied to the second lead frame 630'. Since the second lead frame 630' is divided into two portions 942-1 & 944-1, and 942-2 & 944-2 which are electrically separated from each other, the first lead frame 620' may be used as a common electrode, and the first light emitting chip 642 and the second light emitting chip 644 may be individually operated by individually supplying the second power source to the first portion 942-1 and the second portion 942-2 of the second upper surface part 942.

Accordingly, when the light emitting device package 200-2 illustrated in FIG. 35 is mounted in the light source modules 100-1 to 100-21 according to some exemplary embodiments, the light source modules 100-1 to 100-21 may generate surface light sources having various colors. For example, when only the first light emitting chip 642 is operated, some exemplary embodiment may generate a red surface light source, and when the second light emitting chip 644 is operated, some exemplary embodiment may generate a yellow surface light source.

Figure 40:
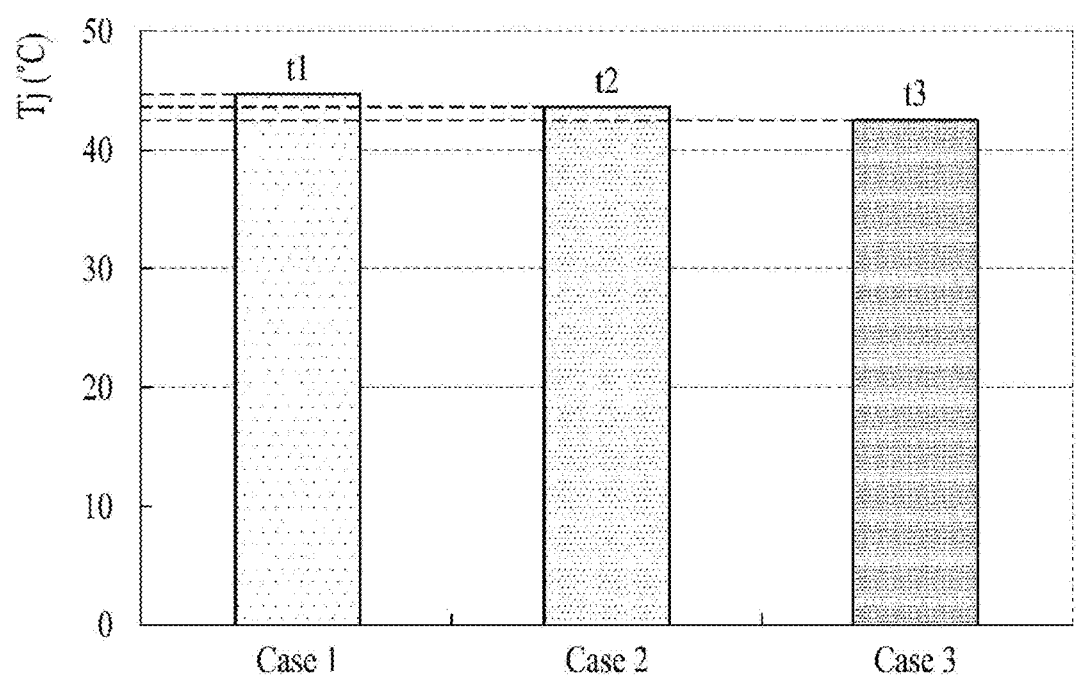
FIG. 40 shows measured temperatures of the light emitting device package according to some exemplary embodiment of the present invention.

FIG. 40 shows measured temperatures of the light emitting device packages 200-1, 200-2 according to still another exemplary embodiment. The measured temperature illustrated in FIG. 40 represents a temperature of the light emitting chip when the light emitting device package emits light.

Case 1 represents a measured temperature of the light emitting chip when a length of the first direction of the first portion and the second portion in the side surface part of the first lead frame is identical to that of the third portion. Case 2 represents a measured temperature of the light emitting chip illustrated in FIG. 22. Case 3 represents a measured temperature of the light emitting chip illustrated in FIG. 33.

Referring to FIG. 40, the measured temperature (t1) of case 1 is 44.54° C., the measured temperature (t2) of case 2 is 43.66° C., and the measured temperature (t3) of case 3 is 43.58° C.

Accordingly, as designs of the connection parts of the first side surface part 714 of the first lead frame 620 are changed, a heat dissipation effect of the present exemplary embodiment can be improved. Thus, since an increase in temperature of the light emitting chip 640 mounted to the light emitting device packages 200-1, 200-2 at the time of light emission may be relieved, the reduction of luminous intensity and the generation of wavelength shift may be inhibited.

Figure 41:
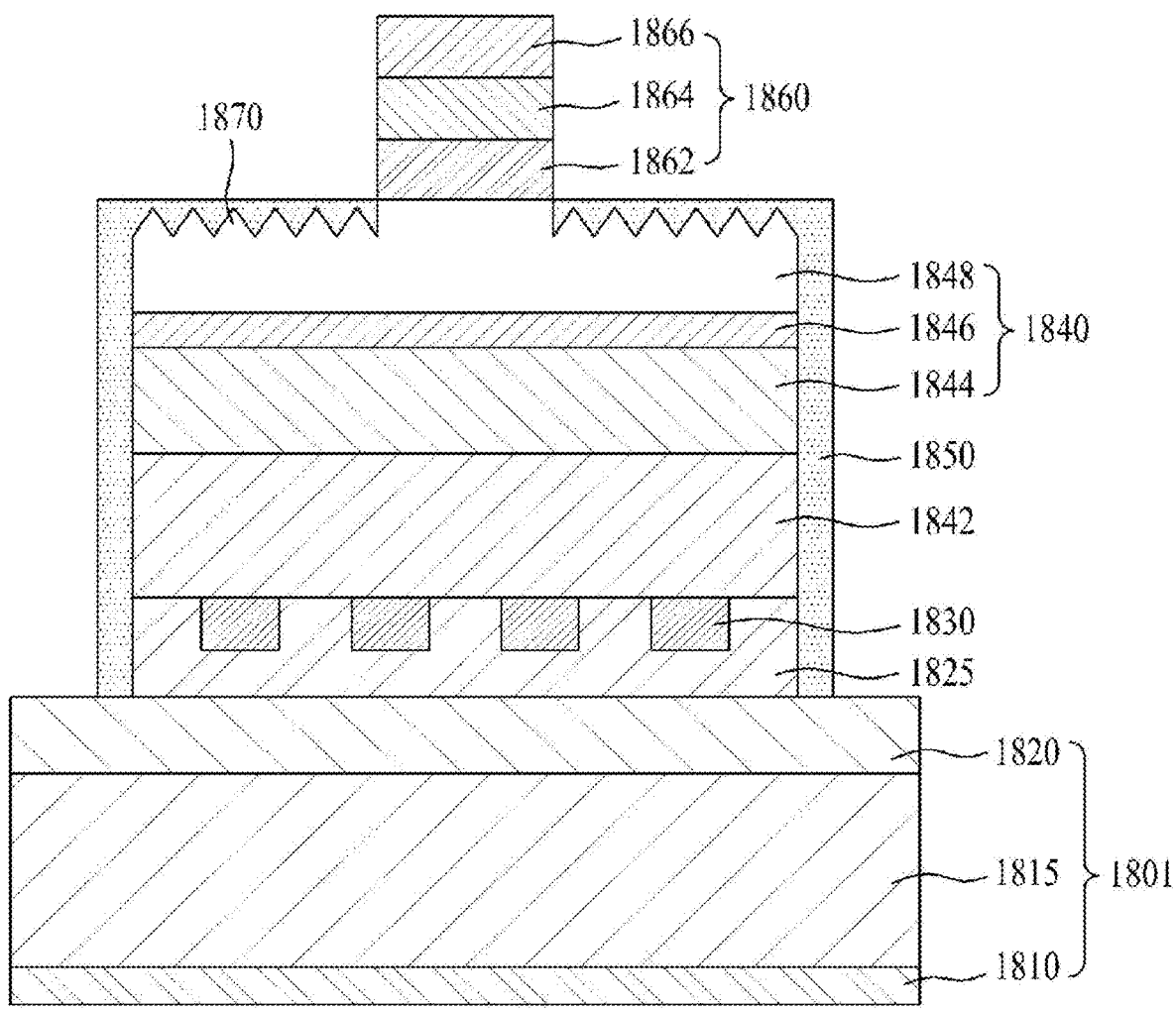
FIG. 41 shows one exemplary embodiment of a light emitting chip illustrated in FIG. 22.

FIG. 41 shows one exemplary embodiment of the light emitting chip 640 illustrated in FIG. 22. The light emitting chip 640 illustrated in FIG. 41 may be a vertical chip which emits red light having a wavelength range of 600 nm to 690 nm.

Referring to FIG. 41, the light emitting chip 640 includes: a second electrode layer 1801; a reflection layer 1825; a light emitting structure 1840; a passivation layer 1850; and a first electrode layer 1860.

The second electrode layer 1801 along with the first electrode layer 1860 may supply a power source to the light emitting structure 1840. The second electrode layer 1801 may include: an electrode material layer 1810 for current injection; a support layer 1815 located on the electrode material layer 1810; and a bonding layer 1820 located on the support layer 1815. The second electrode layer 1801 may be bonded to the first lead frame of the light emitting device package 200-1 illustrated in FIG. 28, for example, the first supper surface part 712.

The electrode material layer may be Ti/Au, and the support layer 1815 may be a metal material or a semiconductor material. Also, the support layer 1815 may be a material having high electrical conductivity and heat conductivity. For example, the support layer 1815 may be a metal material including at least one of Cu, a Cu alloy, Au, Ni, Mo, and Cu—W or may be a semiconductor including at least one of Si, Ge, GaAs, ZnO and SiC.

The bonding layer 1820 may be disposed between the support layer 1815 and the reflection layer 1825, and the bonding layer 1820 may function to bond the support layer to the reflection layer 1825. The bonding layer 1820 may include at least one of bonding metal materials such as In, Sn, Ag, Nb, Pd, Ni, Au and Cu. Since the bonding layer 1820 is formed to bond the support layer 1815 using a bonding method, the bonding layer 1820 may be omitted when the support layer 1815 is formed using a plating method or a deposition method.

The reflection layer 1825 may be disposed on the bonding layer 1820. The reflection layer 1825 reflects light incident from the light emitting structure 1840, thereby enabling light extraction efficiency to be improved. The reflection layer 1825 may be formed of a metal or an alloy including at least one of reflection metal materials such as Ag, Ni, Al, Rh, Pd, Ir, Ru, Mg, Zn, Pt, Au, and Hf.

Also, the reflection layer 1825 may be formed in a single layer or multi layers using a conductive oxide layer such as IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide) and the like. Also, the reflection layer 1825 may be formed by forming a metal and the conducting oxide such as IZO/Ni, AZO/Ag, IZO/Ag/Ni, AZO/Ag/Ni and the like in a multiple layer.

An ohmic region 1830 may be located between the reflection layer 1825 and the light emitting structure 1840. The ohmic region 1830 which is a region being in ohmic contact with the light emitting structure 1840, may function to smoothly supply a power source to the light emitting structure 1840.

The ohmic region 1830 may be formed by putting the light emitting structure 1840 into ohmic-contact with a material including at least one of ohmic contact materials such as Be, Au, Ag, Ni, Cr, Ti, Pd, Ir, Sn, Ru, Pt and Hf. For example, the material, which forms the ohmic region 1830, may include AuBe and may have a dot shape.

The light emitting structure 1840 may include a window layer 1842, a second semiconductor layer 1844, an active layer 1846, and a first semiconductor layer 1848. The window layer 1842 may be a semiconductor layer disposed on the reflection layer 1825 and a composition thereof may be GaP.

The second semiconductor layer 1844 may be disposed on the window layer 1842. The second semiconductor 1844 may be implemented in a compound semiconductor of Group III to Group V, Group II to Group VI and the like, and a second conductive dopant may be doped. For example, the first semiconductor layer 1844 may include any one of AlGaInP, GaInP, GaN, AlN, AlGaN, InGaN, InN, InAlGaN, AlInN, AlGaAs, GaP, GaAs, and GaAsP, and a p-type dopant (e.g. Mg, Zn, Ca, Sr and Ba) may be doped.

The active layer 1846 may be disposed between the second semiconductor layer 1844 and the first semiconductor layer 1848, and may generate light due to energy generated during the recombination process of an electron and a hole provided from the second semiconductor layer 1844 and the first semiconductor layer 1848.

The active layer 1846 may be a compound semiconductor of Group III to Group V, and Group II to Group VI and may be formed in a single well structure, a multiple well structure, a quantum-wire structure, or a quantum dot structure.

For example, the active layer 1846 may have a single or multiple quantum well structure having a well layer and a barrier layer. The well layer may be a material having a lower band gap than an energy band gap of the barrier layer. For example, the active layer 1846 may be AlGaInP or GaInP.

The first semiconductor layer 1848 may be formed of a semiconductor compound. The first semiconductor layer 1848 may be implemented by the semiconductor of a compound of Group III to Group V, Group II to Group VI, and the like, and the first conductive dopant may be doped. For example, the first semiconductor layer 1848 may include any one of AlGaInP, GaInP, GaN, AlN, AlGaN, InGaN, InN, InAlGaN, AlInN, AlGaAs, GaP, GaAs, and GaAsP. An n-type dopant (e.g. Si, Ge, Sn, etc.) may be doped.

The light emitting structure 1840 may generate red light having a wavelength range of 600 nm to 690 nm. The first semiconductor layer 1848, the active layer 1846 and the second semiconductor layer 1844 may have a composition capable of generating red light. To improve light extraction efficiency, a roughness 1870 may be formed on an upper surface of the first semiconductor layer 1848.

The passivation layer 1850 may be disposed on a side surface of a light emitting structure 1840. The passivation layer 1850 may function to electrically protect the light emitting structure 1840. The passivation layer 1850 may be formed of an insulating material such as $SiO_2$, $SiO_x$, $SiO_xN_y$, $Si_3N_4$, or $Al_2O_3$. The passivation layer 1850 may be disposed on at least a part of the upper surface of the first semiconductor layer 1848.

The first electrode layer 1860 may be disposed on the first semiconductor layer 1848 and may have a predetermined pattern. The first electrode layer 1860 may be a single layer or a plurality of layers. For example, the first electrode layer 1860 may include a first layer 1862, a second layer 1864 and a third layer 1866 which are sequentially laminated. The first layer 1862 may be in ohmic-contact with the first semiconductor layer 1848 and may be formed of GaAs. The second layer 1864 may be formed of an alloy of AuGe, Ni and Au. The third layer 1866 may be formed of an alloy of Ti and Au.

As illustrated in FIG. 22 and FIG. 35, the first electrode layer 1860 may be electrically bonded to the second lead frame 630 or 630' by the wire 652, 654, 653 or 655.

In general, when a temperature of the light emitting chip increases, the wavelength shift is generated and the luminous intensity is reduced. Compared to a blue light emitting chip (i.e. blue LED) generating blue light and a light emitting chip (i.e. an amber LED) generating yellow light, a red light emitting chip (i.e. a red LED) generating red light shows that the wavelength shift and the reduction of luminous intensity are seriously generated depending on an increase in temperature of red light. Accordingly, in the light emitting device packages and the light source modules in which the red LED is used, it is very important to prepare a heat dissipation measure for controlling the increase in temperature of the light emitting chip.

By the way, the light source modules 100-1 to 100-12 and the light emitting device packages 200-1, 200-2 included in the light device 1 according to the exemplary embodiments can improve heat dissipation efficiency as described above. Thus, although the red LED is used, the wavelength shift and the reduction in luminous intensity can be controlled by controlling the increase in temperature of the light emitting chip.

Figure 42:
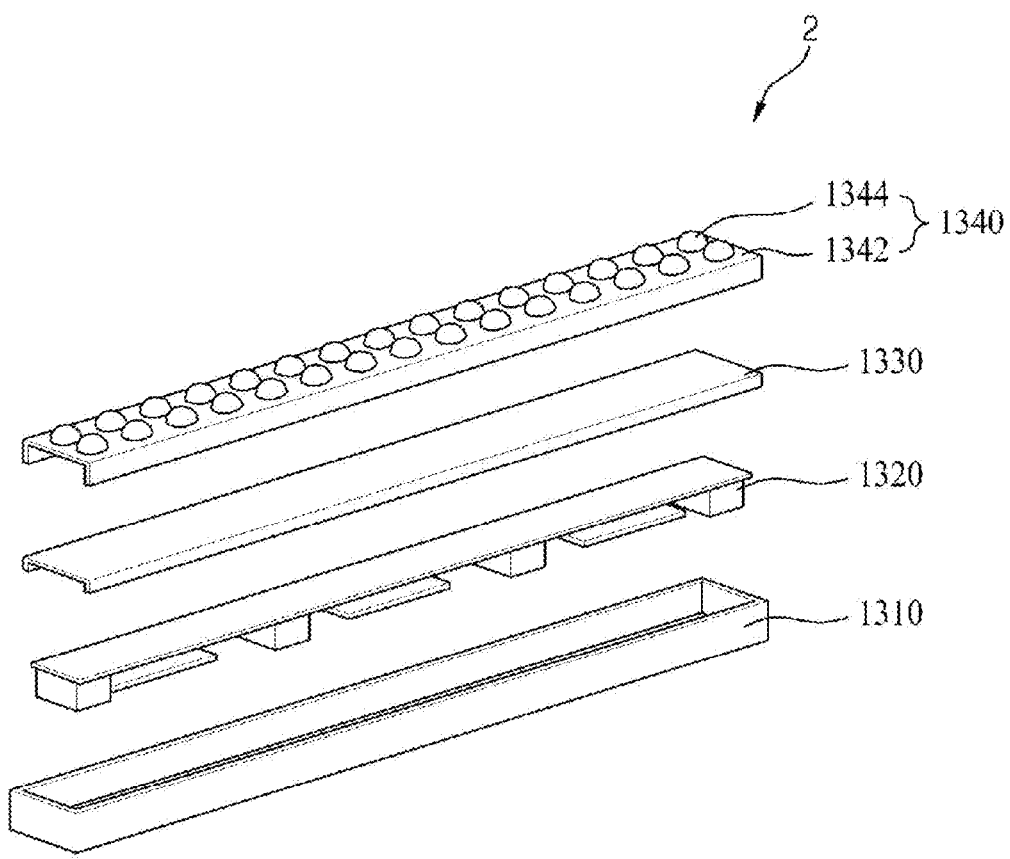
FIG. 42 shows a lighting device according to another exemplary embodiment of the present invention.
Figure 46:
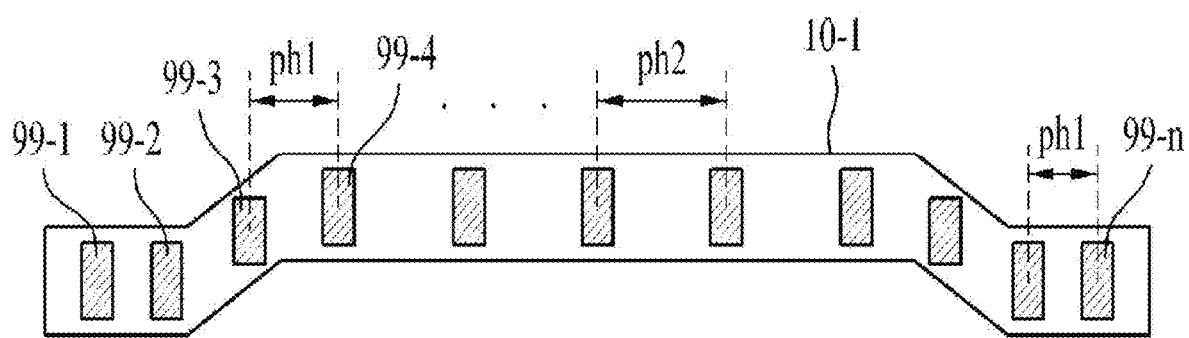
FIG. 46 and FIG. 47 show a distance between the light emitting device packages of the light source module used in the tail light for a vehicle according to some exemplary embodiments of the present invention.

FIG. 42 shows a lighting device 2 according to still another exemplary embodiment. Referring to FIG. 46, the lighting device 2 includes a housing 1310, a light source module 1320, a diffusion plate 1330 and a micro lens array 1340.

The housing 1310 may receive the light source module 1320, the diffusion plate 1330, and the micro lens array 1340 and may be composed of a transparent material.

The light source module 1320 may be any one of the aforesaid exemplary embodiments 100-1 to 100-12.

The diffusion plate 1330 may function to uniformly diffuse the light emitted through the light source 1320 throughout the whole surface. The diffusion plate 1330 may be composed of the same material as the aforesaid diffusion plate 70. However, the material is not limited to this. In other exemplary embodiments, the diffusion plate 1330 may be omitted.

The micro lens array 1340 may have a structure in which the plurality of micro lenses 1344 is disposed on a base film 1342. Each micro lens 1344 may be spaced apart from each other as much as a predetermined distance. A plane surface may exist between the respective micro lenses 1344, and the respective micro lenses 1344 may be spaced apart from each other while having a pitch of 50 to 500 μm.

In FIG. 42, the diffusion plate 1330 and the micro lens array 1340 are composed as separate elements, but other exemplary embodiments, the diffusion plate 1330 and the micro lens array 1340 may be composed in an integral form.

Figure 44:
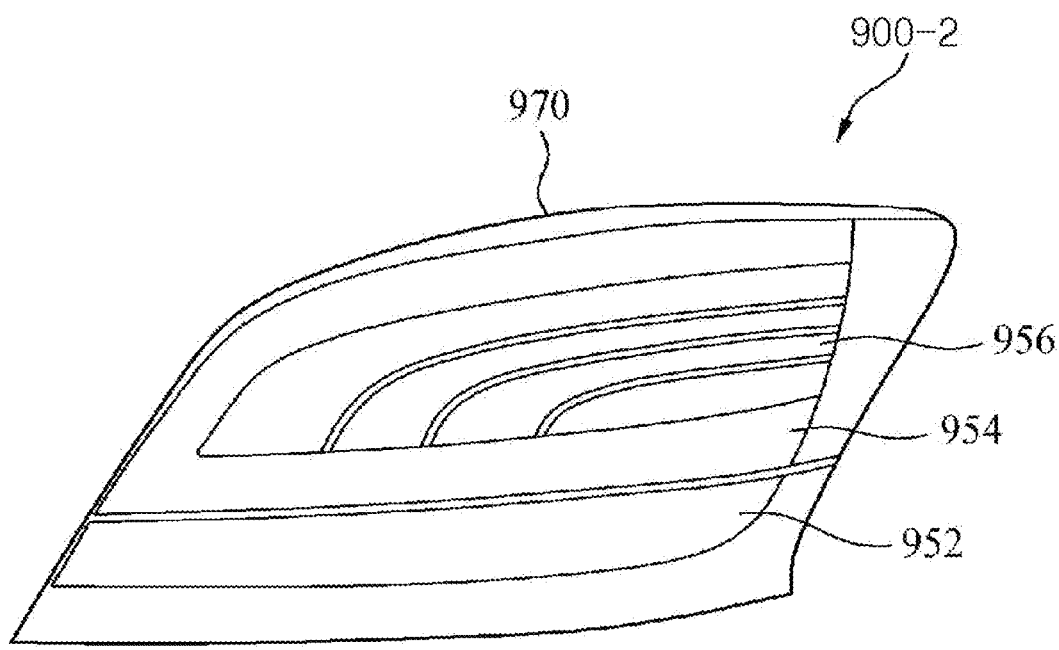
FIG. 44 shows a tail light for a vehicle according to some exemplary embodiment of the present invention.
Figure 45:
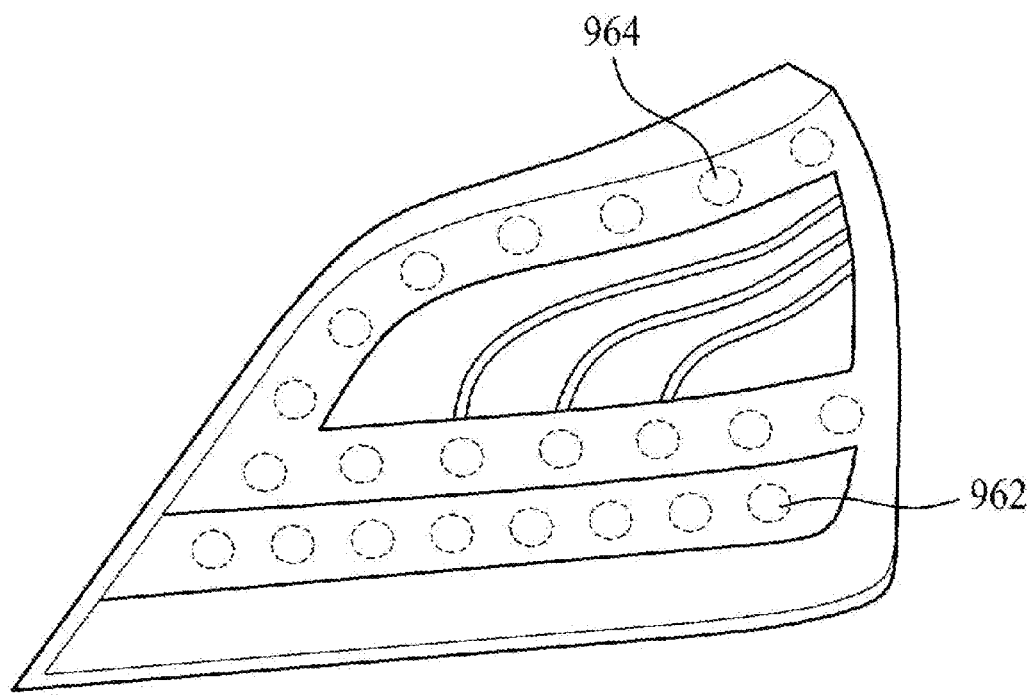
FIG. 45 shows a general tail light for a vehicle.

FIG. 44 shows a tail light for a vehicle 900-2 according to still another exemplary embodiment, and FIG. 45 shows a general tail light for a vehicle.

Referring to FIG. 44, the tail light for the vehicle 900-2 may include a first light source module 952, a second light source module 954, a third light source module 956 and a housing 970.

The first light source module 952 may be a light source for performing the function of a turn signal light. The second light source module 954 may be a light source for performing the function of a sidelight. The third light source module 956 may be a light source for performing the function of a stoplight. However, the function is not limited to this. The functions may be changed from each other.

The housing 970 may receive the first to third light source modules 952, 954, 956 and may be composed of a transparent material. The housing 970 may have a bend depending on the design of a vehicle body. At least one light source module of the first to third light source modules 952, 954, 956 may be implemented in any one of the aforesaid exemplary embodiments 100-1 to 100-12.

In the case of the tail light, when a vehicle stops, the strength of light should be more than 110 cd so as to be visible at long range. Generally, compared to this, the strength of light in a level of more than 30% is required. Furthermore, for light output of more than 30%, the number of the light emitting device packages applied to the light source module (e.g. 952, 954 or 956) should be increased up to more than 25% to 35%, or the output of each light emitting device package should be increased up to more than 25% to 35%.

When the number of the light emitting device package is increased, difficulty in manufacturing may be generated due to the limitation of an arrangement space. Thus, by increasing the output of each light emitting device package mounted to the light source module, the desired strength of light (e.g. more than 110 cd) can be obtained even with the small number of the light emitting device package. In general, since a value of multiplying the output (W) of the light emitting device package by the number (N) thereof becomes a total output of the light source module, the output and number of the light emitting device packages may be appropriately determined depending on an area of the light source module in order to obtain the desired strength of light.

As one example, in the case of a light emitting device package having a power consumption of 0.2 watt and an output of 13 lm, as 37 to 42 light emitting device packages are disposed a fixed area, the strength of light of about 100 cd may be obtained. However, in the case of a light emitting device package having a power consumption of 0.5 watt and an output of 30 lm, although 13 to 15 light emitting device packages are disposed in the same area, the similar strength of light may be obtained. To obtain a fixed output, the number of light emitting device packages which should be disposed in a light source module having a fixed area may be determined depending on an arrangement pitch, the content of a light diffusion material in the resin layer, and a pattern shape of the reflection layer. Here, the pitch may be a distance from any one halfway point of two adjacent light emitting device packages to another halfway point thereof.

The light emitting device packages are disposed at regular intervals when they are disposed in the light source module. In the case of the light emitting device packages of a high output, the number of arrangement may be relatively reduced, and the light emitting device packages may be disposed at wide intervals so that a space can be efficiently used. Also, when the light emitting device packages of the high output are disposed at narrow intervals, the higher strength of light than that of the case in which they are disposed at wide intervals can be obtained.

Figure 47:
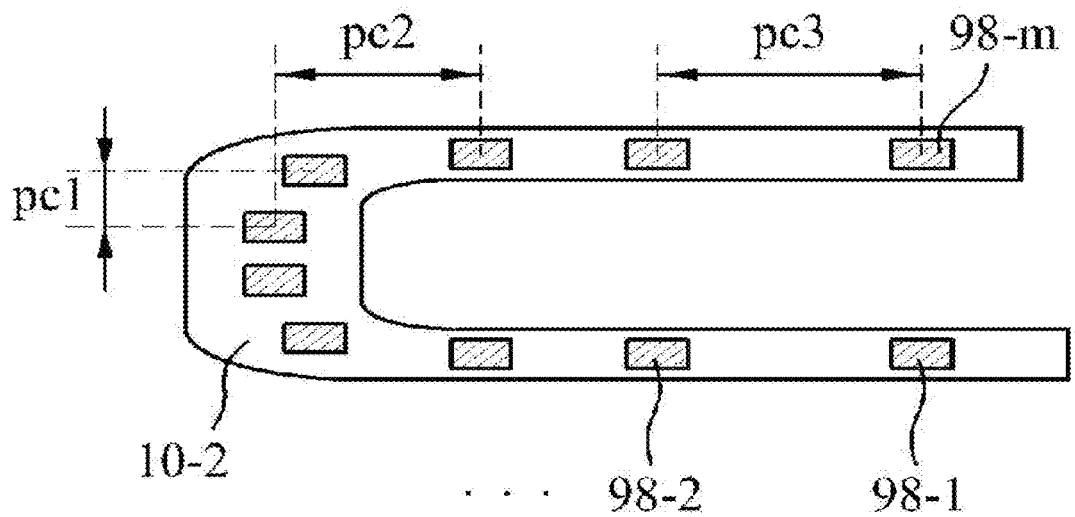

FIG. 46 and FIG. 47 show distances between the light emitting device packages of the light source module used in the tail light for the vehicle and the like according to still another exemplary embodiment. For example, FIG. 46 may show the first light source module 952 illustrated in FIG. 44, and FIG. 47 may show the second light source module 954 illustrated in FIG. 44.

Referring to FIG. 46 and FIG. 47, the light emitting device packages 99-1 to 99-$n$, or 98-1 to 98-$m$ may be disposed on a substrate 10-1 or 10-2 to be spaced apart from each other. Here, n may represent natural numbers greater than 1, n>1, and m may represent natural numbers greater than 1, m>1.

Distances (ph1, ph2, ph3 or pc3, pc2, pc3) between two adjacent light emitting device packages may be different from each other. However, an appropriate range of the distances may be 8 to 30 mm.

This is because a change may be generated depending on power consumption of the light emitting device packages 99-1 to 99-$n$, or 98-1 to 98-$m$, but when the arrangement distance (e.g. ph1, ph2, ph3 or pc1, pc2, pc3) is less than 8 mm, the interference of light of the adjacent light emitting device packages (e.g. 99-3 and 99-4) is generated, thereby enabling a perceptible bright portion to be generated. Also, this is because when the arrangement distance (e.g. ph1, ph2, ph3 or pc1, pc2, pc3) is more than 30 mm, a dark portion may be generated due to a region where light does not reach.

As described above, since the light sources 100-1 to 100-17 themselves have flexibility, they can be easily mounted to the housing 970 having a bend. Thus, the tail light for the vehicle 900-2 according to the present exemplary embodiment can improve a degree of freedom in design.

Also, since the light source modules 100-1 to 100-17 have a structure in which heat dissipation efficiency is improved, in the tail light for the vehicle 900-2 according to the present exemplary embodiment, the generation of wavelength shift and the reduction of luminous intensity can be inhibited.

Since the general tail light for the vehicle illustrated in FIG. 45 is a point light source, spots 964, 964 may be partially generated from a light emitting surface at the time of light emission. However, since the tail light for the vehicle 900-2 according to the present exemplary embodiment is a surface light source, uniform brightness and roughness can be implemented throughout the whole light emitting surface.

As previously described, in the detailed description of the invention, having described the detailed exemplary embodiments of the invention, it should be apparent that modifications and variations can be made by persons skilled without deviating from the spirit or scope of the invention. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims and their equivalents.

What is claimed is:

1. A lighting device comprising:
    a board;
    a plurality of light sources disposed on the board;
    a reflection unit disposed on the board;
    a resin layer disposed on the board so that the plurality of light sources is embedded therein; and
    a reflector disposed on a side surface of the resin layer,
    wherein the reflection unit comprises a first reflection sheet disposed on the board, a second reflection sheet disposed on the first reflection sheet, and a plurality of first spacing parts disposed between the first reflection sheet and the second reflection sheet,
    wherein a cross sectional shape of at least one of the first spacing parts comprises a polygonal shape.

2. The lighting device according to claim 1, wherein the reflection unit comprises a separation member disposed between the first reflection sheet and the second reflection sheet,
    wherein each of the plurality of first spacing parts is formed by the separation member.

3. The lighting device according to claim 2, wherein the separation member comprises a plurality of unit separation members, and a cross sectional shape of at least one of the unit separation members comprises a hexagonal shape.

4. The lighting device according to claim 3, wherein at least one of the plurality of first spacing parts is disposed in the unit separation members.

5. The lighting device according to claim 2, wherein at least one of the plurality of first spacing parts is separated by the separation member.

6. The lighting device according to claim 2, wherein the separation member includes a honeycomb pattern.

7. The lighting device according to claim 1, wherein a cross sectional shape of at least one of the first spacing parts comprises a hexagonal shape.

8. The lighting device according to claim 1, wherein the plurality of first spacing parts is spaced away from the resin layer.

9. The lighting device according to claim 8, comprising an optical pattern layer disposed on the resin layer,
    wherein the optical pattern layer comprises a first optical sheet disposed on the resin layer, a second optical sheet disposed on the first optical sheet, an optical pattern disposed between the first optical sheet and the second optical sheet, an adhesive pattern layer disposed between the first optical sheet and the second optical sheet, and a second spacing part disposed between the optical pattern and the adhesive pattern layer.

10. The lighting device according to claim 9, wherein the optical pattern is disposed between the second optical sheet and the second spacing part.

11. The lighting device according to claim 9, wherein the plurality of light emitting devices comprises a light emitting device, wherein the light emitting device emits light in a first direction, and the first direction is vertical with respect to a thickness direction of the resin layer.

12. The lighting device according to claim 11, wherein a portion of the optical pattern overlaps with the light emitting devices in the thickness direction.

13. The lighting device according to claim 11, wherein a portion of the second spacing part overlaps with the light emitting devices in the thickness direction.

14. The lighting device according to claim 9, wherein the optical pattern comprises a plurality of layers, each comprising a different pattern.

15. The lighting device according to claim 2, wherein the first reflection sheet and the second reflection sheet comprise a plurality of holes through which the plurality of light sources penetrate.

16. The lighting device according to claim 9, wherein the first reflection sheet and the second reflection sheet comprise a plurality of holes through which the plurality of light sources penetrate.

17. A lighting device comprising:
a board;
a plurality of light sources disposed on the board;
a reflection unit disposed on the board;
a resin layer disposed on the board so that the plurality of light sources is embedded therein; and
a reflector disposed on a side surface of the resin layer,
wherein the reflection unit comprises a first reflection sheet disposed on the board, a second reflection sheet disposed on the first reflection sheet, and a separation member disposed between the first reflection sheet and the second reflection sheet,
wherein the separation member comprises a plurality of unit separation members, and a cross sectional shape of at least one of the unit separation members comprises a polygonal shape.

18. The lighting device according to claim 1, wherein a distance to an upper surface of the reflector from a lower surface of the board is greater than a distance to an upper surface of the resin layer from the lower surface of the board.

19. The lighting device according to claim 17, wherein a cross sectional shape of at least one of the first spacing parts comprises a hexagonal shape.

20. The lighting device according to claim 17, wherein the separation member includes a honeycomb pattern.

* * * * *